(12) United States Patent
Oota et al.

(10) Patent No.: US 10,991,749 B2
(45) Date of Patent: Apr. 27, 2021

(54) STRUCTURE, COMPOSITION FOR FORMING NEAR-INFRARED TRANSMITTING FILTER LAYER, AND OPTICAL SENSOR

(71) Applicant: FUJIFILM Corporation, Tokyo (JP)

(72) Inventors: Kazuya Oota, Haibara-gun (JP); Masahiro Mori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/576,466

(22) Filed: Sep. 19, 2019

(65) Prior Publication Data

US 2020/0013821 A1    Jan. 9, 2020

Related U.S. Application Data

(63) Continuation of application No. PCT/JP2018/011356, filed on Mar. 22, 2018.

(30) Foreign Application Priority Data

Mar. 24, 2017    (JP) ............................. JP2017-059429

(51) Int. Cl.
*H01L 27/146* (2006.01)
*H01L 31/0216* (2014.01)
*G02B 5/20* (2006.01)

(52) U.S. Cl.
CPC ........ *H01L 27/14649* (2013.01); *G02B 5/208* (2013.01); *H01L 27/14645* (2013.01); *H01L 31/02164* (2013.01)

(58) Field of Classification Search
CPC ......... H01L 27/14649; H01L 31/02164; H01L 27/14645; H01L 27/14643; H01L 27/1462; H01L 27/14623; G02B 5/208; G02B 5/201
See application file for complete search history.

(56) References Cited

U.S. PATENT DOCUMENTS

2011/0049661 A1   3/2011   Maehara et al.
2011/0298074 A1   12/2011  Funao
(Continued)

FOREIGN PATENT DOCUMENTS

CN    106057833 A    10/2016
JP    10-268123 A    10/1998
(Continued)

OTHER PUBLICATIONS

Japanese Office Action for Japanese Application No. 2019-506964, dated Sep. 1, 2020, with English translation.
(Continued)

*Primary Examiner* — David P Porta
*Assistant Examiner* — Meenakshi S Sahu
(74) *Attorney, Agent, or Firm* — Birch, Stewart, Kolasch & Birch, LLP

(57) ABSTRACT

Provided is a structure capable of detecting near-infrared light with good sensitivity. Also provided are a composition for forming a near-infrared transmitting filter layer used in the structure and an optical sensor capable of detecting near-infrared light with good sensitivity. This structure 101 has a support 1, a partition wall 2 provided on the support 1, and a near-infrared transmitting filter layer 11 that shields visible light and transmits at least a portion of near-infrared light, provided in a region partitioned by the partition wall 2, in which the refractive index of the partition wall 2 is smaller than the refractive index of the near-infrared transmitting filter layer 11 at at least a portion of the wavelengths of the near-infrared light transmitted by the near-infrared transmitting filter layer 11.

21 Claims, 9 Drawing Sheets

(56) References Cited

U.S. PATENT DOCUMENTS

| | | | |
|---|---|---|---|
| 2012/0196388 A1* | 8/2012 | Tanaka | H01L 51/56 |
| | | | 438/16 |
| 2012/0235263 A1 | 9/2012 | Ogita et al. | |
| 2012/0267745 A1 | 10/2012 | Tsuji | |
| 2015/0130007 A1 | 5/2015 | Kawamura | |
| 2016/0301897 A1 | 10/2016 | Huang et al. | |
| 2017/0317131 A1 | 11/2017 | Shimada et al. | |
| 2017/0317132 A1 | 11/2017 | Hatakeyama et al. | |
| 2018/0118865 A1* | 5/2018 | Arayama | G03F 7/322 |
| 2019/0221596 A1 | 7/2019 | Oota et al. | |

FOREIGN PATENT DOCUMENTS

| | | |
|---|---|---|
| JP | 2009-111225 A | 5/2009 |
| JP | 2011-71483 A | 4/2011 |
| JP | 2011-258728 A | 12/2011 |
| JP | 2012-209542 A | 10/2012 |
| JP | 2012-227478 A | 11/2012 |
| JP | 2015-92521 A | 5/2015 |
| JP | 2016-201524 A | 12/2016 |
| WO | WO 2016/117596 A1 | 7/2016 |
| WO | WO 2016/117597 A1 | 7/2016 |
| WO | WO 2016/194527 A1 | 12/2016 |
| WO | WO 2017/038252 A1 | 3/2017 |
| WO | WO 2018/062130 A1 | 4/2018 |

OTHER PUBLICATIONS

Korean Office Action for corresponding Korean Application No. 10-2019-7027224, dated Oct. 14, 2020, with English translation.

Japanese Office Action, dated Jun. 2, 2020, for corresponding Japanese Application No. 2019-506964, with an English machine translation.

Japanese Office Action for corresponding Japanese Application No. 2019-506964, dated Mar. 10, 2020, with English translation.

International Preliminary Report on Patentability and English translation of the Written Opinion of the International Searching Authority (Forms PCT/IB/326, PCT/IB/373, and PCT/ISA/237) for International Application No. PCT/JP2018/011356, dated Oct. 3, 2019.

International Search Report (Form PCT/ISA/210) for International Application No. PCT/JP2018/011356, dated Jun. 5, 2018, with English translation.

Chinese Office Action and Search Report for corresponding Chinese Application No. 201880019464.3, dated Jan. 5, 2021, with English translation of the Office Action.

* cited by examiner

STRUCTURE, COMPOSITION FOR FORMING NEAR-INFRARED TRANSMITTING FILTER LAYER, AND OPTICAL SENSOR

CROSS-REFERENCE TO RELATED APPLICATIONS

This application is a Continuation of PCT International Application No. PCT/JP2018/011356 filed on Mar. 22, 2018, which claims priority under 35 U.S.C § 119(a) to Japanese Patent Application No. 2017-059429 filed on Mar. 24, 2017. Each of the above application(s) is hereby expressly incorporated by reference, in its entirety, into the present application.

BACKGROUND OF THE INVENTION

1. Field of the Invention

The present invention relates to a structure, a composition for forming a near-infrared transmitting filter layer, and an optical sensor.

2. Description of the Related Art

From the related art, attempts have been made to perform coloration of images and the like using color filters have hitherto been made in a solid-state imaging element such as a charge coupled device (CCD) image sensor. For example, JP2009-111225A describes a solid-state imaging element comprising a semiconductor substrate; a color filter array having color filter layers having two or more colors and a separation wall that separates color filter layers having at least different colors from each other; and a light collecting means arranged between the semiconductor substrate and the color filter array.

Moreover, in recent years, an optical sensor that senses near-infrared light have been studied. The optical sensor can also be utilized for distance measurement, three-dimensional measurement, or the like since the near-infrared light is hardly scattered due to their longer wavelength than that of visible light. In addition, since the near-infrared light is not visible to the eyes of humans, animals, or the like, it is impossible for a subject to recognize near-infrared light even in a case where the subject is irradiated with the near-infrared light at night, and accordingly, the optical sensor can also be used to photograph nocturnal wild animals or to photograph an opponent while not stimulating the opponent in security applications. In this regard, the optical sensor that senses near-infrared light can be developed in a variety of applications. For such an optical sensor, filters having a transmission band in a near-infrared region, such as a near-infrared transmitting filter, have been used (see, for example, WO2016/117596A and WO2016/117597A).

SUMMARY OF THE INVENTION

Optical sensors in the related art cannot be said to have sufficient sensitivity to near-infrared light, and thus, there is a demand for further improvement in their sensitivity to the near-infrared light. In addition, also in the inventions described in WO2016/117596A and WO2016/117597A, it cannot be said that the sensitivity to the near-infrared light is sufficient.

Therefore, an object of the present invention is to provide a structure capable of detecting near-infrared light with good sensitivity. Further, another object of the present invention is to provide a composition for forming a near-infrared transmitting filter layer which can be used in the above-mentioned structure, and an optical sensor capable of detecting near-infrared light with good sensitivity.

According to the studies conducted by the present inventors, it was found that it is possible to detect near-infrared light with high sensitivity by increasing light collecting properties for the near-infrared with a use of a structure which will be described below, thereby leading to completion of the present invention. Accordingly, the present invention provides the following aspects.

<1> A structure comprising:
a support;
a partition wall provided on the support; and
a near-infrared transmitting filter layer provided in a region partitioned by the partition wall, that shields visible light and transmits at least a portion of near-infrared light,
in which the refractive index of the partition wall is smaller than the refractive index of the near-infrared transmitting filter layer structure at at least a portion of the wavelengths of the near-infrared light transmitted by the near-infrared transmitting filter layer.

<2> The structure as described in <1>,
in which the refractive index of the partition wall is smaller than the refractive index of the near-infrared transmitting filter layer by 0.2 or more at at least a portion of the wavelengths of the near-infrared light transmitted by the near-infrared transmitting filter layer.

<3> The structure as described in <1> or <2>,
in which the refractive index of the partition wall is smaller than the refractive index of the near-infrared transmitting filter layer at an entire wavelength in a wavelength range of 700 to 1,000 nm.

<4> The structure as described in any one of <1> to <3>,
in which the maximum value of the refractive index with respect to light in a wavelength range of 700 to 1,000 nm of the partition wall is 1.4 or less.

<5> The structure as described in any one of <1> to <4>,
in which the maximum value of the refractive index with respect to light in a wavelength range of 400 to 1,000 nm of the partition wall is 1.4 or less.

<6> The structure as described in any one of <1> to <5>,
in which the partition wall includes at least one selected from silica particles, a siloxane resin, a fluorine resin, or silicon dioxide.

<7> The structure as described in any one of <1> to <6>, further comprising a protective layer on a surface of the partition wall.

<8> The structure as described in any one of <1> to <7>,
in which the structure has a plurality of regions partitioned by partition walls on the support, a near-infrared transmitting filter layer is provided in at least one region of the regions partitioned by the partition walls, and at least one layer selected from a color filter layer or a near-infrared shielding filter layer is provided in at least one region of the remaining regions partitioned by the partition walls.

<9> The structure as described in any one of <1> to <8>,
in which a content of the color material included in the near-infrared transmitting filter layer is 50% to 75% by mass.

<10> A composition for forming a near-infrared transmitting filter layer, comprising:
a color material; and
a curable compound, in which the composition is used for the formation of the near-infrared transmitting filter layer in the structure as described in any one of <1> to <9>.

<11> An optical sensor comprising the structure as described in any one of <1> to <9>.

According to the present invention, it is possible to provide a structure capable of detecting near-infrared light with good sensitivity. Further, it is also possible to provide a composition for forming a near-infrared transmitting filter layer which can be used in the above-mentioned structure, and an optical sensor capable of detecting near-infrared light with good sensitivity.

DESCRIPTION OF THE PREFERRED EMBODIMENTS

Figure 1:
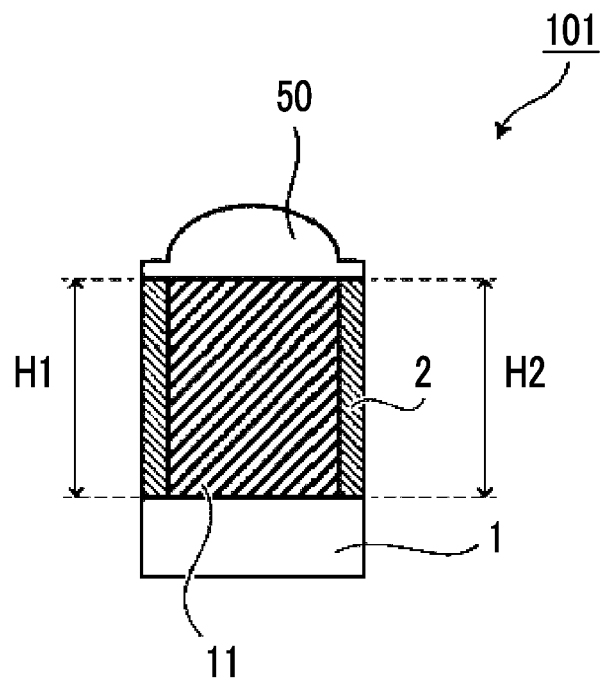
FIG. 1 is a schematic view showing an embodiment of the structure of the present invention.

Hereinafter, the contents of the present invention will be described in detail.

In the present specification, a numerical range expressed using "to" means a range that includes the preceding and succeeding numerical values of "to" as the lower limit value and the upper limit value, respectively.

In citations for a group (atomic group) in the present specification, in a case where the group (atomic group) is denoted without specifying whether it is substituted or unsubstituted, the group (atomic group) includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "exposure" includes, unless otherwise specified, not only exposure using light but also lithography using particle rays such as electron beams and ion beams. In addition, examples of light used for the exposure generally include actinic rays or radiation such as a bright line spectrum of a mercury lamp, far ultraviolet rays typified by an excimer laser, extreme ultraviolet rays (EUV light), X-rays, and electron beams.

In the present specification, "a (meth)allyl group" represents either or both of allyl and methallyl, "(meth)acrylate" represents either or both of acrylate and methacrylate, "(meth)acryl" represents either or both of acryl and methacryl, and "(meth)acryloyl" represents either or both of acryloyl and methacryloyl.

In the present specification, a weight-average molecular weight and a number-average molecular weight are each defined as a value in terms of polystyrene, as measured by means of gel permeation chromatography (GPC). In the present specification, the weight-average molecular weight (Mw) and the number-average molecular weight (Mn) can be determined, for example, by using HLC-8220 (manufactured by Tosoh Corporation), TSKgel Super AWM-H (manufactured by Tosoh Corporation, 6.0 mm ID (inner diameter)×15.0 cm) as columns, and a 10-mmol/L lithium bromide N-methylpyrrolidinone (NMP) solution as an eluent.

In the present specification, near-infrared light refers to light at a wavelength of 700 to 2,500 nm.

In the present specification, the total solid content refers to a total mass of the components excluding a solvent from all the components of a composition.

In the present specification, a term "step" not only means an independent step but also includes a step which is not clearly distinguished from other steps in a case where an intended action of the step is accomplished.

<Structure>

The structure of an embodiment of the present invention includes:

a support, a partition wall provided on the support, and a near-infrared transmitting filter layer provided in a region partitioned by the partition wall, that shields visible light and transmits at least a portion of near-infrared light, in which the refractive index of the partition wall is smaller than the refractive index of the near-infrared transmitting filter layer structure at at least a portion of the wavelengths of the near-infrared light transmitted by the near-infrared transmitting filter layer.

According to the structure of the embodiment of the present invention, it is possible to enhance light collecting properties for near-infrared light, and thus further improve the sensitivity to the near-infrared light by providing a near-infrared transmitting filter layer in a region partitioned by the partition wall having the above-mentioned refractive index characteristics. In this regard, for example, by incorporating the structure of the embodiment of the present invention into an optical sensor, it is possible to perform sensing with higher accuracy using near-infrared light, or the like. Further, since the near-infrared transmitting filter layer has low transmission of i-rays, it tends to have low curability. Therefore, in the related art, there have been some cases where it is difficult to form pixels of a near-infrared transmitting filter layer with good rectangularity or a color material is eluted from the near-infrared transmitting filter layer to cause mixed color with other adjacent filter layers and the like. However, the structure of the embodiment of the present invention has a partition wall provided around a near-infrared transmitting filter layer, the rectangularity of the near-infrared transmitting filter layer is good, and further, even in a case where other filter layers other than the near-infrared transmitting filter layer are provided, it is possible to effectively suppress the color material in the near-infrared transmitting filter layer from causing mixed color with the other filter layers.

In the structure of the embodiment of the present invention, the support is not particularly limited. The support can be appropriately selected depending on its applications. Examples of the support include substrates formed of materials such as silicone, alkali-free glass, soda glass, Pyrex (registered trademark) glass, and quartz glass. It is also preferable to use an InGaAs substrate. Since the InGaAs substrate has good sensitivity to light at a wavelength of more than 1,000 nm, it is easy to obtain an optical sensor having good sensitivity to light at a wavelength of more than 1,000 nm by forming each near-infrared transmitting filter layer on the InGaAs substrate. Further, a charge coupled device (CCD), a complementary metal oxide semiconductor (CMOS), a transparent conductive film, or the like may be formed. Further, there are some cases where a black matrix made of a light shielding material such as tungsten is formed on a support. In addition, an underlayer may be provided on the support, as desired, in order to improve the adhesiveness to the upper layer, to prevent the diffusion of materials, or to smoothen a surface of a substrate.

The structure of the embodiment of the present invention may have a partition wall provided on the support. The partition wall may be provided in direct contact with the support. Further, in a case where an underlayer is provided on the support, the partition wall may be provided on the underlayer. In addition, in a case of using a support having a black matrix on the support, the partition wall may also be provided on the black matrix. The shape of a region partitioned by the partition wall on the support region (hereinafter also referred to as a shape of the opening of the partition wall) is not particularly limited, and it may be, for example, any one of a square shape, a rectangular shape, a circular shape, an elliptical shape, a polygonal shape, and the like.

In the structure of the embodiment of the present invention, the refractive index of the partition wall is smaller than the refractive index of the near-infrared transmitting filter layer at at least a portion of the wavelengths of the near-infrared light transmitted by the near-infrared transmitting filter layer, and the refractive index of the partition wall is preferably smaller by 0.2 or more, more preferably smaller by 0.25 or more, and still more preferably smaller by 0.30 or more. The upper limit is not particularly limited, and is preferably 1.00 or less. According to this aspect, it is possible to further enhance the light collecting properties for near-infrared light, and thus further improve the sensitivity to near-infrared light.

Furthermore, in the structure of the embodiment of the present invention, the refractive index of the partition wall is preferably smaller than the refractive index of the near-infrared transmitting filter layer at an entire wavelength in a wavelength range of 700 to 1,000 nm, and the refractive index of the partition wall is more preferably smaller by 0.2 or more, still more preferably smaller by 0.25 or more, and particularly preferably smaller by 0.30 or more. The upper limit is not particularly limited, and is preferably 1.00 or less. According to this aspect, it is possible to further enhance the light collecting properties for near-infrared light, and thus, further improve the sensitivity to near-infrared light. This is particularly effective in a case where the near-infrared transmitting filter layer in the structure of the embodiment of the present invention is a filter layer that transmits light at at least a portion of the wavelengths in a wavelength range of 700 to 1,000 nm.

Moreover, the maximum value of the refractive index with respect to light in a wavelength range of 700 to 1,000 nm of the partition wall is preferably 1.4 or less, more preferably 1.37 or less, and still more preferably 1.34 or less. The refractive index with respect to light in a wavelength range of 700 to 1,000 nm of the near-infrared transmitting filter layer is more than 1.4 in many cases, and accordingly, in a case where the maximum value of the above-mentioned refractive index of the partition wall is 1.4 or less, it is possible to further enhance the light collecting properties for near-infrared light, and thus further improve the sensitivity to near-infrared light.

Furthermore, the maximum value of the refractive index with respect to light in a wavelength range of 400 to 1,000 nm of the partition wall is preferably 1.4 or less, more preferably 1.37 or less, and still more preferably 1.34 or less. Also, according to this aspect, it is possible to further enhance the light collecting properties for near-infrared light, and thus further improve the sensitivity to near-infrared light. Further, the refractive index with respect to light in a wavelength range of 400 to 1,000 nm of which will be described later color filter layer is more than 1.4 in many cases. In this regard, in a case where a near-infrared transmitting filter layer is provided in at least one region of the regions partitioned by the partition wall and a color filter layer is provided in at least one region of the remaining regions partitioned by the partition walls, it is possible to enhance the light collecting properties for each of visible light and near-infrared light, and thus further improve the sensitivity to near-infrared light.

With regard to a material of the partition wall, the partition wall may be formed of a material satisfying the conditions for the above-mentioned refractive index, and is not particularly limited. Various inorganic materials or organic materials can be used. A maximum value of the refractive index with respect to light in a wavelength range of 700 to 1,000 nm in the material constituting the partition wall is preferably 1.4 or less, more preferably 1.37 or less, and still more preferably 1.34 or less. Preferred examples of the material of the partition wall include organic materials such as a siloxane resin and a fluorine resin, and inorganic materials such as silica particles and silicon dioxide. Among those, it is preferable that the partition wall does not substantially include particles for a reason that the processability of the partition wall is good and it is easy to form a partition wall having small variations in a width dimension, fewer defects, or the like. In addition, it is preferable that the material of the partition wall is a siloxane resin and/or a fluorine resin. A case where the partition wall does not substantially include particles means that the content of the particles in the partition wall is 1% by mass or less, and the content is preferably 0.5% by mass or less, and more preferably 0.1% by mass or less, and still more preferably, the particles are not contained.

Examples of the siloxane resin include a resin obtained through a hydrolyzation reaction and a fusion reaction using an alkoxysilane raw material. The siloxane resin may be a siloxane resin which has a silsesquioxane structure of any of a cage type, a ladder type, a random type, or the like. Further, with regard to the "cage type", the "ladder type", and the "random type", it is possible to refer to the structures which are described in, for example, Chemistry and Application Development of Silsesquioxane Material (CMC Publishing) or the like.

The siloxane resin preferably has a silsesquioxane structure represented by Formula (S1).

$$—(R^1SiO_{3/2})_n—\qquad\text{Formula (S1)}$$

(In Formula (S1), $R^1$ represents an alkyl group having 1 to 3 carbon atoms. n represents an integer from 20 to 1,000.)

The alkyl group represented by $R^1$ may have a substituent. Examples of the substituent include a fluorine atom, an amino group, a sulfonamido group, an acyloxy group, a carbamoyl group, and an acylamino group.

Examples of the alkoxysilane raw material include trialkoxysilane and tetraalkoxysilane. The alkoxysilane raw material preferably includes at least trialkoxysilane, and more preferably includes trialkoxysilane and tetraalkoxysilane. The trialkoxysilane is preferably a compound represented by Formula (52). The tetraalkoxysilane is preferably a compound represented by Formula (S3).

$$R^2Si(OR^3)_3\qquad\text{Formula (S2)}$$

$$Si(OR^3)_4\qquad\text{Formula (S3)}$$

($R^2$ and $R^3$ each independently represent an alkyl group.)

The number of carbon atoms of the alkyl group represented by each of $R^2$ and $R^3$ is preferably 1 to 10, more preferably 1 to 4, and still more preferably 1 to 3. The alkyl group represented by each of $R^2$ and $R^3$ is preferably a linear alkyl group. The alkyl group represented by each of $R^2$ and $R^3$ may have a substituent. Examples of the substituent include the above-mentioned substituents which the alkyl group represented by $R^1$ may have.

With regard to the details of the siloxane resin, reference may be made to the descriptions in paragraph Nos. 0014 to 0039 of JP2014-063125A, JP2004-021036A, and JP2011-084672A, the contents of which are incorporated herein by reference.

Examples of the fluorine resin include a resin which contains fluorine in the molecule. Specific examples thereof include polytetrafluoroethylene, polyhexafluoropropylene, a tetrafluoroethylene/hexafluoropropylene copolymer, a tetrafluoroethylene/perfluoroalkylvinyl ether copolymer, a tetrafluoroethylene/ethylene copolymer, a hexafluoropropylene/propylene copolymer, polyvinylidene fluoride, and a vinylidene fluoride/ethylene copolymer. Further, an amorphous fluorine resin is also preferably used, and examples of a commercially available product thereof include CYTOP (manufactured by Asahi Glass Co., Ltd.). The molecular weight of a fluorine resin such as polytetrafluoroethylene is preferably in the range of 100,000 to 10,000,000, and more preferably in the range of 100,000 to 1,000,000. Examples of commercial products of the polytetrafluoro ethylene include TEFLON (registered trademark) 6-J, TEFLON (registered trademark) 6C-J, and TEFLON (registered trademark) 62-J, each manufactured by Du Pont-Mitsui Fluorochemicals Co., Ltd., and FLUON CD1 or CD076 manufactured by Asahi Glass Co., Ltd. In addition, as a commercial product of polytetrafluoroethylene-containing mixed powder formed of polytetrafluoroethylene particles and an organic polymer, "METABLEN (registered trademark)" A series are commercially available from Mitsubishi Rayon Co., Ltd., and "METABLEN (registered trademark)" A-3000, "METABLEN (registered trademark)" A-3800, and the like are commercially available. In addition, in the present specification, a resin including a siloxane bond and a fluorine atom in a molecule thereof is intended to correspond to the siloxane resin.

The width of the partition wall is preferably 20 to 500 nm. The lower limit is preferably 30 nm or more, more preferably 40 nm or more, and still more preferably 50 nm or more. The upper limit is preferably 300 nm or less, more preferably 200 nm or less, and still more preferably 100 nm or less.

In addition, the height of the partition wall is preferably 200 nm or more, more preferably 300 nm or more, and still more preferably 400 nm or more. The upper limit is preferably the thickness of the near-infrared transmitting filter layer×200% or less, more preferably the thickness of the near-infrared transmitting filter layer×150% or less, and still more preferably substantially the same as the thickness of the near-infrared transmitting filter layer.

The ratio of the width to the height (height/width) of the partition wall is preferably 1 to 100, more preferably 5 to 50, and still more preferably 5 to 30. A partition wall having the ratio in the above-mentioned range can be easily formed, and thus, the productivity is excellent. In addition, a structure having a good near-infrared recognition ability can be obtained.

It is also preferable that a protective layer is provided on a surface of the partition wall in the structure of the embodiment of the present invention. The protective layer is provided on the side of the partition wall, and it is preferable that the partition wall and the near-infrared transmitting filter layer are into contact with each other through the protective layer. By providing the protective layer on a surface of the partition wall, it is possible to suppress for the color material or the like included in the near-infrared transmitting filter layer from being diffused into the partition wall or to improve the adhesiveness between the partition wall and the near-infrared transmitting filter layer. As a material of the protective layer, various inorganic materials or organic materials can be used. Examples of the organic materials include an acrylic resin, a polystyrene resin, a polyimide resin, and an organic spin-on-glass (SOG) resin. Further, the protective layer can also be formed using a composition including a compound having a group having an ethylenically unsaturated bond. Examples of the group having an ethylenically unsaturated bond include a vinyl group, a (meth)allyl group, a (meth)acryloyl group, a styryl group, with the (meth)allyl group or the (meth)acryloyl group being preferable. The compound having a group having an ethylenically unsaturated bond may be either a monomer or a resin such as a polymer. Examples of the compound having a group having an ethylenically unsaturated bond include the polymerizable compounds described for a composition for a near-infrared transmitting filter which will be described later, and resins having a polymerizable group. Examples of the inorganic materials include silicon dioxide. In a case where a protective layer formed of an organic material is provided on a surface of the partition wall, it is possible to improve the adhesiveness between the near-infrared transmitting filter layer and the partition wall. Further, in a case where a protective layer formed of an inorganic material is provided on a surface of the partition wall, it is possible to effectively suppress for the color material or the like included in the near-infrared transmitting filter layer from being diffused into the partition wall, and thus, to suppress contamination of the partition wall or variations in the refractive index of the partition wall. The material of the protective layer can be appropriately selected depending on the material of the partition wall, and it is preferable that the material of the protective layer is the same material as that of the partition wall from the viewpoint of the adhesiveness to the partition wall of the protective layer or the film forming properties of the protective layer. Specifically, in a case where the material of the partition wall includes silica particles or a siloxane resin, the material of the protective layer is preferably silicon dioxide from the viewpoint of the adhesiveness to the partition wall of the protective layer or the film forming properties of the protective layer.

In the structure of the embodiment of the present invention, a near-infrared transmitting filter layer that shields visible light and transmits at least a portion of near-infrared light is provided in a region partitioned by the partition wall. The near-infrared transmitting filter layer may be any of filter layers having spectral characteristics of shielding visible light and transmitting at least a portion of near-infrared light. The near-infrared transmitting filter layer is, for example, preferably a filter layer having spectral characteristics of transmitting at least a portion of light at a wavelength in a wavelength range of 700 to 2,500 nm, more preferably a filter layer having spectral characteristics of transmitting at least a portion of light at a wavelength in a wavelength range of 700 to 2,000 nm, still more preferably a filter layer having spectral characteristics of transmitting at least a portion of light at a wavelength in a wavelength range of 700 to 1,500 nm, even still more preferably a filter layer having spectral characteristics of transmitting at least a portion of light at a wavelength in a wavelength range of 700 to 1,300 nm, and particularly preferably a filter layer having spectral characteristics of transmitting at least a portion of light at a wavelength in a wavelength range of 700 to 1,000 nm. Further, the near-infrared transmitting filter layer may be formed of a film in the form of one layer (monolayered film) or may be formed of a film in the form of two or more layers (multilayered film). Further, in a case where the near-infrared transmitting filter layer is formed of the multilayered film, a whole volume of the layers only needs to have the above-mentioned spectral characteristics, but it is not necessary that the film in the form of one layer itself has the above-mentioned spectral characteristics, respectively.

The thickness of the near-infrared transmitting filter layer is not particularly limited. The thickness is, for example, preferably 100 μm or less, more preferably 15 μm or less, still more preferably 5 μm or less, and particularly preferably 1 μm or less. The lower limit value is preferably 0.1 μm or more, more preferably 0.2 μm or more, and still more preferably 0.3 μm or more. Further, from the viewpoint of the light collecting properties for near-infrared light, the thickness of the near-infrared transmitting filter layer is preferably the height of the partition wall×50% to the height of the partition wall×150%, more preferably the height of the partition wall×75% to the height of the partition wall× 125%, and still more preferably the height of the partition wall×90% to the height of the partition wall×110%.

Preferred examples of the near-infrared transmitting filter layer include a filter layer having spectral characteristics of any one of (1) to (4) below.

(1): A filter layer in which the maximum value in a wavelength range of 400 to 640 nm of the transmittance of light in the thickness direction is 20% or less (preferably 15% or less, and more preferably 10% or less) and the minimum value in a wavelength range of 800 to 1,300 nm of the transmittance of light in the thickness direction is 70% or more (preferably 75% or more, and more preferably 80% or more). With this filter layer, it is possible to shield light in a wavelength range of 400 to 640 nm and transmit near-infrared light at a wavelength of 720 nm.

(2): A filter layer in which the maximum value in a wavelength range of 400 to 750 nm of the transmittance of light in the thickness direction is 20% or less (preferably 15% or less, and more preferably 10% or less) and the minimum value in a wavelength range of 900 to 1,300 nm of the transmittance of light in the thickness direction is 70% or more (preferably 75% or more, and more preferably 80% or more). With this filter layer, it is possible to shield light in a wavelength range of 400 to 750 nm and transmit near-infrared light at a wavelength of 850 nm.

(3): A filter layer in which the maximum value in a wavelength range of 400 to 850 nm of the transmittance of light in the thickness direction is 20% or less (preferably 15% or less, and more preferably 10% or less) and the minimum value in a wavelength range of 1,000 to 1,300 nm of the transmittance of light in the thickness direction is 70% or more (preferably 75% or more, and more preferably 80% or more). With this filter layer, it is possible to shield light in a wavelength range of 400 to 850 nm and transmit near-infrared light at a wavelength of 940 nm.

(4): A filter layer in which the maximum value in a wavelength range of 400 to 950 nm of the transmittance of light in the thickness direction is 20% or less (preferably 15% or less, and more preferably 10% or less) and the minimum value in a wavelength range of 1,100 to 1,300 nm of the transmittance of light in the thickness direction is 70% or more (preferably 75% or more, and more preferably 80% or more). With this filter layer, it is possible to shield light in a wavelength range of 400 to 950 nm and transmit near-infrared light at a wavelength of 1,040 nm.

In the structure of the embodiment of the present invention, a transparent layer may be provided on a surface of the near-infrared transmitting filter layer and/or between the near-infrared transmitting filter layer and the support. In a case where the thickness of the near-infrared transmitting filter layer is smaller than the height of the partition wall, or other cases, it is preferable that by providing the transparent layer, the thickness of a laminate of the near-infrared transmitting filter layer and the transparent layer is set to be equivalent to the height of the partition wall. By setting the thickness in this manner, it is possible to improve processing accuracy of a lens, for example, in the formation of the lens on the near-infrared transmitting filter layer, and also improve the adhesiveness to the lens. In addition, it is possible to expect a higher resolution by the control of incident angles. The transparent layer can be formed by, for example, using a composition including a resin. Examples of the resin include the resins for the composition for a near-infrared transmitting filter which will be described later. Further, for the transparent layer, the radiation-sensitive composition described in JP2013-254047A, the contents of which are incorporated herein by reference, can be also used.

The near-infrared transmitting filter layer can be formed using a composition (composition for forming a near-infrared transmitting filter layer) including a color material and a curable compound. The content of the color material in the near-infrared transmitting filter layer is preferably 50% to 75% by mass. The lower limit is preferably 35% by mass or more, more preferably 45% by mass or more, and still more preferably 55% by mass or more. The upper limit is preferably 80% by mass or less, more preferably 75% by mass or less, and still more preferably 70% by mass or less. Since the structure of the embodiment of the present invention has the partition wall around the near-infrared transmitting filter layer, it is possible to suppress the color material in the near-infrared transmitting filter layer from being eluted into the other filter layers adjacent thereto and thus causing mixed color even with an increase in the concentration of the color material in the near-infrared transmitting filter layer. In addition, it is possible to increase the concentration of the color material in the near-infrared transmitting filter layer, and therefore, it is possible to detect desired light having reduced noise caused by visible light.

Preferred aspects of the structure of the embodiment of the present invention include an aspect, in which in which the structure has a plurality of regions partitioned by the above-mentioned partition walls on a support, a near-infrared transmitting filter layer is provided in at least one region of the above-mentioned regions partitioned by the partition walls, and at least one layer selected from a color filter layer or a near-infrared shielding filter layer is provided in at least one region of the remaining regions partitioned by the above-mentioned other partition walls.

In a case where the structure of the embodiment of the present invention further has a color filter layer, it is possible to further perform image recognition at the same time with sensing through near-infrared light. Further, in a case where the structure of the embodiment of the present invention further has a near-infrared shielding filter layer, it is possible to further reduce noise by reducing the amount of near-infrared light incorporated into the color filter pixel. Further, in the present invention, the near-infrared shielding filter layer means a filter layer that transmits visible light and shields at least a portion of near-infrared light. The near-infrared shielding filter layer may transmit all of visible lights, or may only transmit light in a specific wavelength region among the visible lights. The near-infrared shielding filter layer can be formed using a composition including a near-infrared absorbing dye and the like. Incidentally, in the present invention, the color filter layer means a filter layer that transmits light in a specific wavelength range and shields light in a specific wavelength range among the visible lights. The color filter layer may have spectral characteristics of shielding at least a portion of near-infrared light. The color filter layer having spectral characteristics of shielding at least a portion of near-infrared light can be formed using a composition including a chromatic coloring agent and a near-infrared absorbing dye.

The near-infrared shielding filter layer has the maximum absorption wavelength in a wavelength range of preferably 700 to 2,000 nm, more preferably 700 to 1,300 nm, and still more preferably 700 to 1,000 nm. Further, absorbance Amax/absorbance A550 which is a ratio of an absorbance Amax at the maximum absorption wavelength and an absorbance A550 at a wavelength of 550 nm is preferably 50 to 500, more preferably 70 to 450, and still more preferably 100 to 400.

It is preferable that the near-infrared shielding filter layer satisfies at least one condition of (1) to (4) below, and it is more preferable that the near-infrared shielding filter layer satisfies all of the condition of (1) to (4).

(1) A transmittance of light in a wavelength range of 400 nm is preferably 70% or more, more preferably 80% or more still more preferably 85% or more, and particularly preferably 90% or more.

(2) A transmittance of light in a wavelength range of 500 nm is preferably 70% or more, more preferably 80% or more still more preferably 90% or more, and particularly preferably 95% or more.

(3) A transmittance of light in a wavelength range of 600 nm is preferably 70% or more, more preferably 80% or more still more preferably 90% or more, and particularly preferably 95% or more.

(4) A transmittance of light in a wavelength range of 650 nm is preferably 70% or more, more preferably 80% or more still more preferably 90% or more, and particularly preferably 95% or more.

A transmittance at any in a wavelength range of 400 to 650 nm of the near-infrared shielding filter layer is preferably 70% or more, more preferably 80% or more, and still more preferably 90% or more. Further, a transmittance at at least one point in a wavelength range of 700 to 1,000 nm is preferably 20% or less.

A thickness of the near-infrared shielding filter layer is not particularly limited. The thickness is, for example, preferably 100 μm or less, more preferably 15 μm or less, still more preferably 5 μm or less, and particularly preferably 1 μm or less. The lower limit value is preferably 0.1 μm or more, more preferably 0.2 μm or more, and still more preferably 0.3 μm or more.

In a case where the structure of the embodiment of the present invention has a near-infrared shielding filter layer, a transparent layer may be provided on a surface of the near-infrared shielding filter layer and/or between the near-infrared shielding filter layer and the support. In a case where the thickness of the near-infrared transmitting filter layer is smaller than the height of the partition wall, or other cases, it is preferable that the thickness of a laminate of the near-infrared shielding filter layer and the transparent layer is set to be equivalent to the height of the partition wall by providing the transparent layer. By setting the thickness in this manner, it is possible to improve the processing accuracy of a lens, for example, in the formation of the lens on the near-infrared shielding filter layer, and it is also possible to improve the adhesiveness to the lens. In addition, it is possible to expect a higher resolution by the control of incident angles.

Examples of the color filter layer include filter layers including colored layers in one or more colors selected from red, blue, green, cyan, magenta, and yellow. The color filter layer may be formed of a single colored layer or may include colored layers in two or more colors. Further, in a case where the structure of the embodiment of the present invention has colored layers in two or more colors, the colored layers in the respective colors may be provided by one color in each of different regions partitioned by partition walls or the colored layers in a plurality of colors may be provided in one region partitioned by the partition wall.

The thickness of the color filter layer (the thickness of the colored layer) is not particularly limited. The thickness is, for example, preferably 100 μm or less, more preferably 15 μm or less, and still more preferably 5 μm or less, and particularly preferably 1 μm or less. The lower limit value is preferably 0.1 μm or more, more preferably 0.2 μm or more, and still more preferably 0.3 μm or more.

In a case where the structure of the embodiment of the present invention has a color filter layer, it is preferable that the structure further has a near-infrared shielding filter layer on an optical path of the color filter layer. According to this aspect, it is possible to detect visible light having less noise. In this case, the near-infrared shielding filter layer may be provided on the color filter layer or between the color filter layer and the support.

Moreover, in a case where the structure of the embodiment of the present invention has a color filter layer, a transparent layer may be provided on a surface of the color filter layer and/or between the color filter layer and the support. In a case where the thickness of the color filter layer is smaller than the height of the partition wall, the thickness of the color filter layer is smaller than that of the other filter layers, or other cases, it is preferable that the thickness of a laminate of the color filter layer and the transparent layer is set to be equivalent to the height of the partition wall by providing the transparent layer. By setting the thickness in this manner, it is possible to improve the processing accuracy of a lens, for example, in the formation of the lens on the color filter layer, such as the formation of the lens on the near-infrared transmitting filter layer, and it is also possible to improve the adhesiveness to the lens. In addition, it is possible to expect a higher resolution by the control of incident angles.

In the structure of the embodiment of the present invention, a transparent layer may be provided at a position different from the region in which the near-infrared transmitting filter layer and the color filter layer are provided. In this case, the color filter layer and the transparent layer may be provided at a position in the same region partitioned by the partition wall, and the color filter layer and the transparent layer may be each provided in different regions partitioned by the partition walls.

In a case where the structure of the embodiment of the present invention has another filter layer, in addition to the near-infrared transmitting filter layer, it is preferable that the height difference between the top surfaces of the respective filter layers is substantially equal to each other. According to this aspect, it is possible to expect effects such as flatness, adhesiveness, and a higher resolution by the control of incident angles.

It is also preferable that the structure of the embodiment of the present invention further has a band-pass filter that transmits a portion of near-infrared light on the optical path of the near-infrared transmitting filter layer. According to this aspect, it is possible to detect light having less noise with high sensitivity. Examples of the band-pass filter include a laminate forming by alternately laminating a high-refractive-index layer and a low-refractive-index layer.

The band-pass filter may be a band-pass filter that shields visible light or may be a band-pass filter that transmits visible light. The spectral characteristics of the visible region of the band-pass filter can be appropriately selected depending on the application. For example, in a case where the structure of the embodiment of the present invention does not have a color filter layer or a case where the structure has a color filter layer but the band-pass filter is not provided on the optical path of the color filter layer, it is preferable that the band-pass filter shields visible light. By using such a band-pass filter in combination, it is possible to detect desired light such as near-infrared light having less noise caused by visible light. Further, in a case where the structure of the embodiment of the present invention has a color filter layer and a band-pass filter provided on an optical path of the color filter layer, it is preferable that such a band-pass filter is a filter that transmits visible light. According to this aspect, it is possible to simultaneously detect visible light and near-infrared light having less noise with good sensitivity.

The structure of the embodiment of the present invention may have an anti-reflection film, a flattened film, a lens, or the like, which is provided on each of the filter layers.

The structure of the embodiment of the present invention can be preferably used after being introduced into various optical sensors such as a solid-state imaging element, or into an image display device (for example, a liquid crystal display device and an organic electroluminescence (organic EL) display device). For example, an optical sensor into which the structure of the embodiment of the present invention is introduced can be preferably used in applications for surveillance, security applications, mobile applications, automotive applications, agricultural applications, medical applications, distance measuring applications, gesture recognition applications, vital recognition applications, or the like.

Hereinafter, the structure of the embodiment of the present invention will be described in detail with reference to the drawings. FIG. 1 is a schematic view showing an embodiment of the structure of the present invention. A structure 101 includes a support 1, a partition wall 2 provided on the support, and a near-infrared transmitting filter layer 11 provided in a region partitioned by the partition wall 2. Further, a lens 50 is provided on the near-infrared transmitting filter layer 11. The partition wall 2 is a partition wall having the above-mentioned refractive index characteristics.

Furthermore, in FIG. 1, the height H1 of the partition wall 2 is the same as the height (thickness) H2 of the near-infrared transmitting filter layer 11, but the height H1 of the partition wall 2 may be smaller or larger than the height (thickness) H2 of the near-infrared transmitting filter layer 11. Further, in a case where the height H1 of the partition wall 2 is larger or smaller than the height (thickness) H2 of the near-infrared transmitting filter layer 11, it is preferable that the height difference between the partition wall 2 and the near-infrared transmitting filter layer 11 is filled with the transparent layer or the lens 50. Further, in FIG. 1, the partition wall 2 is directly provided on the support 1, but by providing an underlayer or a black matrix on the support 1, the partition wall 2 may be formed on the underlayer or the black matrix. Further, in FIG. 1, the near-infrared transmitting filter layer 11 and the partition wall 2 are directly in contact with each other, but a protective layer may be formed on a surface of the partition wall 2, and the near-infrared transmitting filter layer 11 and the partition wall 2 may be in contact with the protective layer. Further, an intermediate layer may be provided between the near-infrared transmitting filter layer 11 and the lens 50. The intermediate layer can be formed using a composition for forming a transparent layer or the like.

Figure 2:
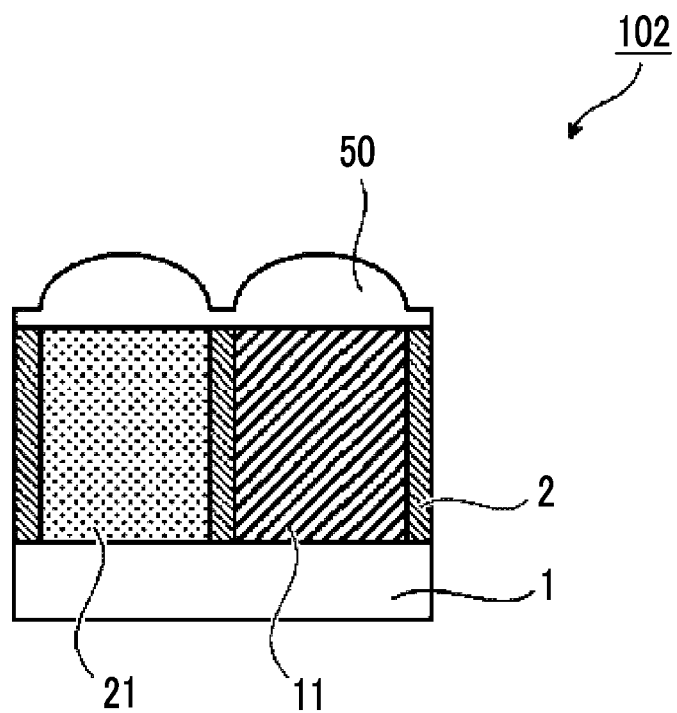
FIG. 2 is a schematic view showing an embodiment of the structure of the present invention.

FIG. 2 is a schematic view showing an embodiment of the structure of the present invention, in which the structure further has a near-infrared shielding filter layer, in addition to the near-infrared transmitting filter layer 11. This structure 102 has a support 1, a partition wall 2 provided on the support 1, a near-infrared transmitting filter layer 11 provided in a region partitioned by the partition wall 2, and a near-infrared shielding filter layer 21 provided in a region partitioned by the partition wall 2, different from the region in which the near-infrared transmitting filter layer 11 is provided. In addition, a lens 50 is provided on the near-infrared transmitting filter layer 11 and the near-infrared shielding filter layer 21. The partition wall 2 is a partition wall having the above-mentioned refractive index characteristics.

The height of the partition wall 2 may be larger or smaller than the height (thickness) of the near-infrared transmitting filter layer 11. Further, the height of the partition wall 2 may be smaller or larger than the height (thickness) of the near-infrared shielding filter layer 21. Further, in FIG. 2, the height (thickness) of the near-infrared transmitting filter layer 11 and the height (thickness) of the near-infrared shielding filter layer 21 are the same as each other, but the heights of the filter layers of the both may be different from each other. From the viewpoint of flatness, adhesiveness, a higher resolution by the control of incident angles, or the like, it is preferable that the heights (thicknesses) of the filter layers of the both are almost same as each other. Incidentally, it is preferable that the height differences of the filter layers of the both are almost same as each other. Further, in FIG. 2, the partition wall 2 is directly provided on the support 1, but by providing a black matrix on the support 1, a partition wall 2 may be formed on the underlayer or black matrix. Further, in FIG. 2, the near-infrared transmitting filter layer 11, the partition wall 2, the near-infrared shielding filter layer 21, and the partition wall 2 are each directly in contact with each other, but a protective layer may be formed on a surface of the partition wall 2 and the near-infrared transmitting filter layer 11 or the near-infrared shielding filter layer 21 and the partition wall 2 may be in contact through the protective layer. In addition, an intermediate layer may be provided between the near-infrared transmitting filter layer 11 and the lens 50, and between the near-infrared shielding filter layer 21 and the lens 50.

FIGS. 3 to 18 are schematic views showing the structure of the embodiment of the present invention, which are schematic views of a structure further having a color filter layer, in addition to the near-infrared transmitting filter layer 11.

Figure 3:
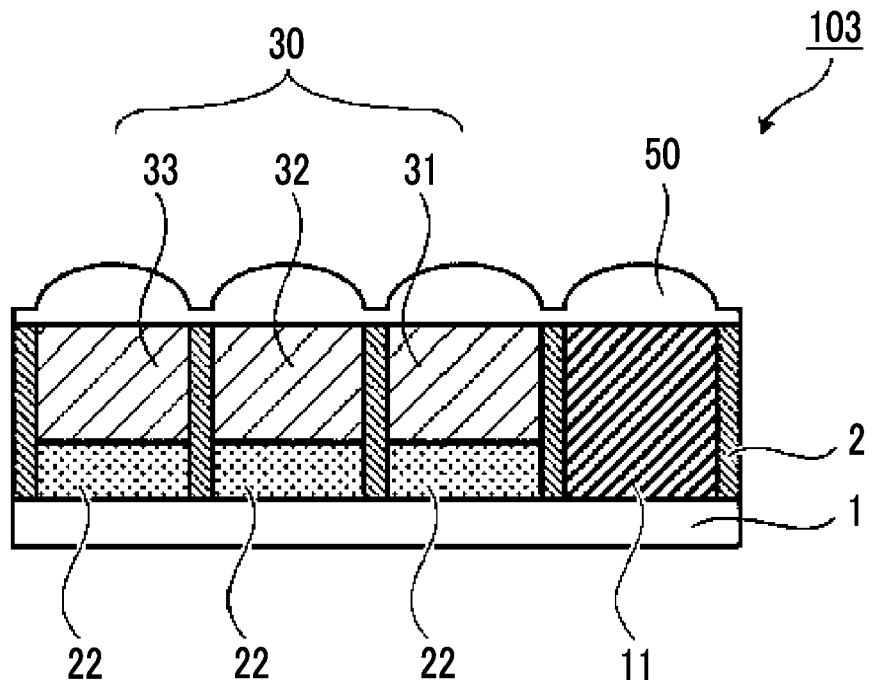
FIG. 3 is a schematic view showing an embodiment of the structure of the present invention.

A structure 103 shown in FIG. 3 has a support 1, a partition wall 2 provided on the support 1, a near-infrared transmitting filter layer 11 provided in a region partitioned by the partition wall 2, and a color filter layer 30 provided in a region partitioned by the partition wall 2, different from the region in which the near-infrared transmitting filter layer 11 is provided. In FIG. 3, the color filter layer 30 is formed of colored layers 31, 32, and 33. The colored layers 31 to 33 may be colored layers which are the same as or different from each other. Further, a near-infrared shielding filter layer 22 is provided between the colored layer and the support 1. That is, a laminate of the near-infrared shielding filter layer 22 and the colored layer 31, a laminate of the near-infrared shielding filter layer 22 and the colored layer 32, and a laminate of the near-infrared shielding filter layer 22 and the colored layer 33 are each formed on a region partitioned by the partition wall. Further, a lens 50 is provided on the near-infrared transmitting filter layer 11 and the color filter layer 30. In addition, in FIG. 3, the thicknesses of the laminate of the near-infrared shielding filter layer 22 and the colored layer 31, the laminate of the near-infrared shielding filter layer 22 and the colored layer 32, and the laminate of the near-infrared shielding filter layer 22 and the colored layer 33 are same as each other, but may be different from each other. From the viewpoint of flatness, adhesiveness, a higher resolution by the control of incident angles, or the like, it is preferable that the heights (thicknesses) of the respective laminates are almost same as each other. Incidentally, it is preferable that the height differences of the colored layer and the top surface of the near-infrared transmitting filter layer 11 are almost same as each other. In addition, an intermediate layer may be provided between the near-infrared transmitting filter layer 11 and the lens 50, between the color filter layer 30 and the lens 50, and between the color filter layer 30 and the near-infrared shielding filter layer 22.

Figure 4:
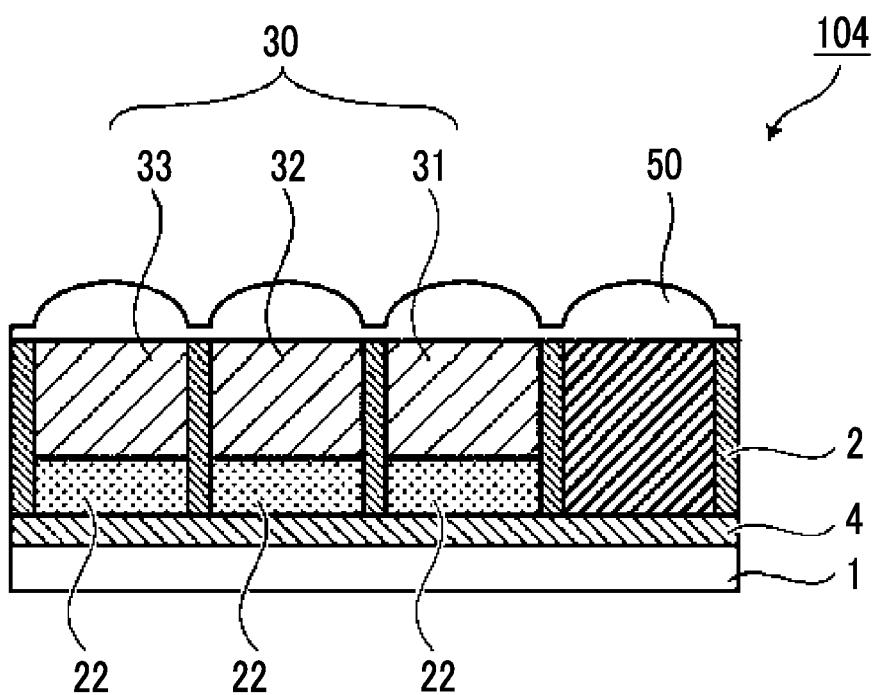
FIG. 4 is a schematic view showing an embodiment of the structure of the present invention.

A structure 104 shown in FIG. 4 has the same configuration as in FIG. 3, except that an underlayer 4 is provided on the support 1 and the partition wall 2 is provided on the underlayer 4. A structure 105 shown in FIG. 5 has the same configuration as in FIG. 3, except that a near-infrared shielding filter layer 22 is provided on each colored layer of a color filter layer 30. A structure 106 shown in FIG. 6 has the same configuration as in FIG. 3, except that it does not have the near-infrared shielding filter layer 22. A structure 107 shown in FIG. 7 has the same configuration as in FIG. 3, except that it has a protective layer 3 on a surface of the partition wall 2. A structure 108 shown in FIG. 8 has the same configuration as in FIG. 3, except that in a region in which the color filter layer 30 is provided, a partition wall 2a is provided between the near-infrared shielding filter layers 22, each of the near-infrared shielding filter layers 22 is partitioned by the partition wall 2a, or by the partition wall 2 and the partition wall 2a, but the partition wall is not provided between the respective colored layers of the respective near-infrared shielding filter layers. A structure 109 shown in FIG. 9 has the same configuration as in FIG. 3, except that in a region in which the color filter layer 30 is provided, a partition wall 2b is provided on the near-infrared shielding filter layers 22, each of the colored layers is partitioned by the partition wall 2b, or by the partition wall 2 and the partition wall 2b. A structure 110 shown in FIG. 10 has the same configuration as in FIG. 3, except that in a region in which the color filter layer 30 is provided, there is no partition wall between the colored layers, and colored layers 31 to 33 are formed in one region partitioned by partition wall 2. A structure 111 shown in FIG. 11 has the same configuration as in FIG. 3, except that the top surface of each of the colored layers is higher than the near-infrared transmitting filter layer 11 and the height difference between the both is filled with the lens 50. A structure 112 shown in FIG. 12 has the same configuration as in FIG. 3, except that the top surface of each of the colored layers is lower than the near-infrared transmitting filter layer 11 and the height difference between the both is filled with the lens 50. A structure 113 shown in FIG. 13 has the same configuration as in FIG. 3, except that in a region in which the color filter layer 30 is provided, a transparent layer 41 is provided on each of the colored layers. A structure 114 shown in FIG. 14 has the same configuration as in FIG. 3, except that a laminate of a near-infrared shielding filter layer 22 and a transparent layer 42 is provided in a region partitioned by the partition wall 2 on the support 1, different from the region in which the near-infrared transmitting filter layer 11 and the color filter layer 30 are provided. Further, in FIG. 14, only the transparent layer 42 may be provided, instead of the laminate of the near-infrared shielding filter layer 22 and the transparent layer 42. A structure 115 shown in FIG. 15 has the same configuration as in FIG. 3, except that the top surface of the near-infrared transmitting filter layer 11 is higher than the top surface of each of the colored layers, and the height difference of the both is filled with a lens 50. A structure 116 shown in FIG. 16 has the same configuration as in FIG. 3, except that the top surface of the near-infrared transmitting filter layer 11 is lower than the top surface of each of the colored layers, and the height difference of the both is filled with the lens 50. A structure 117 shown in FIG. 17 has the same configuration as in FIG. 3, except that a transparent layer 41 is provided on the near-infrared transmitting filter layer 11. A structure 118 shown in FIG. 18 has the same configuration as in FIG. 3, except that a black matrix 5 is provided on the support 1 and the partition wall 2 are provided on the black matrix 5. In FIGS. 5 to 18, an underlayer may further be formed on the support 10. Further, in FIGS. 4 to 18, an intermediate layer may be provided between the members of the upper layer and the lower layer. In addition, in FIGS. 4 to 6, and 8 to 18, a protective layer may further be provided on a surface of the partition wall.

<Optical Sensor>

Next, the optical sensor of an embodiment of the present invention will be described. The optical sensor of the embodiment of the present invention includes the above-mentioned structure of the embodiment of the present invention. The optical sensor of the embodiment of the present invention can be preferably used in applications such as surveillance applications, security applications, mobile applications, automotive applications, agricultural applications, medical applications, distance measuring applications, gesture recognition applications, and vital recognition applications.

<Composition for Forming Near-Infrared Transmitting Filter Layer>

Next, the composition for forming a near-infrared transmitting filter layer of an embodiment of the present invention will be described. The composition for forming a near-infrared transmitting filter layer of the embodiment of the present invention is a composition used for the formation of the above-mentioned near-infrared transmitting filter layer of the structure of the embodiment of the present invention, in which the composition includes a color material and a curable compound. Hereinafter, the composition for forming a near-infrared transmitting filter layer is also referred to as a composition for a near-infrared transmitting filter.

Next, the composition for a near-infrared transmitting filter has a ratio of the minimum value Amin in an absorbance in a wavelength range of 400 to 640 nm to the maximum value Bmax in an absorbance in a wavelength range of 1,100 to 1,300 nm, Amin/Bmax, of preferably 5 or more, more preferably 7.5 or more, still more preferably 15 or more, and particularly preferably 30 or more.

An absorbance $A\lambda$, at a certain wavelength $\lambda$ is defined by Expression (1).

$$A\lambda = -\log(T\lambda/100) \quad (1)$$

$A\lambda$ is an absorbance at a wavelength $\lambda$, and $T\lambda$, represents a transmittance (%) at the wavelength $\lambda$.

In the present invention, a value of the absorbance may be a value measured in the form of a solution or a value of a film which is formed using the composition for a near-infrared transmitting filter. In a case where the absorbance is measured in the state of the film, it is preferable that the absorbance is measured using a film prepared by applying the composition for a near-infrared transmitting filter onto a glass substrate using a method such as spin coating such that the thickness of the dried film is a predetermined value, and drying the applied composition using a hot plate at 100° C. for 120 seconds. The thickness of the film can be measured using a stylus surface profilometer (DEKTAK 150, manufactured by ULVAC Inc.) onto a substrate including the film.

Moreover, the absorbance can be measured using a spectrophotometer known in the related art. A measurement condition for the absorbance is not particularly limited, but it is preferable that the maximum value B in the absorbance in a wavelength range of 1,100 to 1,300 nm is measured under conditions which are adjusted such that the minimum value A in the absorbance in a wavelength range of 400 to 640 nm is 0.1 to 3.0. By measuring the absorbance under such conditions, a measurement error can be further reduced. A method of adjusting the minimum value Amin in the absorbance in a wavelength range of 400 to 640 nm to be 0.1 to 3.0 is not particularly limited. For example, in a case where the absorbance is measured in the state of a solution, for example, a method of adjusting the optical path length of a sample cell may be mentioned. In addition, in a case where the absorbance is measured in the state of a film, for example, a method of adjusting the thickness of the film may be mentioned.

It is more preferable that the composition for a near-infrared transmitting filter layer satisfies spectral characteristics of any one of (1) to (4) below.

(1): A ratio of the minimum value Amin 1 in an absorbance in a wavelength range of 400 to 640 nm to the maximum value Bmax 1 in an absorbance in a wavelength range of 800 to 1,300 nm, Amin 1/Bmax 1, is preferably 5 or more, more preferably 7.5 or more, still more preferably 15 or more, and even still more preferably 30 or more. According to this aspect, it is possible to form a film capable of shielding light in a wavelength range of 400 to 640 nm and transmitting near-infrared light at a wavelength of 720 nm.

(2): A ratio of the minimum value Amin 2 in an absorbance in a wavelength range of 400 to 750 nm to the maximum value Bmax 2 in an absorbance in a wavelength range of 900 to 1,300 nm, Amin 2/Bmax 2, is preferably 5 or more, more preferably 7.5 or more, still more preferably 15 or more, and even still more preferably 30 or more. According to this aspect, it is possible to form a film capable of shielding light in a wavelength range of 400 to 750 nm and transmitting near-infrared light at a wavelength of 850 nm.

(3): A ratio of the minimum value Amin 3 in an absorbance in a wavelength range of 400 to 850 nm to the maximum value Bmax 3 in an absorbance in a wavelength range of 1,000 to 1,300 nm, Amin 3/Bmax 3, is preferably 5 or more, more preferably 7.5 or more, still more preferably 15 or more, and even still more preferably 30 or more. According to this aspect, it is possible to form a film capable of shielding light in a wavelength range of 400 to 830 nm and transmitting near-infrared light at a wavelength of 940 nm.

(4): A ratio of the minimum value Amin 4 in an absorbance in a wavelength range of 400 to 950 nm to the maximum value Bmax 4 in an absorbance in a wavelength range of 1,100 to 1,300 nm, Amin 4/Bmax 4, is preferably 5 or more, more preferably 7.5 or more, still more preferably 15 or more, and even still more preferably 30 or more. According to this aspect, it is possible to form a film capable of shielding light in a wavelength range of 400 to 950 nm and transmitting near-infrared light at a wavelength of 1,040 nm.

In a case where a film having a thickness of 1 μm, 2 μm, 3 μm, 4 μm, or 5 μm is formed using the composition for a near-infrared transmitting filter, it is preferable to satisfy the spectral characteristics that the maximum value in a wavelength range of 400 to 640 nm of the transmittance of light in the thickness direction of the film is 20% or less and the minimum value in a wavelength range of 1,100 to 1,300 nm of the transmittance of light in the thickness direction is 70% or more. The maximum value in a wavelength range of 400 to 640 nm is preferably 15% or less, and more preferably 10% or less. The minimum value in a wavelength range of 1,100 to 1,300 nm is preferably 75% or more, and more preferably 80% or more.

The composition for a near-infrared transmitting filter layer preferably satisfies spectral characteristics of any one of (11) to (14) below.

(11): An aspect in which in a case where a film having a thickness of 1 μm, 2 μm, 3 μm, 4 μm, or 5 μm is formed using the composition for a near-infrared transmitting filter, the maximum value in a wavelength range of 400 to 640 nm of the transmittance of light in the thickness direction of the film is 20% or less (preferably 15% or less, and more preferably 10% or less), and the minimum value in a wavelength range of 800 to 1,300 nm of the transmittance of light in the thickness direction of the film is 70% or more (preferably 75% or more, and more preferably 80% or more).

(12): An aspect in which in a case where a film having a thickness of 1 μm, 2 μm, 3 μm, 4 μm, or 5 μm is formed using the composition for a near-infrared transmitting filter, the maximum value in a wavelength range of 400 to 750 nm of the transmittance of light in the thickness direction of the film is 20% or less (preferably 15% or less, and more preferably 10% or less), and the minimum value in a wavelength range of 900 to 1,300 nm of the transmittance of light in the thickness direction of the film is 70% or more (preferably 75% or more, and more preferably 80% or more).

(13): An aspect in which in a case where a film having a thickness of 1 μm, 2 μm, 3 μm, 4 μm, or 5 μm is formed using the composition for a near-infrared transmitting filter, the maximum value in a wavelength range of 400 to 830 nm of the transmittance of light in the thickness direction of the film is 20% or less (preferably 15% or less, and more preferably 10% or less), and the minimum value in a wavelength range of 1,000 to 1,300 nm of the transmittance of light in the thickness direction of the film is 70% or more (preferably 75% or more, and more preferably 80% or more).

(14): An aspect in which in a case where a film having a thickness of 1 μm, 2 μm, 3 μm, 4 μm, or 5 μm is formed using the composition for a near-infrared transmitting filter, the maximum value in a wavelength range of 400 to 950 nm of the transmittance of light in the thickness direction of the film is 20% or less (preferably 15% or less, and more preferably 10% or less), and the minimum value in a wavelength range of 1,100 to 1,300 nm of the transmittance of light in the thickness direction of the film is 70% or more (preferably 75% or more, and more preferably 80% or more).

Hereinafter, the respective components that can constitute the composition for a near-infrared transmitting filter will be described.

<<Color Material>>

The composition for a near-infrared transmitting filter includes a color material. The content of the color material is preferably 35% to 80% by mass with respect to the total solid content of the composition for a near-infrared transmitting filter. The lower limit is preferably 40% by mass or more, more preferably 45% by mass or more, still more preferably 50% by mass or more, and particularly preferably 55% by mass or more. The upper limit is preferably 75% by mass or less, and more preferably 70% by mass or less. Examples of the color material include a color material that shields visible light which will be described later, and a near-infrared absorbing dye. The content of the color material is preferably 50% to 75% by mass with respect to the total solid content of the composition for a near-infrared transmitting filter.

<<Color Material that Shields Visible Light>>

It is preferable that the composition for a near-infrared transmitting filter contains a color material that shields visible light (hereinafter also referred to as a light shielding material). In the present invention, the light shielding material is preferably a color material that absorbs light in a wavelength range from violet to red. Further, in the present invention, the light shielding material is preferably a color material that shields visible light is a color material that shields light in a wavelength range of 400 to 640 nm. In addition, the light shielding material is preferably a color material that transmits light at a wavelength of 1,100 to 1,300 nm. In the present invention, the light shielding material preferably satisfies at least one requirement of (1) or (2) below.

(1): Two or more chromatic coloring agents are included and a combination of the two or more chromatic coloring agents forms black.

(2): An organic black coloring agent is included. In the aspect of (2), it is preferable that a chromatic coloring agent is further contained.

Moreover, in the present invention, the chromatic coloring agent means a coloring agent other than a white coloring agent and a black coloring agent. Further, in the present invention, the organic black coloring agent used for the light shielding material means a material that absorbs visible light but transmits at least a portion of near-infrared light. Accordingly, in the present invention, the organic black coloring agent used for the light shielding material does not include a black coloring agent that absorbs both visible light and near-infrared light, for example, carbon black and titanium black. The organic black coloring agent is preferably a coloring agent having the maximum absorption wavelength in a wavelength range from 400 nm to 700 nm.

In the present invention, it is preferable that the light shielding material is a material in which a ratio A/B of the minimum value A of an absorbance in a wavelength range of 400 to 640 nm to the maximum value B of an absorbance in a wavelength range of 1,100 to 1,300 nm is 4.5 or more.

The above-described characteristics may be satisfied using one material singly or using a combination of a plurality of materials. For example, in a case of the aspect (1), it is preferable that the spectral characteristics are satisfied using a combination of a plurality of chromatic coloring agents. In addition, in a case of the aspect of (2), the spectral characteristics may be satisfied using an organic black coloring agent. In addition, the spectral characteristics may be satisfied using a combination of an organic black coloring agent and a chromatic coloring agent.

(Chromatic Coloring Agent)

In the present invention, the chromatic coloring agent is preferably a coloring agent selected from a red coloring agent, a green coloring agent, a blue coloring agent, a yellow coloring agent, a violet coloring agent, and an orange coloring agent. In the present invention, the chromatic coloring agent may be either a pigment or a dye, and is preferably the pigment. It is preferable that an average particle diameter (r) of the pigment satisfies preferably 20 nm≤r≤300 nm, more preferably 25 nm≤r≤250 nm, and still more preferably 30 nm≤r≤200 nm. An "average particle diameter" as mentioned herein means the average particle diameter for secondary particles to which primary particles of the pigment are aggregated. In addition, with regard to a particle size distribution of the secondary particles of the pigment (hereinafter simply referred to as "particle size distribution") which can be used, secondary particles having a particle diameter in the range of an average particle diameter±100 nm account for preferably 70% by mass or more, and more preferably 80% by mass or more in the entire pigment. In addition, the particle size distribution of the secondary particles can be measured using a scattering intensity distribution.

The pigment is preferably an organic pigment. Examples of the organic pigment include the following pigments.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all of which are yellow pigments), C. I. Pigment Orange 2, 5, 13, 16, 17:1, 31, 34, 36, 38, 43, 46, 48, 49, 51, 52, 55, 59, 60, 61, 62, 64, 71, 73, and the like (all of which are orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (all of which are red pigments), C. I. Pigment Green 7, 10, 36, 37, 58, 59, and the like (all of which are green pigments), C. I. Pigment Violet 1, 19, 23, 27, 32, 37, 42, and the like (all of which are violet pigments), C. I. Pigment Blue 1, 2, 15, 15:1, 15:2, 15:3, 15:4, 15:6, 16, 22, 60, 64, 66, 79, 80, and the like (all of which are blue pigments).

These organic pigments can be used singly or in combination of two or more kinds thereof.

The dye is not particularly limited and known dyes can be used. In terms of the chemical structures, a dye such as a pyrazole azo-based dye, an anilino azo-based dye, a triarylmethane-based dye, an anthraquinone-based dye, an anthrapyridone-based dye, a benzylidene-based dye, an oxonol-based dye, a pyrazolotriazole azo-based dye, a pyridone azo-based dye, a cyanine-based dye, a phenothiazine-based dye, a pyrrolopyrazole azomethine-based dye, a xanthene-based dye, a phthalocyanine-based dye, a benzopyran-based dye, an indigo-based dye, or a pyrromethene-based dye can be used. In addition, a dimer of such a dye may be used. In addition, dyes described in JP2015-028144A and JP2015-034966A can also be used.

It is preferable that the light shielding material includes at least two or more selected from a red coloring agent, a blue coloring agent, a yellow coloring agent, a violet coloring agent, or a green coloring agent. That is, it is preferable that the light shielding material forms black by combination of at least two or more selected from a red coloring agent, a blue coloring agent, a yellow coloring agent, a violet coloring agent, or a green coloring agent. Preferred examples of the combination include the following aspects.

(1) An aspect in which the light shielding material contains a red coloring agent and a blue coloring agent.

(2) An aspect in which the light shielding material contains red coloring agent, a blue coloring agent, and a yellow coloring agent.

(3) An aspect in which the light shielding material contains a red coloring agent, a blue coloring agent, a yellow coloring agent, and a violet coloring agent.

(4) An aspect in which the light shielding material contains a red coloring agent, a blue coloring agent, a yellow coloring agent, a violet coloring agent, and a green coloring agent.

(5) An aspect in which the light shielding material contains a red coloring agent, a blue coloring agent, a yellow coloring agent, and a green coloring agent.

(6) An aspect in which the light shielding material contains a red coloring agent, a blue coloring agent, and a green coloring agent.

(7) An aspect in which the light shielding material contains a yellow coloring agent and a violet coloring agent.

In the above aspect of (1), the mass ratio of the red coloring agent to the blue coloring agent in terms of red coloring agent:blue coloring agent is preferably 20 to 80:20 to 80, more preferably 20 to 60:40 to 80, and still more preferably 20 to 50:50 to 80.

In the above aspect of (2), the mass ratio of the red coloring agent to the blue coloring agent to the yellow coloring agent in terms of red coloring agent:blue coloring agent:yellow coloring agent is preferably 10 to 80:20 to 80:10 to 40, more preferably 10 to 60:30 to 80:10 to 30, and still more preferably 10 to 40:40 to 80:10 to 20.

In the above aspect of (3), the mass ratio of the red coloring agent to the blue coloring agent to the yellow coloring agent to the violet coloring agent in terms of red coloring agent:blue coloring agent:yellow coloring agent:violet coloring agent is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the above aspect of (4), the mass ratio of the red coloring agent to the blue coloring agent to the yellow coloring agent to the violet coloring agent to the green coloring agent in terms of red coloring agent:blue coloring agent:yellow coloring agent:violet coloring agent:green coloring agent is preferably 10 to 80:20 to 80:5 to 40:5 to 40:5 to 40, more preferably 10 to 60:30 to 80:5 to 30:5 to 30:5 to 30, and still more preferably 10 to 40:40 to 80:5 to 20:5 to 20:5 to 20.

In the above aspect of (5), the mass ratio of the red coloring agent to the blue coloring agent to the yellow coloring agent to the green coloring agent in terms of red coloring agent:blue coloring agent:yellow coloring agent:green coloring agent is preferably 10 to 80:20 to 80:5 to 40:5 to 40, more preferably 10 to 60:30 to 80:5 to 30:5 to 30, and still more preferably 10 to 40:40 to 80:5 to 20:5 to 20.

In the above aspect of (6), the mass ratio of the red coloring agent to the blue coloring agent to the green coloring agent in terms of red coloring agent:blue coloring agent:green coloring agent is preferably 10 to 80:20 to 80:10 to 40, more preferably 10 to 60:30 to 80:10 to 30, and still more preferably 10 to 40:40 to 80:10 to 20.

In the above aspect of (7), the mass ratio of the yellow coloring agent to the violet coloring agent in terms of yellow coloring agent:violet coloring agent is preferably 10 to 50:40 to 80, more preferably 20 to 40:50 to 70, and still more preferably 30 to 40:60 to 70.

As the yellow coloring agent, C. I. Pigment Yellow 139, 150, or 185 is preferable, C. I. Pigment Yellow 139 or 150 is more preferable, and C. I. Pigment Yellow 139 is still more preferable. As the blue coloring agent, C. I. Pigment Blue 15:6 is preferable. As the violet coloring agent, C. I. Pigment Violet 23 is preferable. As the red coloring agent, Pigment Red 122, 177, 224, or 254 is preferable, Pigment Red 122, 177, or 254 is more preferable, and Pigment Red 254 is still more preferable. As the green coloring agent, C. I. Pigment Green 7; 36, 58, or 59 is preferable.

(Organic Black Coloring Agent)

In the present invention, examples of the organic black coloring agent include a bisbenzofuranone compound, an azomethine compound, a perylene compound, and an azo-based compound, and the bisbenzofuranone compound or the perylene compound is preferable. Examples of the bisbenzofuranone compound include those described in JP2010-534726A, JP2012-515233A, and JP2012-515234A, and are available as, for example, "Irgaphor Black" manufactured by BASF Corporation. Examples of the perylene compound include C. I. Pigment Black 31 and 32. Examples of the azomethine compound include those described in JP1989-170601A (JP-H01-170601A), JP1990-034664A (JP-H02-034664A), and the like, and are available as, for example, "CHROMOFINE BLACK A1103" manufactured by Dainichiseika Color & Chemicals Mfg. Co., Ltd.

In the present invention, the bisbenzofuranone compounds are preferably compounds represented by the following formulae or a mixture thereof.

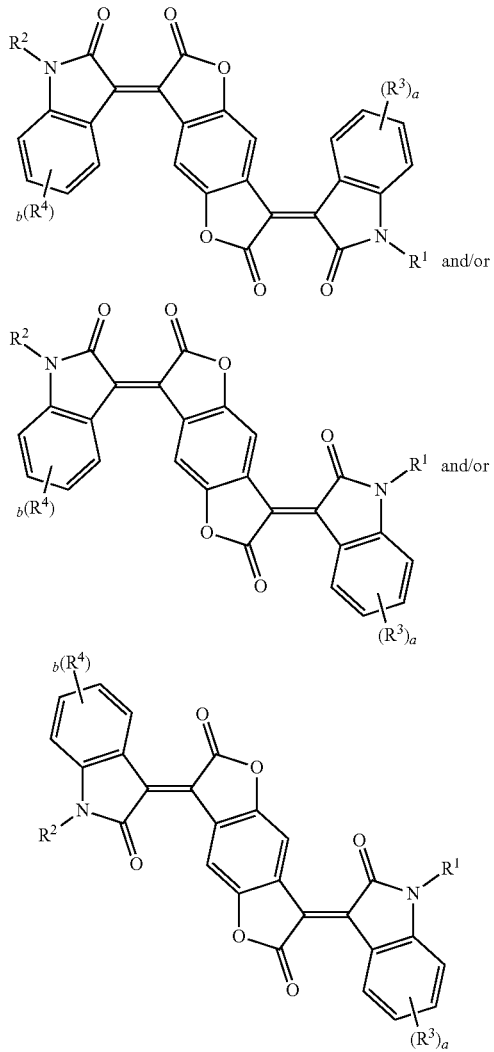

In the formula, $R^1$ and $R^2$ each independently represent a hydrogen atom or a substituent, $R^3$ and $R^4$ each independently represent a substituent, and a and b each independently represent an integer of 0 to 4; in a case where a is 2 or more, a plurality of $R^3$'s may be the same as or different from each other and the plurality of $R^3$'s may be bonded to each other to form a ring, in a case where b is 2 or more, a plurality of $R^4$'s may be the same as or different from each other and the plurality of $R^4$'s may be bonded to each other to form a ring.

The substituent represented by each of $R^1$ to $R^4$ represents a halogen atom, a cyano group, a nitro group, an alkyl group, an alkenyl group, alkynyl group, an aralkyl group, an aryl group, a heteroaryl group, $-OR^{301}$, $-COR^{302}$, $-COOR^{303}$, $-OCOR^{304}$, $-NR^{305}R^{306}$, $-NHCOR^{307}$, $-CONR^{308}R^{309}$, $-NHCONR^{310}R^{311}$, $-NHCOOR^{312}$, $-SR^{313}$, $-SO_2R^{314}$, $-SO_2OR^{315}$, $-NHSO_2R^{316}$, or $-SO_2NR^{317}R^{318}$, and $R^{301}$ to $R^{318}$ each independently represent a hydrogen atom, an alkyl group, an alkenyl group, an alkynyl group, an aryl group, or a heteroaryl group.

With regard to the details of the bisbenzofuranone compounds, reference can be made to the descriptions in paragraph Nos. 0014 to 0037 of JP2010-534726A, the contents of which are incorporated herein by reference.

In the present invention, in a case where an organic black coloring agent is used as the light shielding material, it is preferable that the organic black coloring agent is used in combination of a chromatic coloring agent. By using the organic black coloring agent in combination of the chromatic coloring agent, excellent spectral characteristics are likely to be obtained. Examples of the chromatic coloring agent which is used in combination with the organic black coloring agent include a red coloring agent, a blue coloring agent, and a violet coloring agent, and the red coloring agent or the blue coloring agent is preferable. These may be used singly or in combination of two or more kinds thereof.

In addition, with regard to a mixing ratio of the chromatic coloring agent to the organic black coloring agent, the amount of the organic black coloring agent is preferably 10 to 200 parts by mass, and more preferably 15 to 150 parts by mass, with respect to 100 parts by mass of the organic black coloring agent.

In the present invention, the content of the pigment in the light shielding material is preferably 95% by mass or more, more preferably 97% by mass or more, and still more preferably 99% by mass or more, with respect to the total mass of the light shielding material.

The content of the light shielding material in the composition for a near-infrared transmitting filter is preferably 10% to 80% by mass with respect to the total solid content of the composition for forming a near-infrared transmitting filter. The lower limit is preferably 30% by mass or more, more preferably 35% by mass or more, still more preferably 40% by mass or more, even still more preferably 45% by mass or more, and particularly preferably 50% by mass or more. The upper limit is preferably 75% by mass or less, and more preferably 70% by mass or less.

(Near-Infrared Absorbing Dye)

The composition for a near-infrared transmitting filter can contain a near-infrared absorbing dye as the color material. In the near-infrared transmitting filter, the near-infrared absorbing dye plays a role in limiting transmissive light (near-infrared light) to a longer wavelength side.

In the present invention, a compound having the maximum absorption wavelength in a wavelength range of the near-infrared region (preferably in a wavelength range of more than 700 nm and 1,300 nm or less) can be preferably used as the near-infrared absorbing dye. The near-infrared absorbing dye may be either a pigment or a dye.

In the present invention, as the near-infrared absorbing dye, a near-infrared absorbing compound having a π-conjugated plane including a monocyclic or fused aromatic ring can be preferably used. The number of atoms other than hydrogen constituting a π-conjugated plane contained in the near-infrared absorbing compound is preferably 14 or more, more preferably 20 or more, still more preferably 25 or more, and particularly preferably 30 or more. The upper limit is, for example, preferably 80 or less, and more preferably 50 or less.

The π-conjugated plane contained in the near-infrared absorbing compound preferably includes two or more monocyclic or fused aromatic rings, more preferably includes three or more monocyclic or fused aromatic rings, still more preferably includes four or more monocyclic or fused aromatic rings, and particularly preferably includes five or more monocyclic or fused aromatic rings. The upper limit is preferably 100 or less, more preferably 50 or less, and still more preferably 30 or less. Examples of the above-mentioned aromatic ring include a benzene ring, a naphthalene ring, a pentalene ring, an indene ring, an azulene ring, a heptalene ring, an indacene ring, a perylene ring, a pentacene ring, a quarterylene group, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, an a quinoxaline ring, an a pyrimidine ring, an a quinazoline ring, a pyridazine ring, a triazine ring, a pyrrole ring, an indole ring, an isoindole ring, a carbazole ring, and a fused ring having such the ring.

The near-infrared absorbing compound is preferably a compound having the maximum absorption wavelength in a wavelength range of 700 to 1,000 nm. Further, in the present specification, an expression, "having the maximum absorption wavelength in a wavelength range of 700 to 1,000 nm" means having a wavelength exhibiting the maximum absorbance in a wavelength range of 700 to 1,000 nm in an absorption spectrum in a solution of the near-infrared absorbing compound. Examples of a measuring solvent used for the measurement of the absorption spectrum of the solution of the near-infrared absorbing compound include chloroform, methanol, dimethyl sulfoxide, ethyl acetate, and tetrahydrofuran. In a case of the compound which is dissolved in chloroform, chloroform is used as the measurement solvent. In a case of the compound which is not dissolved in chloroform, methanol is used. In addition, in a case where the compound is not dissolved in any of chloroform and methanol, dimethyl sulfoxide is used.

In the present invention, as the near-infrared absorbing compound, at least one compound selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable; at least one compound selected from a pyrrolopyrrole compound, a cyanine compound, a squarylium compound, a phthalocyanine compound, a naphthalocyanine compound, or a diimmonium compound is more preferable; at least one selected from a pyrrolopyrrole compound, a cyanine compound, or a squarylium compound is more preferable; and a pyrrolopyrrole compound is particularly preferable. Examples of the diimmonium compound include the compounds described in JP2008-528706A, the contents of which are incorporated herein by reference. Examples of the phthalocyanine compound include the compounds described in paragraph No. 0093 of JP2012-077153A, the oxytitanium phthalocyanine described in JP2006-343631A, and the compounds described in paragraph Nos. 0013 to 0029 of JP2013-195480A, the contents of which are incorporated herein by reference. Examples of the naphthalocyanine compound include the compounds described in paragraph No. 0093 of JP2012-077153A, the contents of which are incorporated herein by reference. Further, as the cyanine compound, the phthalocyanine compound, the naphthalocyanine compound, the diimmonium compound, and the squarylium compound, the compounds described in paragraph Nos. 0010 to 0081 of JP2010-111750A, the contents of which are incorporated herein by reference, may be used. Incidentally, with reference to the cyanine compound, reference can be made to, for example, "Functional Colorants, edited by Makoto Okawara/Masaru Matsuoka/Teijiro Kitao/Tsuneoka Hirashima, published by Kodansha Scientific Ltd.", the contents of which are incorporated herein by reference. In addition, as the near-infrared absorbing compound, the compounds described in JP2016-146619A, the contents of which are incorporated herein by reference, can also be used.

As the pyrrolopyrrole compound, a compound represented by Formula (PP) is preferable.

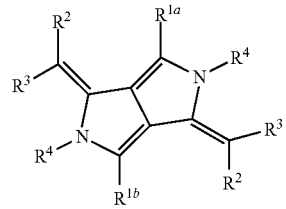

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, $-BR^{4A}R^{4B}$, or a metal atom, $R^4$ may be bonded to at least one selected from $R^{1a}$, $R^{1b}$, or $R^3$ through a covalent bond or a coordination bond, and $R^{4A}$ and $R^{4B}$ each independently represent a substituent. With reference to the details of Formula (PP), reference can be made to the descriptions in paragraph Nos. 0017 to 0047 of JP2009-263614A, paragraph Nos. 0011 to 0036 of JP2011-068731A, and paragraph Nos. 0010 to 0024 of WO2015/166873A, the contents of which are incorporated herein by reference.

$R^{1a}$ and $R^{1b}$ are each independently preferably an aryl group or a heteroaryl group, and more preferably an aryl group. Further, the alkyl group, the aryl group, and the heteroaryl group, represented by each of $R^{1a}$ and $R^{1b}$, may have a substituent or may be unsubstituted. Examples of the substituent include an alkoxy group, a hydroxy group, a halogen atom, a cyano group, a nitro group, $-OCOR^{11}$, $-SOR^{12}$, and $-SO_2R^{13}$. $R^{11}$ to $R^{13}$ each independently represent a hydrocarbon group or a heterocyclic group. Further, examples of the substituent include the substituents described in paragraph Nos. 0020 to 0022 of JP2009-263614A. Among those, as the substituent, an alkoxy group, a hydroxy group, a cyano group, a nitro group, $-OCOR^{11}$, $-SOR^{12}$, or $-SO_2R^{13}$ is preferable. As the group represented by each of $R^{1a}$ or $R^{1b}$, an aryl group having an alkoxy group having a branched alkyl group as a substituent, an aryl group having a hydroxy group as a substituent, or an aryl group having a group represented by $-OCOR^{11}$ as a substituent is preferable. The number of carbon atoms of the branched alkyl group is preferably 3 to 30, and more preferably 3 to 20.

It is preferable that at least one of $R^2$ or $R^3$ is an electron withdrawing group, and it is more preferable that $R^2$ represents an electron withdrawing group (preferably a cyano group) and $R^3$ represents a heteroaryl group. The heteroaryl group is preferably a 5- or 6-membered ring. Further, the heteroaryl group is preferably a monocycle or a fused ring, a monocycle or a fused ring having 2 to 8 fusions is more preferable; and a monocycle or a fused ring having 2 to 4 fusions is still more preferable. The number of heteroatoms constituting the heteroaryl group is preferably 1 to 3, and more preferably 1 or 2. Examples of the heteroatom include a nitrogen atom, an oxygen atom, and a sulfur atom. The heteroaryl group preferably has one or more nitrogen atoms. Two $R^2$'s in Formula (PP) may be the same as or different from each other. Further, two $R^3$'s in Formula (PP) may be the same as or different from each other.

$R^4$ is preferably a hydrogen atom, an alkyl group, an aryl group, a heteroaryl group, or a group represented by —$BR^{4A}R^{4B}$, more preferably a hydrogen atom, an alkyl group, an aryl group or a group represented by —$BR^{4A}R^{4B}$, and still more preferably a group represented by —$BR^{4A}R^{4B}$. As the substituent represented by each of $R^{4A}$ and $R^{4B}$, a halogen atom, an alkyl group, an alkoxy group, an aryl group, or a heteroaryl group is preferable, and an alkyl group, an aryl group, or a heteroaryl group is more preferable, and an aryl group is particularly preferable. Such a group may further have a substituent. Two $R^4$'s in Formula (PP) may be the same as or different from each other.

Specific examples of the compound represented by Formula (PP) include the following compounds. In the following structural formulae, Me represents a methyl group and Ph represents a phenyl group. Further, examples of the pyrrolopyrrole compound include the compounds described in paragraph Nos. 0016 to 0058 of JP2009-263614A, the compounds described in paragraph Nos. 0037 to 0052 of JP2011-068731A, and the compounds described in paragraph Nos. 0010 to 0033 of WO2015/166873A, the contents of which are incorporated herein by reference.

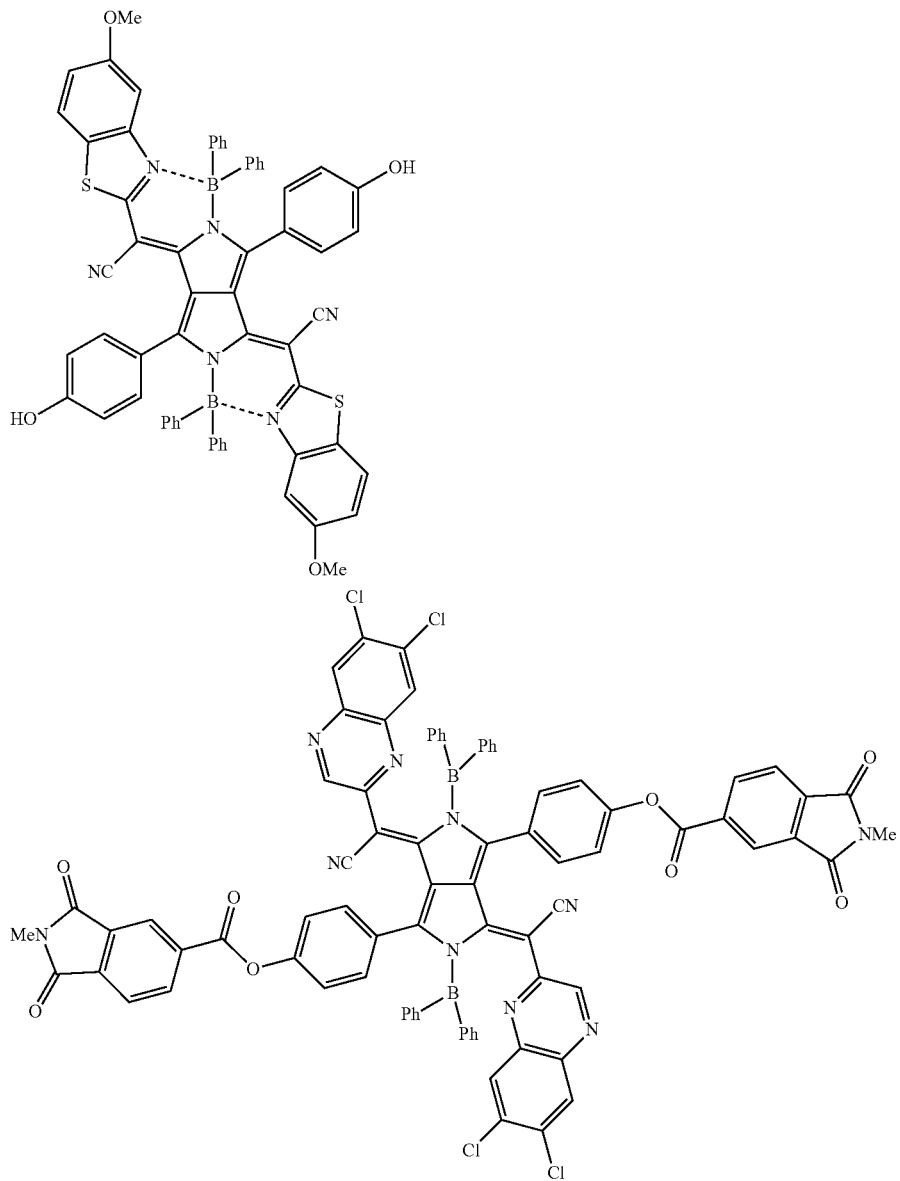

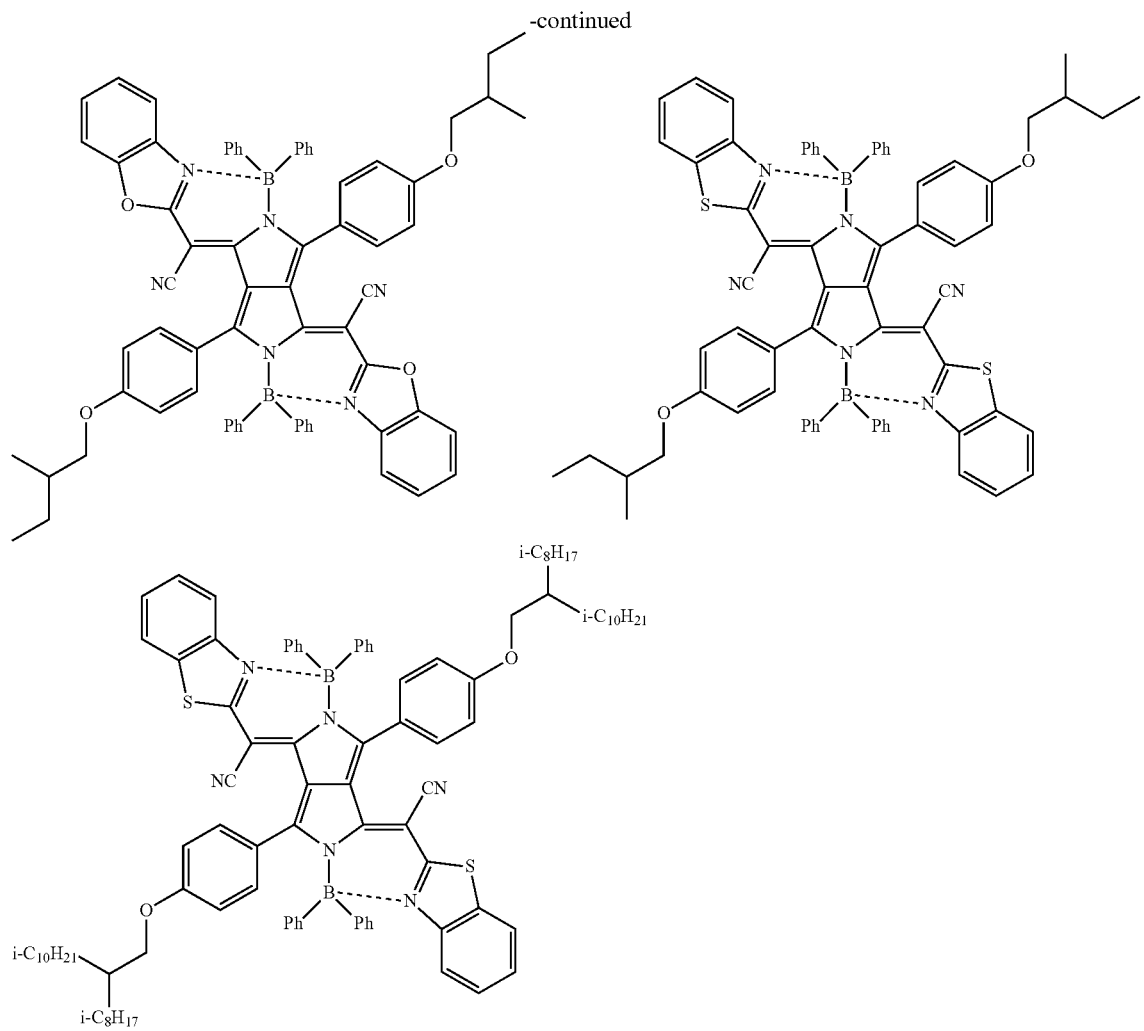

As the squarylium compound, a compound represented by Formula (SQ) is preferable.

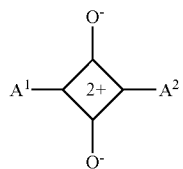

(SQ)

In Formula (SQ), $A^1$ and $A^2$ each independently represent an aryl group, a heteroaryl group, or a group represented by Formula (A-1);

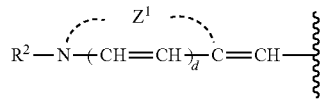

(A-1)

in Formula (A-1), $Z^1$ represents a non-metal atomic group that forms a nitrogen-containing heterocycle, $R^2$ represents an alkyl group, an alkenyl group, or an aralkyl group, d represents 0 or 1, and a wavy line represents a linking arm.

The number of carbon atoms of the aryl group represented by each of $A^1$ and $A^2$ is preferably 6 to 48, more preferably 6 to 24, and particularly preferably 6 to 12.

As the heteroaryl group represented by each of $A^1$ and $A^2$, a 5- or 6-membered ring is preferable. Further, the heteroaryl group is preferably a monocycle or a fused ring having 2 to 8 fusions, more preferably a monocycle or a fused ring having 2 to 4 fusions, and still more preferably a monocycle or a fused ring having 2 or 3 fusions. Examples of the heteroatom constituting the ring of the heteroaryl group include a nitrogen atom, an oxygen atom, and a sulfur atom, with the nitrogen atom or the sulfur atom being preferable. The number of heteroatoms constituting the heteroaryl group is preferably 1 to 3, and more preferably 1 or 2.

The aryl group and the heteroaryl group may have a substituent. In a case where the aryl group and the heteroaryl group have two or more substituents, the plurality of substituents may be the same as or different from each other.

Examples of the substituent include a halogen atom, a cyano group, a nitro group, an alkyl group, an alkenyl group, an alkynyl group, an aryl group, a heteroaryl group, aralkyl group, —$OR^{10}$, —$COR^{11}$, —$COOR^{12}$, —$OCOR^{13}$, —$NR^{14}R^{15}$, —$NHCOR^{16}$, —$CONR^{17}R^{18}$, —NHCONR$^{19}$R$^{20}$, —NHCOOR$^{21}$, —SR$^{22}$, —SO$_2$R$^{23}$, —SO$_2$OR$^{24}$, —NHSO$_2$R$^{25}$, and —SO$_2$NR$^{26}$R$^{27}$. R$^{10}$ to R$^{27}$ each independently represent a hydrogen atom, an alkyl group, an alkenyl group, an alkynyl group, an aryl group, a heteroaryl group, or aralkyl group. Further, in a case where R$^{12}$ in —COOR$^{12}$ is a hydrogen atom, the hydrogen atom may be dissociated or in the form of a salt. In addition, in a case where R$^{24}$ in —SO$_2$OR$^{24}$ is a hydrogen atom, the hydrogen atom may be dissociated or in the form of a salt.

Next, a group represented by Formula (A-1), which is represented by A$^1$ and A$^2$, will be described.

In Formula (A-1), R$^2$ represents an alkyl group, an alkenyl group, or an aralkyl group, with the alkyl group being preferable. In Formula (A-1), as the nitrogen-containing heterocycle formed by Z$^1$, a 5- or 6-membered ring is preferable. Further, the nitrogen-containing heterocycle is preferably a monocycle or a fused ring having 2 to 8 fusions, more preferably a monocycle or a fused ring having 2 to 4 fusions, and still more preferably a fused ring having 2 or 3 fusions. The nitrogen-containing heterocycle may include a sulfur atom, in addition to a nitrogen atom. In addition, the nitrogen-containing heterocycle may have a substituent. Examples of the substituent include the above-mentioned substituents.

With regard to the details of Formula (SQ), reference can be made to the descriptions in paragraph Nos. 0020 to 0049 of JP2011-208101A, the contents of which are incorporated herein by reference.

Moreover, the cation in Formula (SQ) is present while not being localized as below.

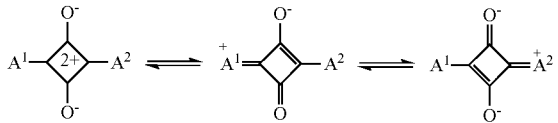

As the squarylium compound, a compound represented by Formula (SQ-1) is preferable.

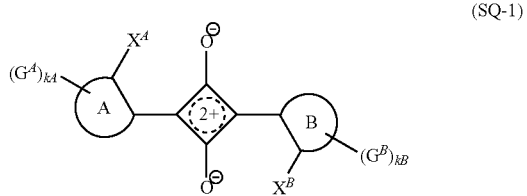

(SQ-1)

The ring A and the ring B each independently represent an aromatic ring.

X$^A$ and X$^B$ each independently represent a substituent.

G$^A$ and G$^B$ each independently represent a substituent.

kA represents an integer of 0 to n$_A$, and kB represents an integer of 0 to n$_B$.

n$_A$ and n$_B$ each represent an integer representing the maximum number of the groups which may be substituted in the ring A or the ring B.

X$^A$ and G$^A$, or X$^B$ and G$^B$ may be bonded to each other to form a ring, and in a case where a plurality of G$^A$'s and a plurality of G$^B$'s are present, G$^A$'s and G$^B$'s may be bonded to each other to form ring structures, respectively.

Examples of the substituent represented by each of G$^A$ and G$^B$ include the substituents described in Formula (SQ) as described above.

Examples of the substituent represented by each of X$^A$ and X$^B$ include the substituents described in Formula (SQ) as described above, and as the substituent, a group having active hydrogen is preferable, —OH, —SH, —COOH, —SO$_3$H, —NR$^{X1}$R$^{X2}$, —NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, and —OH, —SH, or NR$^{X1}$R$^{X2}$ is still more preferable.

R$^{X1}$ and R$^{X2}$ each independently represent a hydrogen atom or a substituent. Examples of the substituent include an alkyl group, an alkenyl group, an alkynyl group, an aryl group, and a heteroaryl group, with the alkyl group being preferable.

The ring A and the ring B each independently represent an aromatic ring. The aromatic ring may be a monocycle or a fused ring. Specific examples of the aromatic ring include a benzene ring, a naphthalene ring, a pentalene ring, an indene ring, an azulene ring, a heptalene ring, an indecene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring, with the benzene ring or the naphthalene ring being preferable. The aromatic ring may be unsubstituted or may have a substituent. Examples of the substituent include the substituents described in Formula (SQ) as described above.

X$^A$ and G$^A$, or X$^B$ and G$^B$ may be bonded to each other to form a ring, and in a case where a plurality of G$^A$'s and G$^B$'s are present, they may be bonded to each other, respectively, to form a ring. The ring is preferably a 5- or 6-membered ring. The ring may be a monocycle or a fused ring. In a case where X$^A$ and G$^A$, or X$^B$ and G$^B$, G$^A$'s, or G$^B$'s are bonded to each other to form a ring, the groups may be directly bonded to each other to form a ring or may be bonded to each other through a divalent linking group selected from the group consisting of an alkylene group, —CO—, —O—, —NH—, —BR—, and a combination thereof to form a ring. It is preferable that X$^A$ and G$^A$, or X$^B$ and G$^B$, G$^A$'s, or G$^B$'s are bonded to each other through —BR— to form a ring. R represents a hydrogen atom or a substituent. Examples of the substituent include the substituents described in Formula (SQ) as described above, and the substituent is preferably an alkyl group or an aryl group.

kA represents an integer of 0 to n$_A$, kB represents an integer of 0 to n$_B$, n$_A$ represents an integer representing the maximum number of G$^A$'s which may be substituted in the ring A, and n$_B$ represents an integer representing the maximum number of G$^B$'s which may be substituted in the ring B. kA and kB are each independently preferably an integer of 0 to 4, more preferably 0 to 2, and particularly preferably 0 or 1.

Examples of the squarylium compound include the compounds described in paragraph Nos. 0044 to 0049 of JP2011-208101A, the contents of which are incorporated herein by reference.

The cyanine compound is preferably a compound represented by Formula (C).

Formula (C)

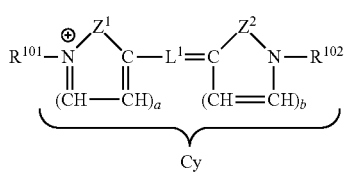

In the formula, $Z^1$ and $Z^2$ are each independently a non-metal atomic group for forming a 5- or 6-membered nitrogen-containing heterocycle which may be fused, $R^{101}$ and $R^{102}$ each independently represent an alkyl group, an alkenyl group, an alkynyl group, an aralkyl group, or an aryl group, $L^1$ represents a methine chain having an odd number of methine groups, a and b each independently represent 0 or 1, in a case where a is 0, a carbon atom and a nitrogen atom are bonded through a double bond; and in a case where b is 0, a carbon atom and a nitrogen atom are bonded through a single bond, and in a case where a site represented by Cy in the formula is a cationic site, $X^1$ represents an anion and c represents the number of $X^1$'s for balancing the charge; in a case where a site represented by Cy in the formula is an anion site, $X^1$ represents a cation, and c represents the number of $X^1$'s for balancing the charge; and in a case where charge of a site represented by Cy in the formula is neutralized in a molecule, c is 0.

In Formula (C), $Z^1$ and $Z^2$ are each independently a non-metal atomic group for forming a 5- or 6-membered nitrogen-containing heterocycle which may be fused. Another heterocycle, aromatic ring, or aliphatic ring may be fused to the nitrogen-containing heterocycle. It is preferable that the nitrogen-containing heterocycle is a 5-membered ring. A structure in which a benzene ring or a naphthalene ring is fused to the 5-membered nitrogen-containing heterocycle is more preferable. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzindolenine ring, an imidazole ring, a benzimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. The nitrogen-containing heterocycle is preferably a quinoline ring, an indolenine ring, a benzindolenine ring, a benzoxazole ring, a benzothiazole ring, or a benzimidazole ring, and particularly preferably an indolenine ring, a benzothiazole ring, or a benzimidazole ring. The nitrogen-containing heterocycle and the ring fused thereto may have a substituent. Examples of the substituent include the substituents described for Formula (SQ).

In Formula (C), $R^{101}$ and $R^{102}$ each independently represent an alkyl group, an alkenyl group, an alkynyl group, an aralkyl group, or an aryl group. These groups may have a substituent or may be unsubstituted. Examples of the substituent include the substituents described for Formula (SQ).

In Formula (C), $L^1$ represents a methine chain having an odd number of methine groups. $L^1$ is preferably a methine chain having 3, 5, or 7 methine groups.

The methine group may have a substituent. It is preferable that the methine group having a substituent is a methine group positioned at the center (meso position). Specific examples of the substituent include the substituents described for Formula (SQ) and a group represented by Formula (a). In addition, two substituents in the methine chain may be bonded to each other to form a 5- or 6-membered ring.

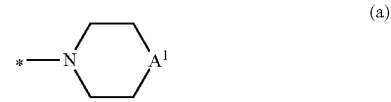

In Formula (a), * represents a linking portion to the methine chain, and $A^1$ represents —O—.

In Formula (C), a and b each independently represent 0 or 1. In a case where a is 0, a carbon atom and a nitrogen atom are bonded through a double bond. In a case where b is 0, a carbon atom and a nitrogen atom are bonded through a single bond. It is preferable that both a and b are 0. In a case where both a and b are 0, Formula (C) is shown as below.

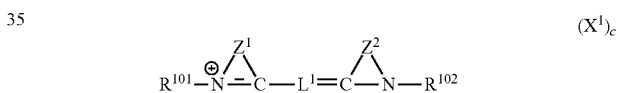

In Formula (C), in a case where a site represented by Cy in the formula is a cationic moiety, $X^1$ represents an anion and c represents the number of $X^1$'s for balancing charge. Examples of the anion include an halide ion ($Cl^-$, $Br^-$, or $I^-$), a para-toluenesulfonate ion, an ethyl sulfate ion, $PF_6^-$, $BF_4^-$, $ClO_4^-$, a tris(halogenoalkylsulfonyl)methide anion (for example; $(CF_3SO_2)_3C^-$), a di(halogenoalkylsulfonyl)imide anion (for example, $(CF_3SO_2)_2N^-$), and a tetracyanoborate anion.

In Formula (C), in a case where a site represented by Cy in the formula is an anionic moiety, $X^1$ represents a cation and c represents the number of $X^1$'s for balancing the charge. Examples of the cation include an alkali metal ion ($Li^+$, $Na^+$, $K^+$, or the like), an alkali earth metal ion ($Mg^{2+}$, $Ca^{2+}$, $Ba^{2+}$, $Sr^{2+}$, or the like), a transition metal ion ($Ag^+$, $Fe^+$, $Co^+$, $Ni^+$, $Cu^{2+}$, $Zn^{2+}$, or the like), other metal ions ($Al^{3+}$ or the like), an ammonium ion, a triethylammonium ion, a tributylammonium ion, a pyridinium ion, a tetrabutylammonium ion, a guanidinium ion, a tetramethylguanidium ion, and a diazabicycloundecenium ion. As the cation, $Na^+$, $K^+$, $Mg^{2+}$, $Ca^{2+}$, $Zn^{2+}$, or the diazabicycloundecenium ion is preferable.

In Formula (C), in a case where a charge of a site represented by Cy is neutralized in a molecule, X' is not present. That is, c is 0.

It is also preferable that the cyanine compound is a compound represented by any of Formulae (C-1) to (C-3).

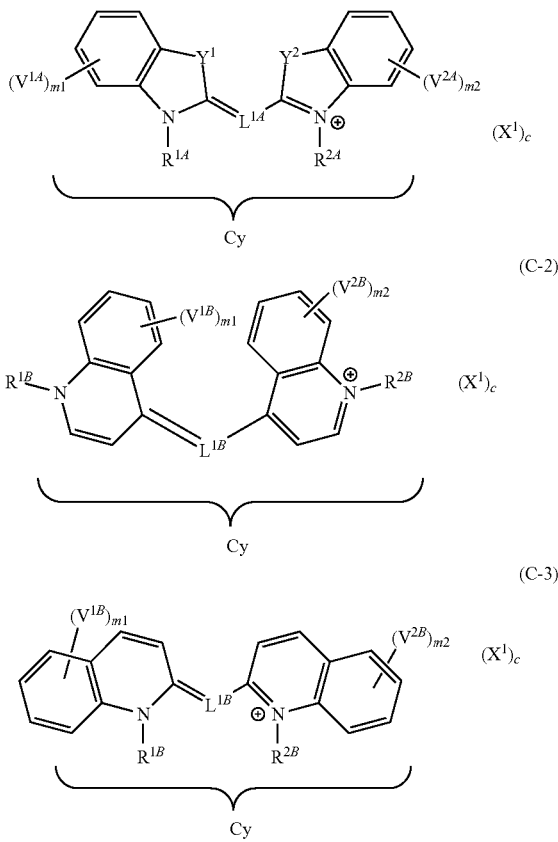

In the formulae, $R^{1A}$, $R^{2A}$, $R^{1B}$, and $R^{2B}$ each independently represent an alkyl group, an alkenyl group, an alkynyl group, an aralkyl group, or an aryl group, $L^{1A}$ and $L^{1B}$ each independently represent a methine chain having an odd number of methine groups, $Y^1$ and $Y^2$ each independently represent —S—, —O—, $NR^{X1}$—, or —$CR^{X2}R^{X3}$—, $R^{X1}$, $R^{X2}$, and $R^{X3}$ each independently represent a hydrogen atom or an alkyl group, $V^{1A}$, $V^{2A}$, $V^{1B}$, and $V^{2B}$ each independently represent a substituent, m1 and m2 each independently represent 0 to 4, in a case where a site represented by Cy in the formulae is a cationic site, $X^1$ represents an anion and c represents the number of $X^1$'s for balancing the charge, in a case where a site represented by Cy in the formulae is an anion site, $X^1$ represents a cation and c represents the number of $X^1$'s for balancing charge, and in a case where charge of a site represented by Cy in the formulae is neutralized in a molecule, $X^1$ is not present.

The groups represented by $R^{1A}$, $R^{2A}$, $R^{1B}$, and $R^{2B}$ have the same definitions as the alkyl group, the alkenyl group, the alkynyl group, the aralkyl group, and the aryl group described for $R^{101}$ and $R^{102}$ of Formula (C), and preferred ranges thereof are also the same.

$Y^1$ and $Y^2$ each independently represent —S—, —O—, —$NR^{X1}$— or —$CR^{X2}R^{X3}$—, with —$NR^{X1}$-being preferable. $R^{X1}$, $R^{X2}$, and $R^{X3}$ each independently represent a hydrogen atom or an alkyl group, with the alkyl group being preferable. The number of carbon atoms of the alkyl group is preferably 1 to 10, more preferably 1 to 5, and particularly preferably 1 to 3. The alkyl group may be in any of linear, branched, and cyclic forms, but is preferably linear or branched, and particularly preferably linear. The alkyl group is particularly preferably a methyl group or an ethyl group.

$L^{1A}$ and $L^{1B}$ each have the same definitions as $L^1$ of Formula (C), and preferred ranges thereof are also the same.

Examples of the substituents represented by $V^{1A}$, $V^{2A}$, $V^{1B}$, and $V^{2B}$ include the substituents described for Formula (SQ).

m1 and m2 each independently represent 0 to 4, and are preferably 0 to 2.

The anion and the cation represented by $X^1$ have the same definitions as the ranges described for $X^1$ of Formula (C), and preferred ranges thereof are also the same.

Examples of the cyanine compound include the compounds described in paragraph Nos. 0044 to 0045 of JP2009-108267A, paragraph Nos. 0026 to 0030 of JP2002-194040A, the compounds described in JP2015-172004A, the compounds described in JP2015-172102A, and the compounds described in JP2008-088426A, the contents of which are incorporated herein by reference.

In the present invention, as the near-infrared absorbing compound, a commercially available product can also be used. Examples of the commercially available product include SDO-C33 (manufactured by Arimoto Chemical Co., Ltd.), EXCOLOR IR-14, EXCOLOR IR-10A, EXCOLOR TX-EX-801B, or EXCOLOR TX-EX-805K (manufactured by Nippon Shokubai Co., Ltd.), Shigenox NIA-8041, Shigenox NIA-8042, Shigenox NIA-814, Shigenox NIA-820, or Shigenox NIA-839 (manufactured by Hakkol Chemical Co., Ltd.), Epolite V-63, Epolite 3801, or Epolight 3036 (manufactured by Epolin Inc.), PRO-JET 825LDI (manufactured by Fujifilm Corporation), NK-3027 or NK-5060 (manufactured by Hayashibara Co., Ltd.), and YKR-3070 (manufactured by Mitsui Chemicals, Inc.).

In a case where the composition for a near-infrared transmitting filter contains a near-infrared absorbing dye, the content of the near-infrared absorbing dye is preferably 1% to 30% by mass with respect to the total solid content of the composition for a near-infrared transmitting filter. The upper limit is preferably 25% by mass or less, and more preferably 20% by mass or less. The lower limit is preferably 3% by mass or more, and more preferably 5% by mass or more. Further, the total amount of the near-infrared absorbing dye and the light shielding material is preferably 35% to 80% by mass of the total solid content of the composition for a near-infrared transmitting filter. The lower limit is preferably 40% by mass or more, more preferably 45% by mass or more, still more preferably 50% by mass or more, and particularly preferably 55% by mass or more. The upper limit is preferably 75% by mass or less, and more preferably 70% by mass or less. Further, the content of the near-infrared absorbing dye in the total amount of the near-infrared absorbing dye and the light shielding material is preferably 5% to 40% by mass. The upper limit is preferably 30% by mass or less, and more preferably 25% by mass or less. The lower limit is preferably 10% by mass or more, and more preferably 15% by mass or more.

In the composition for a near-infrared transmitting filter, the near-infrared absorbing dye may be used singly or in combination of two or more kinds thereof. In a case where two or more kinds of the near-infrared absorbing dyes are used in combination, the total amount thereof is preferably within the range.

<<Other Near-Infrared Absorber>>

The composition for a near-infrared transmitting filter can contain another near-infrared absorber, in addition to the near-infrared absorbing dye. Examples of such another near-infrared absorber include inorganic particles. The shape of the inorganic particles is not particularly limited and may have a sheet shape, a wire shape, or a tube shape, irrespective of whether or not the shape is spherical or non-spherical. As the inorganic particles, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. In addition, as the inorganic particles, a tungsten oxide-based compound can also be used. The tungsten oxide-based compound is preferably cesium tungsten oxide. With regard to the details of the tungsten oxide-based compound, reference can be made to the description in paragraph No. 0080 of JP2016-006476A, the contents of which are incorporated herein by reference.

In a case where the composition for a near-infrared transmitting filter contains another near-infrared absorber, the content of such the near-infrared absorber is preferably 1% to 30% by mass with respect to the total solid content of the composition for a near-infrared transmitting filter. The upper limit is preferably 20% by mass or less, and more preferably 10% by mass or less. The lower limit is preferably 3% by mass or more, and more preferably 5% by mass or more.

<<Curable Compound>>

The composition for a near-infrared transmitting filter preferably contains a curable compound. As the curable compound, a known compound which can be crosslinked by a radical, an acid, or heat can be used. Examples of the curable compound include a compound having a group having an ethylenically unsaturated bond and a compound having a cyclic ether group. Examples of the group having an ethylenically unsaturated bond include a vinyl group, a (meth)allyl group, and a (meth)acryloyl group. Examples of the cyclic ether group include an epoxy group and an oxetanyl group. In the present invention, the curable compound is preferably a radically polymerizable compound or a cationically polymerizable compound, and more preferably the radically polymerizable compound.

The content of the curable compound is preferably 0.1% to 40% by mass with respect to the total solid content of the composition for a near-infrared transmitting filter. The lower limit is, for example, preferably 0.5% by mass or more, and more preferably 1% by mass or more. The upper limit is, for example, preferably 30% by mass or less, and more preferably 20% by mass or less. The curable compounds may be used singly or in combination of two or more kinds thereof. In a case where two or more kinds of the curable compounds are used in combination, the total amount thereof is preferably within the range.

(Radically Polymerizable Compound)

The radically polymerizable compound is not particularly limited as long as it is a compound that is polymerizable by the action of a radical. The radically polymerizable compound is preferably a polymerizable compound having one or more groups having an ethylenically unsaturated bond, more preferably a compound having two or more groups having an ethylenically unsaturated bond, and still more preferably a compound having three or more groups having an ethylenically unsaturated bond. The upper limit of the number of the groups having an ethylenically unsaturated bond is, for example, preferably 15 or less, and more preferably 6 or less. Examples of the group having an ethylenically unsaturated bond include a vinyl group, a styryl group, an allyl group, a methallyl group, and a (meth)acryloyl group, with the (meth)acryloyl group being preferable. The radically polymerizable compound is preferably a trifunctional to pentadecafunctional (meth)acrylate compound, and more preferably a trifunctional to hexafunctional (meth)acrylate compound.

The radically polymerizable compound may be in any form of a monomer and a polymer, with the monomer being preferable. The monomer type of the radically polymerizable compound preferably has a molecular weight of 200 to 3,000. The upper limit of the molecular weight is preferably 2,500 or less, and more preferably 2,000 or less. The lower limit of the molecular weight is preferably 250 or more, and more preferably 300 or more.

With regard to examples of the radically polymerizable compound, reference can be made to the descriptions in paragraph Nos. 0033 and 0034 of JP2013-253224A, the contents of which are incorporated herein by reference. Examples of the polymerizable compound include ethyleneoxy-modified pentaerythritol tetraacrylate (as a commercially available product, NK ESTER ATM-35E manufactured by Shin-Nakamura Chemical Co., Ltd.); dipentaerythritol triacrylate (as a commercially available product, KAYARAD D-330 manufactured by Nippon Kayaku Co., Ltd.); dipentaerythritol tetraacrylate (as a commercially available product, KAYARAD D-320 manufactured by Nippon Kayaku Co., Ltd.); dipentaerythritol penta(meth)acrylate (as a commercially available product, KAYARAD D-310 manufactured by Nippon Kayaku Co., Ltd.); dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.); and a compound having a structure in which the (meth)acryloyl group is bonded through an ethylene glycol and/or a propylene glycol residue. In addition, oligomers of the above-described examples can also be used. Further, with regard to this, the descriptions in paragraph Nos. 0034 to 0038 of JP2013-253224A, the contents of which are incorporated herein by reference. Examples of the compound include the polymerizable monomers described in paragraph No. 0477 of JP2012-208494A (paragraph No. 0585 of the corresponding US2012/0235099A), the contents of which are incorporated herein by reference. In addition, diglycerin ethylene oxide (EO)-modified (meth)acrylate (as a commercially available product, M-460 manufactured by Toagosei Co., Ltd.); pentaerythritol tetraacrylate (A-TMMT manufactured by Shin-Nakamura Chemical Co., Ltd.), or 1,6-hexanediol diacrylate (KAYARAD HDDA manufactured by Nippon Kayaku Co., Ltd.) is also preferable. Oligomers of the above-described examples can also be used. Examples thereof include RP-1040 (manufactured by Nippon Kayaku Co., Ltd.). In addition, ARONIX M-350 and TO-2349 (manufactured by Toagosei Co., Ltd.) can also be used as the radically polymerizable compound.

The radically polymerizable compound may have an acid group such as a carboxyl group, a sulfonic acid group, and a phosphoric acid group. Examples of the radically polymerizable compound having an acid group include an ester of an aliphatic polyhydroxy compound with an unsaturated carboxylic acid. The radically polymerizable compound having an acid group is preferably a polymerizable compound in which a non-aromatic carboxylic acid anhydride is reacted with an unreacted hydroxyl group of the aliphatic polyhydroxy compound to make an acid group bonded thereto. It is particularly preferable that in this ester, the aliphatic polyhydroxy compound is pentaerythritol and/or dipentaerythritol. Examples of a commercially available product thereof include ARONIX series M-305, M-510, and M-520, which are polybasic acid-modified acryl oligomers manufactured by Toagosei, Co., Ltd. The acid value of the polymerizable compound having an acid group is preferably 0.1 to 40 mgKOH/g. The lower limit is preferably 5 mgKOH/g or more. The upper limit is preferably 30 mgKOH/g or less.

It is also preferable that the radically polymerizable compound is a compound having a caprolactone structure. The radically polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, and trimethylolmelamine. With regard to examples of the polymerizable compound having a caprolactone structure, reference can be made to the descriptions in paragraph Nos. 0042 to 0045 of JP2013-253224A, the contents of which are incorporated herein by reference. Examples of the polymerizable compound having a caprolactone structure include DPCA-20, DPCA-30, DPCA-60, DPCA-120, and the like which are commercially available as KAYARAD DPCA series manufactured by Nippon Kayaku Co., Ltd., SR-494 manufactured by Sartomer, which is a tetrafunctional acrylate having four ethyleneoxy chains, and TPA-330 which is a trifunctional acrylate having three isobutyleneoxy chains.

As the radically polymerizable compound, the urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable. In addition, the addition-polymerizable compounds having an amino structure or a sulfide structure in the molecules thereof described in JP1988-277653A (JP-S63-277653A), JP1988-260909A (JP-S63-260909A), or JP1989-105238A (JP-H01-105238A) can be used. Examples of a commercially available product thereof include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.). In addition, it is also preferable that 8UH-1006 or 8UH-1012 (manufactured by Taisei Fine Chemical Co., Ltd.) is used as the radically polymerizable compound.

In a case where the composition for a near-infrared transmitting filter contains a radically polymerizable compound, the content of the radically polymerizable compound is preferably 0.1% to 40% by mass with respect to the total solid content of the composition for a near-infrared transmitting filter. The lower limit is, for example, preferably 0.5% by mass or more, and more preferably 1% by mass or more. The upper limit is preferably for example, 30% by mass or less, and more preferably 20% by mass or less. The radically polymerizable compounds may be used singly or in combination of two or more kinds thereof. In a case where two or more kinds of the radically polymerizable compounds are used in combination, the total amount thereof is preferably within the range.

(Cationically Polymerizable Compound)

Examples of the cationically polymerizable compound include a compound having a cationically polymerizable group. Examples of the cationically polymerizable group include a cyclic ether group such as an epoxy group and an oxetanyl group, and an unsaturated carbon double bond group such as a vinyl ether group and an isobutene group. The cationically polymerizable compound is preferably a compound having a cyclic ether group, and more preferably a compound having an epoxy group.

Examples of the compound having an epoxy group include a compound having one or more epoxy groups within one molecule, and the compound is preferably a compound having two or more epoxy groups within one molecule. The number of epoxy groups contained in one molecule of the compound is preferably 1 to 100. The upper limit of the number of the epoxy groups can be, for example, preferably 10 or less, or 5 or less. The lower limit of the number of the epoxy groups is preferably 2 or more.

The compound having an epoxy group may be a low molecular compound (for example, a compound having a molecular weight of less than 2,000 and a compound having a molecular weight of less than 1,000), or may be a high molecular compound (macromolecule) (for example, a compound having a molecular weight of 1,000 or more, and in a case of a polymer, a compound having a weight-average molecular weight of 1,000 or more). The weight-average molecular weight of the compound having an epoxy group is preferably 200 to 100,000, and more preferably 500 to 50,000. The upper limit of the weight-average molecular weight is preferably 10,000 or less, more preferably 5,000 or less, and still more preferably 3,000 or less.

In a case where the compound having an epoxy group is a low molecular compound, examples of the compound include a compound represented by Formula (EP1).

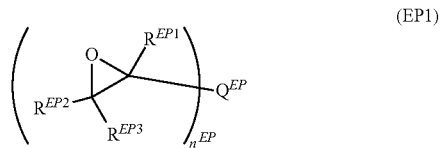

In Formula (EP1), $R^{EP1}$ to $R^{EP3}$ each represent a hydrogen atom, a halogen atom, or an alkyl group, in which the alkyl group may have a cyclic structure or may have a substituent. $R^{EP1}$ and $R^{EP2}$, or $R^{EP2}$ and $R^{EP3}$ may be bonded with each other to form a cyclic structure. $Q^{EP}$ represents a single bond or an $n^{EP}$-valent organic group. $R^{EP1}$ to $R^{EP3}$ may also be bonded to $Q^{EP}$ to form a cyclic structure. $n^{EP}$ represents an integer of 2 or more, preferably 2 to 10, and more preferably 2 to 6. Incidentally, in a case where $Q^{EP}$ is a single bond, $n^{EP}$ is 2.

With reference to the details of $R^{EP1}$ to $R^{EP3}$, or $Q^{EP}$, reference can be made to the descriptions in paragraph Nos. 0087 to 0088 of JP2014-089408A, the contents of which are incorporated herein by reference. Specific examples of compound represented by Formula (EP1) include the compounds described in paragraph 0090 of JP2014-089408A and the compounds described in paragraph No. 0151 of JP2010-054632A, the contents of which are incorporated herein by reference.

As a low molecular compound, a commercially available product can also be used. Examples thereof include ADEKA GLYCIROL ED Series (for example, ADEKA GLYCIROL ED ED-505) manufactured by ADEKA Corporation, and EPOLEAD Series (for example, EPOLEAD GT401) manufactured by Daicel Chemical Industries, Ltd.

As the compound having an epoxy group, an epoxy resin can be preferably used. Examples of the epoxy resin include an epoxy resin which is a glycidyl etherified product of a phenolic compound, an epoxy resin which is a glycidyl etherified product of any of various novolac resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating a halogenated phenol, a condensate of a silicon compounds having an epoxy group and another silicon compound, and a copolymer of a polymerizable unsaturated compound having an epoxy group and another polymerizable unsaturated compound.

The epoxy equivalent of the epoxy resin is preferably 310 to 3,300 g/eq, more preferably 310 to 1,700 g/eq, and still more preferably 310 to 1,000 g/eq.

As the epoxy resin, a commercially available product can also be used. Examples thereof include EHPE3150 (manufactured by Daicel Chemical Industries, Ltd.), EPICLON N-695 (manufactured by DIC Corporation), MARPROOF G-0150M, G-0105SA, G-0130SP, G-0250SP, G-1005S, G-1005SA, G-1010S, G-2050M, G-01100, and G-01758 (all of which are manufactured by NOF Corporation, epoxy group containing polymer).

In the present invention, as the compound having an epoxy group, the compounds described in paragraph Nos. 0034 to 0036 of JP2013-011869A, paragraph Nos. 0147 to 0156 of JP2014-043556A, or paragraph Nos. 0085 to 0092 of JP2014-089408A can also be used. The contents of the publications are incorporated herein by reference.

In a case where the composition for a near-infrared transmitting filter contains a cationically polymerizable compound, the content of the cationically polymerizable compound is preferably 0.1% to 40% by mass with respect to the total solid content of the composition for a near-infrared transmitting filter. The lower limit is, for example, preferably 0.5% by mass or more, and more preferably 1% by mass or more. The upper limit is preferably for example, 30% by mass or less, and more preferably 20% by mass or less. The cationically polymerizable compounds may be used singly or in combination of two or more kinds thereof. In a case where two or more kinds of the cationically polymerizable compounds are used in combination, the total amount thereof is preferably within the range.

In addition, in a case where the composition for a near-infrared transmitting filter include the radically polymerizable compound and the cationically polymerizable compound, the mass ratio of both the compounds is preferably radically polymerizable compound:cationically polymerizable compound=100:1 to 100:400, and more preferably 100:1 to 100:100.

<<Photoinitiator>>

The composition for a near-infrared transmitting filter can contain a photoinitiator. Examples of the photoinitiator include a photoradical polymerization initiator and a photocationic polymerization initiator. The photoinitiator is preferably selected depending on the type of a curable compound. In a case where a radically polymerizable compound is used as the curable compound, a photoradical polymerization initiator is preferably used as the photoinitiator. Further, in a case where a cationically polymerizable compound is used as the curable compound, it is preferable that a photocationic polymerization initiator is used as the photoinitiator. The photoinitiator is not particularly limited and can be appropriately selected from known photoinitiators. For example, a compound having photosensitivity with respect to light rays in a range from an ultraviolet region to visible light region is preferable.

The content of the photoinitiator is preferably 0.1% to 50% by mass, more preferably 0.5% to 30% by mass, and still more preferably 1% to 20% by mass, with respect to the total solid content of the composition for a near-infrared transmitting filter. In a case where the content of the photoinitiator is within the range, better sensitivity and pattern forming properties are obtained. The composition for a near-infrared transmitting filter may include only one kind or two or more kinds of the photoinitiators. In a case where two or more kinds of the photoinitiators are included, the total amount thereof is preferably within the range.

(Photoradical Polymerization Initiator)

Examples of the photoradical polymerization initiator include halogenated hydrocarbon derivatives (for example, a compound having a triazine skeleton and a compound having an oxadiazole skeleton), an acylphosphine compound, hexaaryl biimidazole, an oxime compound, an organic peroxide, a thio compound, a ketone compound, an aromatic onium salt, an α-hydroxyketone compound, and an α-aminoketone compound. From the viewpoint of the exposure sensitivity, a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an aminoacetopheno en compound, a cyclopentadiene-benzene-iron complex, a halomethyl oxadiazole compound, and a 3-aryl-substituted coumarin compound are preferable, a compound selected from an oxime compound, the α-hydroxyketone compound, the α-aminoketone compound, and the acylphosphine compound is more preferable, and the oxime compound is still more preferable. With regard to the photopolymerization initiator, reference can be made to the description in paragraphs 0065 to 0111 of JP2014-130173A, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF). Examples of a commercially available product of the α-aminoketone compound include IRGACURE-907, IRGACURE-369, IRGACURE-379, and IRGACURE-379EG (all of which are manufactured by BASF). Examples of a commercially available product of the acylphosphine compound include IRGACURE-819 and DAROCUR-TPO (both of which are manufactured by BASF).

As the oxime compound, the compounds described in JP2001-233842A, the compounds described in JP2000-080068A, the compounds described in JP2006-342166A, the compounds described in JP2016-021012A, or the like can be used. In the present invention, examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Other examples of the oxime compound include the compounds described in J. C. S. Perkin II (1979), pp. 1653 to 1660, J. C. S. Perkin II (1979), pp. 156 to 162, Journal of Photopolymer Science and Technology (1995), pp. 202 to 232, each of the publications of JP2000-066385A, JP2000-080068A, JP2004-534797A, and JP2006-342166A. As a commercially available product of the oxime compound, IRGACURE-OXE01, IRGACURE-OXE02, IRGACURE-OXE03, and IRGACURE-OXE04 (all of which are manufactured by BASF) are also suitably used. In addition, TRONLY TR-PBG-304 (manufactured by CHANGZHOU Changzhou Tronly New Electronic Materials Co., Ltd.), or ADEKA OPTOMER N-1919 (manufactured by ADEKA Corporation, the photopolymerization initiator 2 described in JP2012-014052A) can also be used. In addition, it is also preferable that a compound having no colorability or a compound having high transparency and hardly changing the colors of the other components is used as the oxime compound. Examples of a commercially available product of the compound include ADEKA ARKLS NCI-730, NCI-831, and NCI-930 (all manufactured by ADEKA Corporation).

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A, each content of which is incorporated herein by reference.

In the present invention, an oxime compound having a nitro group can also be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

(C-1)
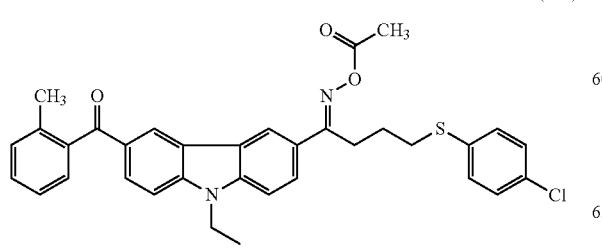

(C-2)
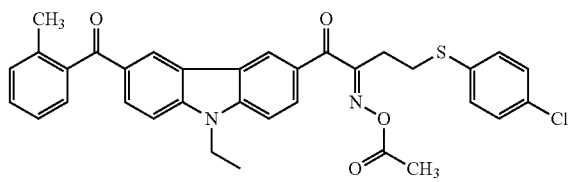

(C-3)
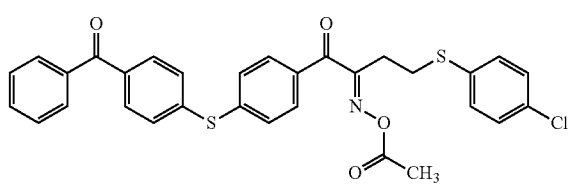

(C-4)
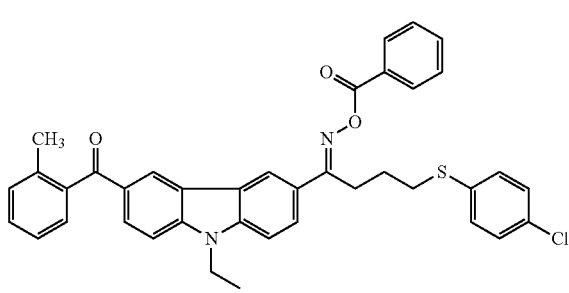

(C-5)
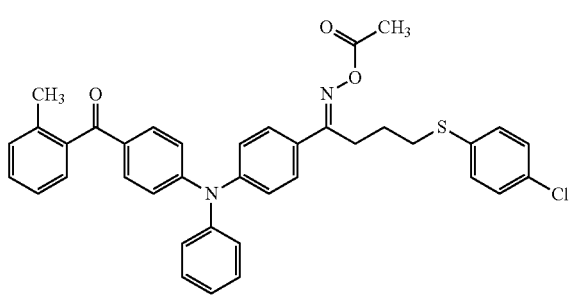

(C-6)
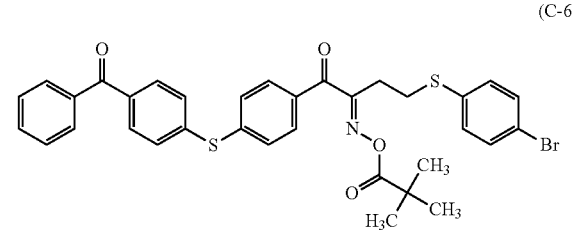

(C-7)
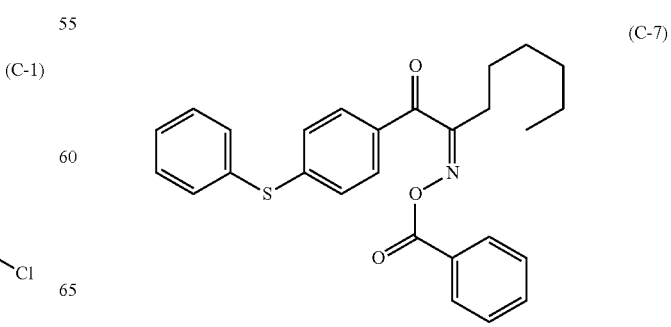

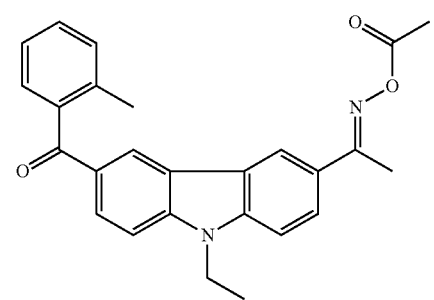
(C-8)

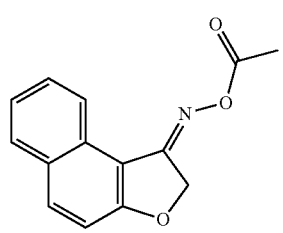
(C-9)

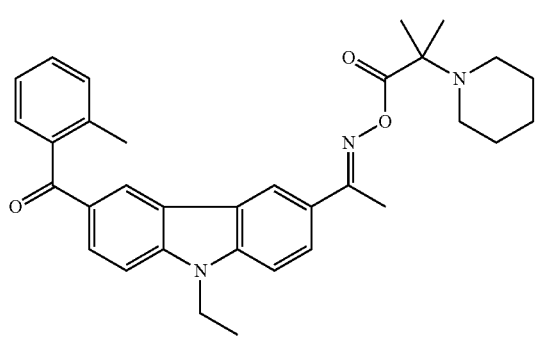
(C-10)

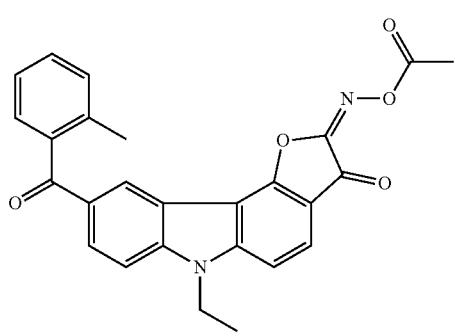
(C-11)

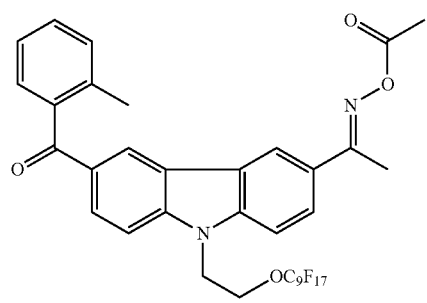
(C-12)

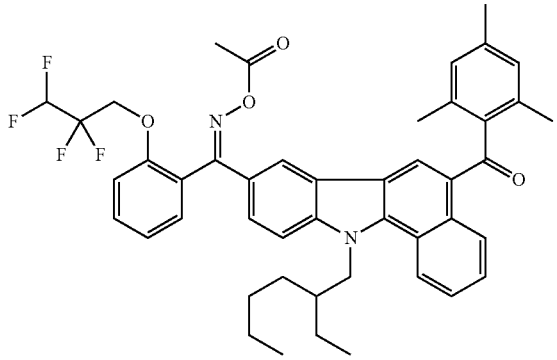
(C-13)

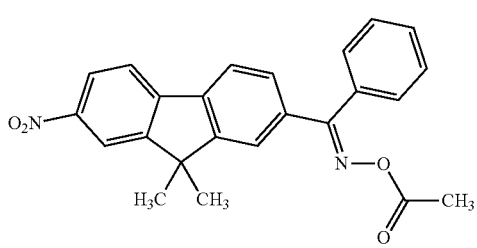
(C-14)

As the oxime compound, the compound having the maximum absorption wavelength in a wavelength range of 350 nm to 500 nm is preferable, the compound having the maximum absorption wavelength in a wavelength range of 360 nm to 480 nm is more preferable. Further, the oxime compound is preferably a compound having high absorbances at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000.

The molar light absorption coefficient of the compound can be measured using a known method, but specifically, it is preferably measured, for example, by means of a spectrophotometer (Cary-5 spectrophotometer manufactured by Varian) at a concentration of 0.01 g/L using an ethyl acetate solvent.

It is also preferable that the photopolymerization initiator includes an oxime compound and an α-aminoketone compound. By using the oxime compound and the α-aminoketone compound in combination, the developability is improved and a pattern having excellent rectangularity is likely to be formed. In a case where the oxime compound and the α-aminoketone compound are used in combination, the content of the α-aminoketone compound is preferably 50 to 600 parts by mass, and more preferably 150 to 400 parts by mass, with respect to 100 parts by mass of the oxime compound.

The content of the photopolymerization initiator is preferably 0.1% to 50% by mass, more preferably 0.5% to 30% by mass, and still more preferably 1% to 20% by mass, with respect to the total solid content of the composition for a near-infrared transmitting filter. In a case where the content of the photopolymerization initiator is within the range, the developability is good. The composition for a near-infrared transmitting filter may include only one kind or two or more kinds of the photopolymerization initiators. In a case where two or more kinds of the photopolymerization initiators are included, the total amount thereof is preferably within the range.

(Photocationic Polymerization Initiator)

Examples of the photocationic polymerization initiator include a photoacid generator. Examples of the photoacid generator include an onium salt compound such as a diazonium salt, a phosphonium salt, a sulfonium salt, and an iodonium salt, and a sulfonate compound such as imidosulfonate, oxime sulfonate, diazodisulfone, disulfone, and o-nitrobenzyl sulfonate. With regard to the details of the photocationic polymerization initiator, reference can be made to the descriptions in paragraph Nos. 0139 to 0214 of JP2009-258603A, the contents of which are incorporated herein by reference.

The content of the photocationic polymerization initiator is preferably 0.1% to 50% by mass, more preferably 0.5% to 30% by mass, and still more preferably 1% to 20% by mass, with respect to the total solid content of the composition for a near-infrared transmitting filter. In a case where the content of the photopolymerization initiator is within the range, better sensitivity and pattern forming properties are obtained. The composition for a near-infrared transmitting filter may include only one kind or two or more kinds of the photopolymerization initiators. In a case where two or more kinds of the photopolymerization initiators are included, the total amount thereof is preferably within the range.

The composition for a near-infrared transmitting filter preferably contains a resin. The resin is blended in, for example, an application for dispersing a pigment and the like in a composition or an application as a binder. Incidentally, a resin which is used for dispersing a pigment and the like in a composition is also referred to as a dispersant. However, such uses of the resin are only exemplary, and the resin can also be used for other purposes, in addition to such uses.

The weight-average molecular weight (Mw) of the resin is preferably 2,000 to 2,000,000. The upper limit is preferably 1,000,000 or less, and more preferably 500,000 or less. The lower limit is preferably 3,000 or more, and more preferably 5,000 or more.

Examples of the resin include a (meth)acrylic resin, an epoxy resin, an ene-thiol resin, a polycarbonate resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. These resins may be used singly or as a mixture of two or more kinds thereof. As the cyclic olefin resin, a norbornene resin can be preferably used from the viewpoint of improvement of heat resistance. Examples of a commercially available product of the norbornene resin include ARTON Series manufactured by JSR Corporation (for example, ARTON F4520). Further, as the resin, the resins described in Examples of WO2016/088645A can also be used. Further, a resin having a repeating unit having a group having an ethylenically unsaturated bond in a side chain can also be used as the resin. Examples of the group having an ethylenically unsaturated bond include a (meth)acryloyl group. In addition, the main chain of the repeating unit and the group having an ethylenically unsaturated bond are preferably bonded through a divalent linking group having an alicyclic structure.

In the present invention, a resin having an acid group is preferably used as the resin. According to this aspect, it is easy to form a pattern having excellent rectangularity. Examples of the acid group include a carboxyl group, a phosphoric acid group, a sulfo group, and a phenolic hydroxyl group, with the carboxyl group being preferable.

The resin having an acid group may also be used as, for example, an alkali-soluble resin.

The resin having an acid group is preferably a polymer having a carboxyl group in a side chain thereof, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as a novolac type resin, or the like; an acidic cellulose derivative having a carboxyl group in a side chain thereof; and a product obtained by adding an acid anhydride to a polymer having a hydroxyl group. In particular, a copolymer of a (meth)acrylic acid and another monomer which is copolymerizable therewith is preferable as the alkali-soluble resin. Examples of such the other monomer which is copolymerizable with the (meth)acrylic acid include alkyl (meth)acrylate, aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate; examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer; and examples of the N-position-substituted maleimide monomer disclosed in JP1998-300922A (JP-H10-300922A) include N-phenylmaleimide and N-cyclohexylmaleimide. Further, such the other monomer which is copolymerizable with a (meth)acrylic acid may be used singly or in combination of two or more kinds thereof.

The resin having an acid group may further have a polymerizable group. Examples of the polymerizable group include an allyl group, a methallyl group and a (meth)acryloyl group. Examples of a commercially available product thereof include DIANAL NR Series (manufactured by Mitsubishi Rayon Co., Ltd.), Photomer 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), Ebecryl 3800 (manufactured by Daicel-UCB Co., Ltd.), and ACRYCURE RD-F8 (manufactured by Nippon Shokubai Co., Ltd.).

As the resin having an acid group, a benzyl (meth)acrylate/(meth)acrylic acid copolymer, a benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. Further, copolymers obtained by copolymerizing 2-hydroxyethyl (meth)acrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can also be preferably used.

It is also preferable that the resin having an acid group is a polymer including a repeating unit derived from a monomer component including a compound represented by Formula (ED1) and/or a compound represented by Formula (ED2) (these compounds are hereinafter also referred to as an "ether dimer" in some cases).

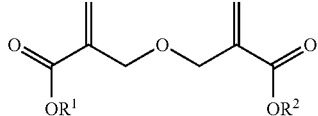
(ED1)

In Formula (ED1), $R^1$ and $R^2$ each independently represent a hydrogen atom, or a hydrocarbon group having 1 to 25 carbon atoms, which may have a substituent.

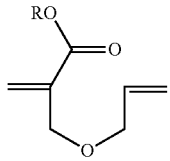
(ED2)

In Formula (ED2), R represents a hydrogen atom or an organic group having 1 to 30 carbon atoms. With regard to the specific examples of Formula (ED2), reference can be made to the descriptions in JP2010-168539A.

With regard to the specific examples of the ether dimer, reference can be made to paragraph No. 0317 of JP2013-029760A, the contents of which are incorporated herein by reference. These ether dimers may be used singly or in combination of two or more kinds thereof.

The resin having an acid group may include a repeating unit derived from a compound represented by Formula (X).

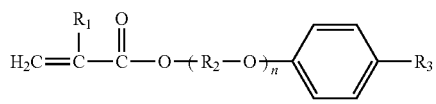
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms, which may contain a benzene ring. n represents an integer of 1 to 15.

With regard to the resin having an acid group, reference can be made to the descriptions in paragraph Nos. 0558 to 0571 of JP2012-208494A (paragraph Nos. 0685 to 0700 of the corresponding US2012/0235099A) and the descriptions in paragraph Nos. 0076 to 0099 of JP2012-198408A, the contents of which are incorporated herein by reference. In addition, as the resin having an acid group, a commercially available product can also be used. Examples of the commercially available product include FF-426 (manufactured by Fujikura Kasei Co., Ltd.).

The acid value of the resin having an acid group is preferably 30 to 200 mgKOH/g. The lower limit is preferably 50 mgKOH/g or more, and more preferably 70 mgKOH/g or more. The upper limit is preferably 150 mgKOH/g or less, and more preferably 120 mgKOH/g or less.

Examples of the resin having an acid group include resins having the following structures. In the following structural formulae, Me represents a methyl group.

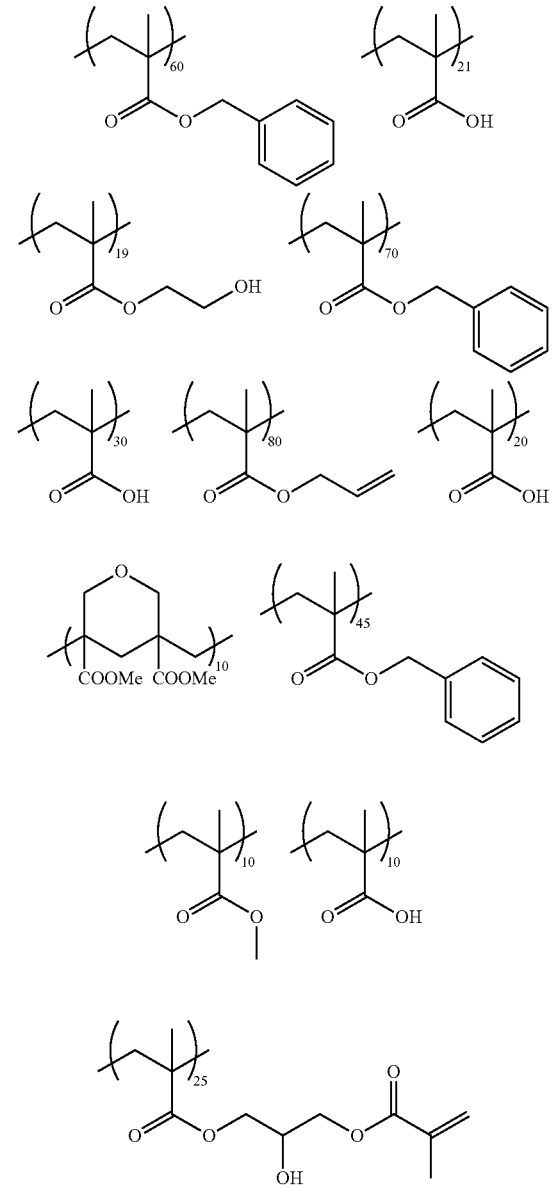

The composition for a near-infrared transmitting filter can also include a resin as the dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The dispersant (acidic resin) is preferably a resin in which the amount of the acid group occupies 70% by mole or more in a case where the total amount of the acid group and the basic group is 100% by mole, and more preferably a resin consisting substantially of only an acid group. The acid group contained in the acidic dispersant (acidic resin) is preferably a carboxyl group. The acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group occupies 50% by mole or more in a case where the total amount of the acid group and the basic group is 100% by mole. The basic group contained in the basic dispersant is preferably an amino group.

The resin which is used as the dispersant preferably includes a repeating unit having an acid group. By incorporating the repeating unit having an acid group into the resin used as the dispersant, residues generated in the underlying substrate of pixels upon formation of a pattern by photolithography can further be reduced.

It is also preferable that the resin used as the dispersant is a graft copolymer. Since the graft copolymer has affinity with a solvent due to its the graft chain, it is excellent in dispersibility of a pigment and dispersion stability after curing. With regard to the details of the graft copolymer, reference can be made to the descriptions in paragraph Nos. 0025 to 0094 of JP2012-255128A, the contents of which are incorporated herein by reference. Further, specific examples of the graft copolymer include the following copolymers. The following resins are also resins having an acid group (alkali-soluble resins). In addition, examples of the graft copolymer include the resins described in paragraph Nos. 0072 to 0094 of JP2012-255128A, the contents of which are incorporated herein by reference.

Furthermore, in the present invention, it is also preferable that the resin (dispersant) uses an oligoimine-based dispersant including a nitrogen atom at at least one of a main chain or a side chain. As the oligoimine-based dispersant, a resin having a side chain including a repeating unit having a partial structure X having a functional group with a pKa of 14 or less and a side chain including a side chain Y having 40 to 10,000 atoms, and having a basic nitrogen atom in at least one of the main chain or the side chain is preferable. The basic nitrogen atom is not particularly limited as long as it is a nitrogen atom exhibiting basicity. With regard to the oligoimine-based dispersant, reference can be made to the descriptions in paragraph Nos. 0102 to 0166 of JP2012-255128A, the contents of which are incorporated herein by reference. Further, as the oligoimine-based dispersant, the resins described in paragraph Nos. 0168 to 0174 of JP2012-255128A can be used.

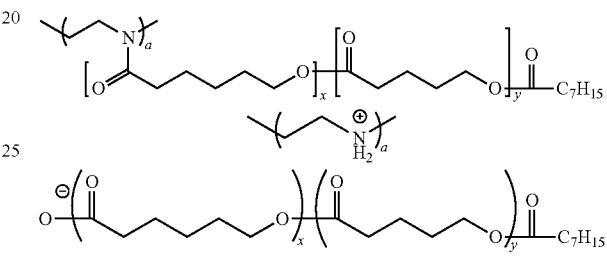

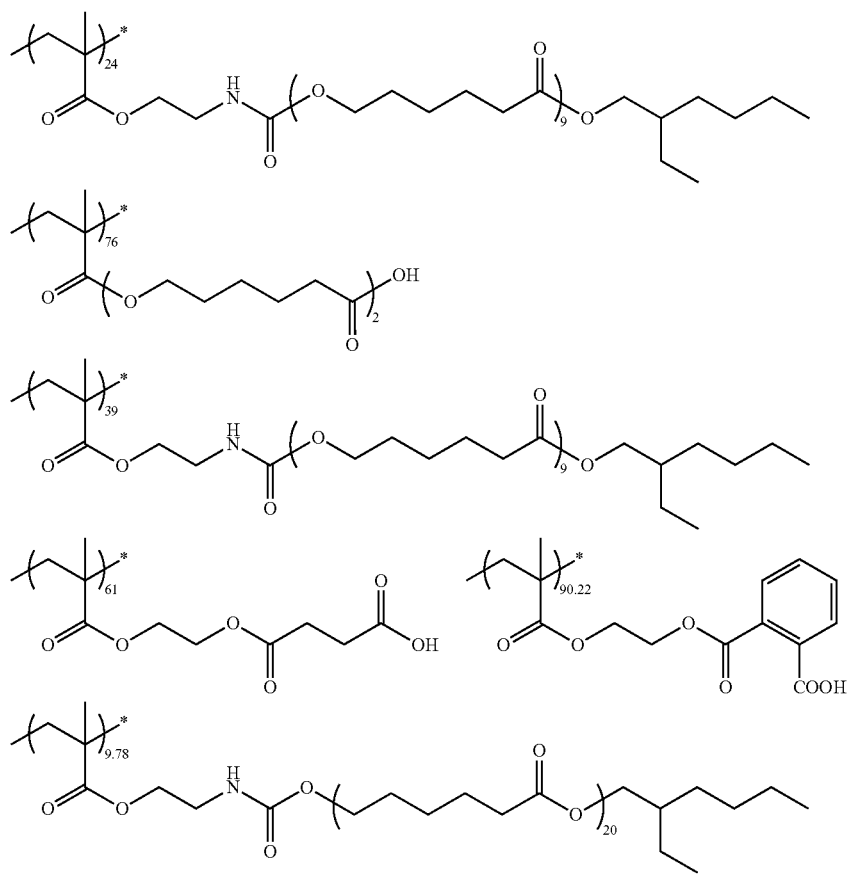

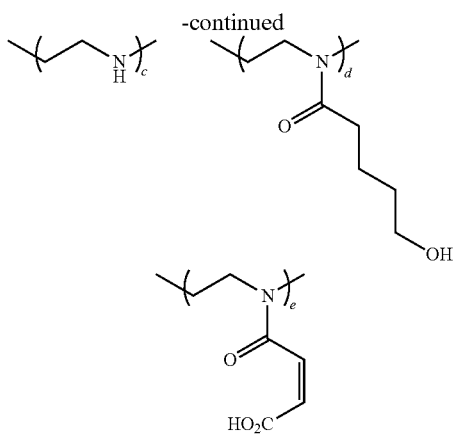

a/b/c/d/e = 36/4/35/1/24 (mol %)
x = 48 y = 12

The dispersant is also available as a commercially available product, and specific examples thereof include Disperbyk-111 (manufactured by BYK Chemie). Further, the pigment dispersant described in paragraph Nos. 0041 to 0130 of JP2014-130338A, the contents of which are incorporated herein by reference, can also be used. Further, the above-mentioned resin having an acid group or the like can also be used as the dispersant.

In a case where the composition for a near-infrared transmitting filter contains a resin, the content of the resin is preferably 14% to 70% by mass with respect to the total solid content of the composition for a near-infrared transmitting filter. The lower limit is preferably 17% by mass or more, and more preferably 20% by mass or more. The upper limit is preferably 56% by mass or less, and more preferably 42% by mass or less.

In a case where the composition for a near-infrared transmitting filter includes a resin having an acid group, the content of the resin having an acid group is preferably 14% to 70% by mass with respect to the total solid content of the composition for a near-infrared transmitting filter. The lower limit is preferably 17% by mass or more, and more preferably 20% by mass or more. The upper limit is preferably 56% by mass or less, and more preferably 42% by mass or less.

In a case where the composition for a near-infrared transmitting filter includes a radically polymerizable compound and a resin, the mass ratio of the radically polymerizable compound to the resin is preferably radically polymerizable compound/resin=0.4 to 1.4. The lower limit of the mass ratio is preferably 0.5 or more, and more preferably 0.6 or more. The upper limit of the mass ratio is preferably 1.3 or less, and more preferably 1.2 or less. In a case where the mass ratio is within the range, a pattern having more excellent rectangularity can be formed.

In addition, the mass ratio of the radically polymerizable compound to the resin having an acid group is preferably radically polymerizable compound/resin having an acid group=0.4 to 1.4. The lower limit of the mass ratio is preferably 0.5 or more, and more preferably 0.6 or more. The upper limit of the mass ratio is preferably 1.3 or less, and more preferably 1.2 or less. In a case where the mass ratio is within the range, a pattern having more excellent rectangularity can be formed.

<<Pigment Derivative>>

The composition for a near-infrared transmitting filter can further contain a pigment derivative. Examples of the pigment derivative include a compound having a structure in which a part of a pigment is substituted with an acidic group, a basic group, a phthalimidomethyl group, or the like. As the pigment derivative, a compound represented by Formula (B1) is preferable.

In Formula (B1), P represents a dye structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L's and a plurality of X's may be the same as or different from each other, and in a case where n represents 2 or more, a plurality of X's may be the same as or different from each other.

In Formula (B1), P represents a dye structure, and is preferably at least one selected from a pyrrolopyrrole dye structure, a diketopyrrolopyrroles dye structure, a quinacridone dye structure, an anthraquinone dye structure, a dianthraquinone dye structure, a benzoisoindole dye structure, a thiazine indigo dye structure, an azo dye structure, a quinophthalone dye structure, a phthalocyanine dye structure, a naphthalocyanine dye structure, a dioxazine dye structure, a perylene dye structure, a perinone dye structure, a benzimidazolone dye structure, a benzothiazole dye structure, a benzimidazole dye structure, or a benzoxazole dye structure, more preferably at least one selected from a pyrrolopyrrole dye structure, a diketopyrrolopyrroles dye structure, a quinacridone dye structure, or a benzimidazolone dye structure, and still more preferably a pyrrolopyrrole dye structure.

In Formula (B1), L represents a single bond or a linking group. The linking group is preferably a group formed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

In Formula (B1), X represents an acid group, a basic group, a group having a salt structure, or a phthalimidomethyl group, with the acid group or the basic group being preferable. Examples of the acid group include a carboxyl group and a sulfo group. Examples of the basic group include an amino group.

Examples of the pigment derivative include a compound having the following structures. Examples of the other pigment derivatives include the compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H030-045662A), JP1992-285669A (JP-H04-285669A), JP1994-145546A (JP-H06-145546A), JP1994-212088A (JP-H06-212088A), JP 1994-240158A (JP-H06-240158A), JP1998-030063A (JP-H10-030063A), JP1998-195326A (JP-H10-195326A), paragraph Nos. 0086 to 0098 of WO2011/024896A, and paragraph Nos. 0063 to 0094 of WO2012/102399A, the contents of which are incorporated herein by reference.

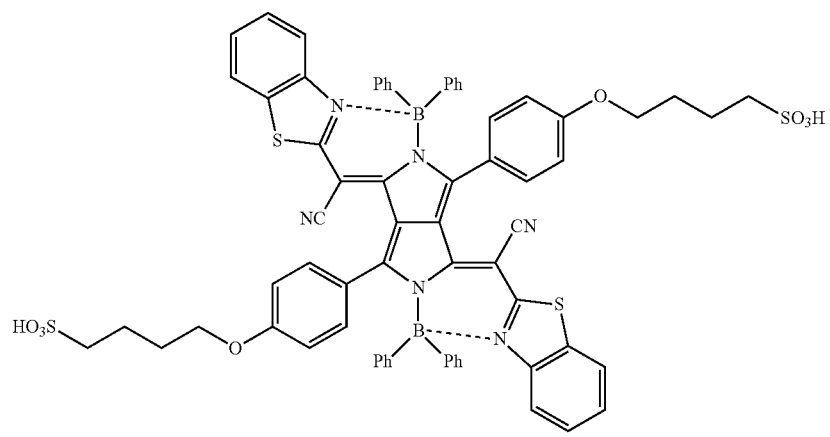
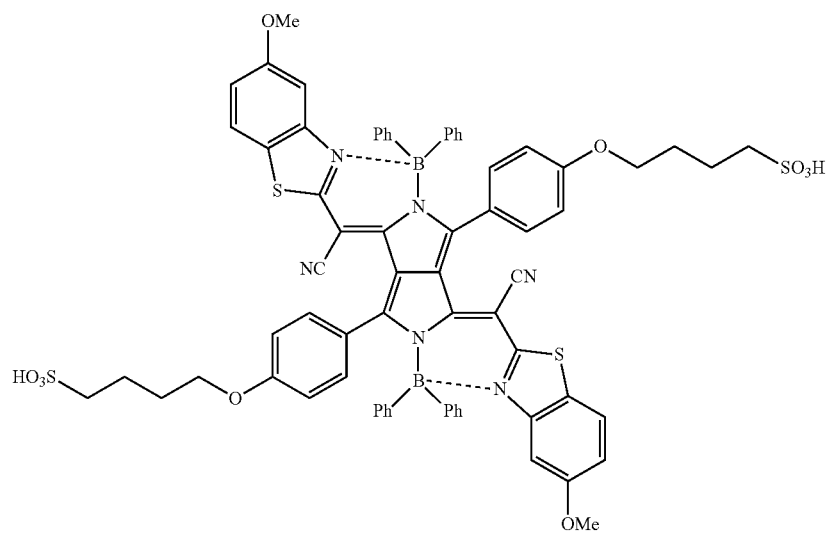
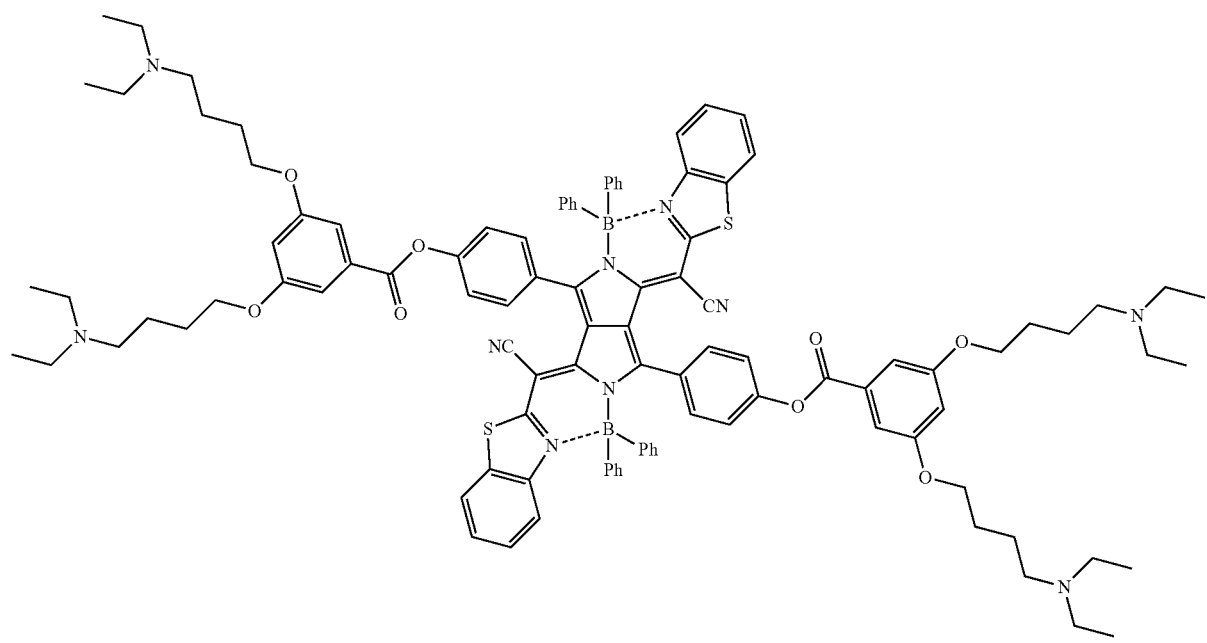

-continued

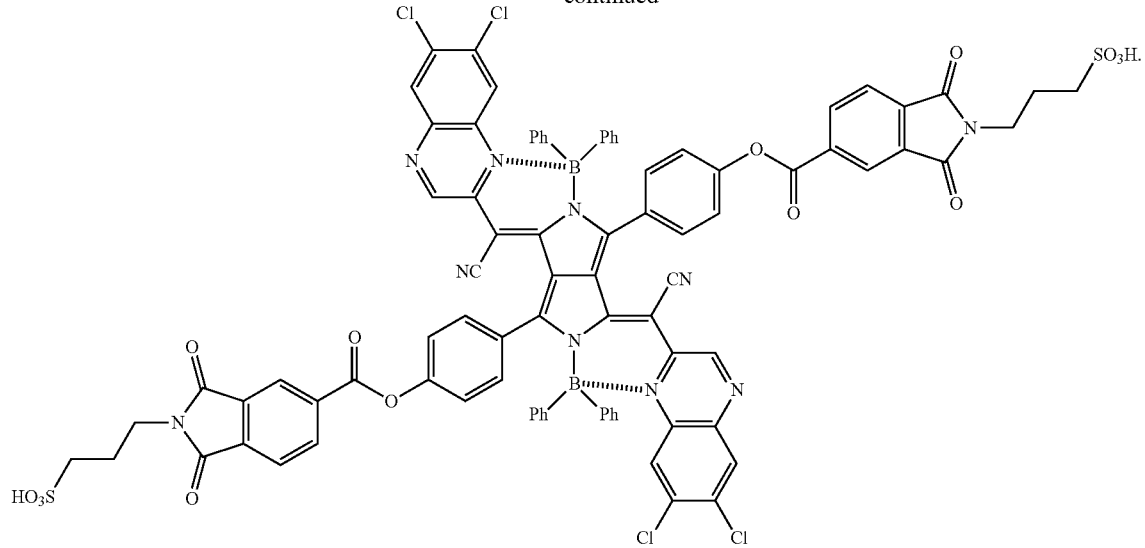

In a case where the composition for a near-infrared transmitting filter contains a pigment derivative, the content of the pigment derivative is preferably 1 to 50 parts by mass with respect to 100 parts by mass of the pigment. The lower limit value is preferably 3 parts by mass or more, and more preferably 5 parts by mass or more. The upper limit value is preferably 40 parts by mass or less, and more preferably 30 parts by mass or less. In a case where the content of the pigment derivative is within the range, the dispersibility of the pigment can be improved, and aggregation of particles can be effectively suppressed. The pigment derivative may be used singly or in combination of two or more kinds thereof in combination. In a case where two or more kinds of the pigment derivatives are used, the total amount thereof is preferably within the range.

<<Solvent>>

The composition for a near-infrared transmitting filter preferably contains a solvent. Examples of the solvent include an organic solvent. Basically, the solvent is not particularly limited as long as it satisfies the solubility of the respective components or the coatability of the composition. Examples of the organic solvent include esters, ethers, ketones, and aromatic hydrocarbons. With regard to the details of the organic solvent, reference can be made to the description in paragraph No. 0223 of WO2015/166779A, the contents of which are incorporated herein by reference. Further, an ester-based solvent substituted with a cyclic alkyl group or a ketone-based solvent substituted with a cyclic alkyl group can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol monomethyl ether acetate. In the present invention, the organic solvent may be used singly or in combination of two or more kinds thereof. However, it is preferable in some cases to reduce aromatic hydrocarbons (benzene, toluene, xylene, ethylbenzene, and the like) (for example, the amount can be set to 50 parts per million (ppm) by mass or less, 10 ppm by mass or less, or 1 ppm by mass or less with respect to the total amount of the organic solvent) as a solvent for reasons in an environmental aspect or the like.

In the present invention, it is preferable to use an organic solvent having a small metal content, and for example, the metal content of the organic solvent is preferably 10 parts per billion (ppb) by mass or less. The metal content of the organic solvent is at a level of parts per trillion (ppt), as desired, and such a high-purity solvent is provided by, for example, Toyo Kasei Kogyo Co., Ltd. (The Chemical Daily, Nov. 13, 2015).

Examples of a method for removing impurities such as a metal from the solvent include distillation (for example, molecular distillation and thin-film distillation) and filtering using a filter. The pore diameter of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). Further, the solvent may include only one isomer or a plurality of isomers.

In the present invention, as the organic solvent, an organic solvent containing 0.8 mmol/L or less of a peroxide is preferable, and an organic solvent substantially not including a peroxide is more preferable.

The content of the solvent is preferably 10% to 90% by mass, more preferably 20% to 80% by mass, and still more preferably 25% to 75% by mass with respect to the total amount of the composition for a near-infrared transmitting filter. In addition, it is preferable in some cases that the composition for a near-infrared transmitting filter does not contain aromatic hydrocarbons (benzene, toluene, xylene, ethylbenzene, and the like) as a solvent for reasons in an environmental aspect or the like.

<<Polymerization Inhibitor>>

The composition for a near-infrared transmitting filter can contain a polymerization inhibitor. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-t-butylphenol), and N-nitrosophenylhydroxylamine salt (for example, an ammonium salt and a cerium (III) salt). Among these, p-methoxyphenol is preferable. The content of the polymerization inhibitor is preferably 0.001% to 5% by mass with respect to the total solid content of the composition for a near-infrared transmitting filter.

<<Silane Coupling Agent>>

The composition for a near-infrared transmitting filter may contain a silane coupling agent. In the present invention, the silane coupling agent means a silane compound having a hydrolyzable group and a functional group other than the hydrolyzable group. Further, the hydrolyzable group refers to a substituent which is directly linked to a silicon atom and is capable of forming a siloxane bond due to at least one of a hydrolysis reaction or a fusion reaction. Examples of the hydrolyzable group include a halogen atom, an alkoxy group, and an acyloxy group, with the alkoxy group being preferable. That is, it is preferable that the silane coupling agent is a compound having an alkoxysilyl group. In addition, examples of the functional group other than the hydrolyzable group include a vinyl group, a styryl group, a (meth)acryloyl group, a mercapto group, an epoxy group, an oxetanyl group, an amino group, a ureido group, a sulfide group, an isocyanate group, and a phenyl group, with the (meth)acryloyl group or the epoxy group being preferable. Examples of a commercially available product of the silane coupling agent include KBM-602 (manufactured by Shin-Etsu Chemical Co., Ltd.). In addition, examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

The content of the silane coupling agent is preferably 0.01% to 15.0% by mass, and more preferably 0.05% to 10.0% by mass, with respect to the total solid content of the composition for a near-infrared transmitting filter. The silane coupling agents may be of only one kind or of two or more kinds. In a case where two or more kinds of the silane coupling agents are used, the total amount thereof is preferably within the range.

<<Surfactant>>

The composition for a near-infrared transmitting filter may contain a surfactant. As the surfactant, various surfactants such as a fluorine-based surfactant, a nonionic surfactant, a cationic surfactant, an anionic surfactant, and a silicone-based surfactant can be used. With regard to the surfactant, reference can be made to paragraph Nos. 0238 to 0245 of WO2015/166779A, the contents of which are incorporated herein by reference.

In the present invention, the surfactant is preferably a fluorine-based surfactant. By incorporating the fluorine-based surfactant into the composition for a near-infrared transmitting filter, liquid characteristics (in particular, fluidity) are further improved, and thus, the liquid saving properties are further improved. In addition, it is possible to form a film having a small extent of thickness unevenness.

The fluorine content in the fluorine-based surfactant is preferably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film or liquid saving properties, and also has a good solubility in the composition.

Specific examples of the fluorine-based surfactant include the surfactants described in paragraph Nos. 0060 to 0064 of JP2014-041318A (paragraph Nos. 0060 to 0064 of the corresponding WO2014/017669A), and the surfactants described in paragraph Nos. 0117 to 0132 of JP2011-132503A, the contents of which are incorporated herein by reference. Examples of a commercially available product of the fluorine-based surfactant include MEGAFACE F171, F172, F173, F176, F177, F141, F142, F143, F144, R30, F437, F475, F479, F482, F554, and F780 (all of which are manufactured by DIC Corporation), FLUORAD FC430, FC431, and FC171 (all of which are manufactured by Sumitomo 3M Ltd.), SURFLON S-382, SC-101, SC-103, SC-104, SC-105, SC-1068, SC-381, SC-383, S-393, and KH-40 (all of which are manufactured by Asahi Glass Co., Ltd.), and PolyFox PF636, PF656, PF6320, PF6520, and PF7002 (all of which are manufactured by OMNOVA Solutions Inc.).

Moreover, as the fluorine-based surfactant, an acrylic compound in which by application of heat to a molecular structure containing a functional group having a fluorine atom, in which the functional group containing a fluorine atom is cut to volatilize a fluorine atom, can also be appropriately used. Examples of such a fluorine-based surfactant include MEGAFACE DS series manufactured by DIC Corporation (The Chemical Daily, Feb. 22, 2016) (Nikkei Business Daily, Feb. 23, 2016), for example, MEGAFACE DS-21, which can also be used.

As the fluorine-based surfactant, a block polymer can also be used. Examples thereof include the compounds described in JP2011-089090A. As the fluorine-based surfactant, a fluorine atom-containing polymer compound can also be preferably used, in which the fluorine-containing polymer compound includes a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). The following compound is also exemplified as the fluorine-based surfactant used in the present invention.

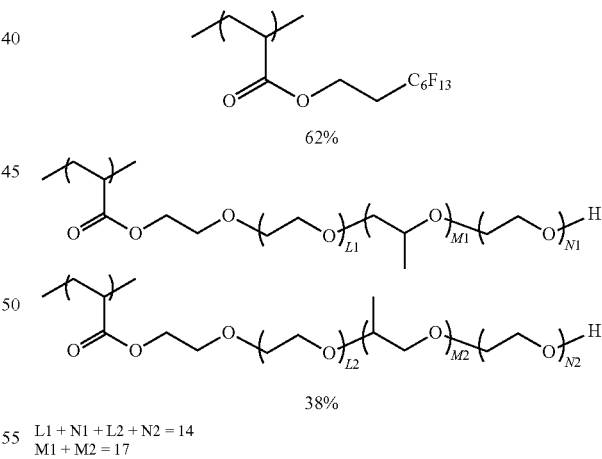

$L1 + N1 + L2 + N2 = 14$
$M1 + M2 = 17$

The weight-average molecular weight of the compound is preferably 3,000 to 50,000, and is, for example 14,000. In the compound, % representing the ratio of the repeating units is % by mass.

Moreover, a fluorine-containing polymer having an ethylenically unsaturated group in a side chain can also be used as the fluorine-based surfactant. Specific examples thereof include the compounds described in paragraph Nos. 0050 to 0090 and paragraph Nos. 0289 to 0295 of JP2010-164965A, for example, MEGAFACE RS-101, RS-102, RS-718K, and RS-72-K, manufactured by DIC Corporation. As the fluorine-based surfactant, the compounds described in paragraph Nos. 0015 to 0158 of JP2015-117327A can also be used.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSEPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin chemical industry Co., Ltd.).

The content of the surfactant is preferably 0.001% to 5.0% by mass, and more preferably 0.005% to 3.0% by mass, with respect to the total solid content of the composition for a near-infrared transmitting filter. The surfactant may be used singly or in combination of two or more kinds. In a case where two or more kinds of the surfactants are used, the total amount thereof is preferably within the range.

<<Ultraviolet Absorber>>

The composition for a near-infrared transmitting filter can contain an ultraviolet absorber. As the ultraviolet absorber, a conjugated diene compound, an aminobutadiene compound, a methyldiebenzoyl compound, a coumarin compound, a salicylate compound, a benzophenone compound, a benzotriazole compound, an acrylonitrile compound, a hydroxyphenyltriazine compound, or the like can be used. With regard to the details thereof, reference can be made to the descriptions in paragraph Nos. 0052 to 0072 of JP2012-208374A and paragraph Nos. 0317 to 0334 of JP2013-068814A, the contents of which are incorporated herein by reference. Examples of commercially available products of the conjugated diene compound include UV-503 (manufactured by Daito Chemical Co., Ltd.). As the benzotriazole compound, MYUA series manufactured by Miyoshi Oil&Fat Co., Ltd. (The Chemical Daily, Feb. 1, 2016) may be used. As the ultraviolet absorber, compounds represented by Formula (UV-1) to Formula (UV-3) are preferable, the compound represented by Formula (UV-1) or Formula (UV-3) is more preferable, and the compound represented by Formula (UV-1) is still more preferable.

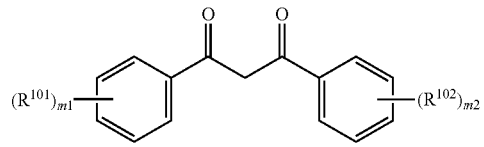

(UV-1)

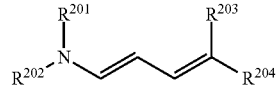

(UV-2)

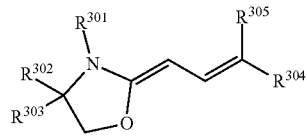

(UV-3)

In Formula (UV-1), $R^{101}$ and $R^{102}$ each independently represent a substituent, and m1 and m2 each independently represent 0 to 4.

In Formula (UV-2), $R^{201}$ and $R^{202}$ each independently represent a hydrogen atom or an alkyl group, and $R^{203}$ and $R^{204}$ each independently represent a substituent.

In Formula (UV-3), $R^{301}$ to $R^{303}$ each independently represent a hydrogen atom or an alkyl group, and $R^{304}$ and $R^{305}$ each independently represent a substituent.

Specific examples of the compounds represented by Formula (UV-1) to Formula (UV-3) include the following compounds.

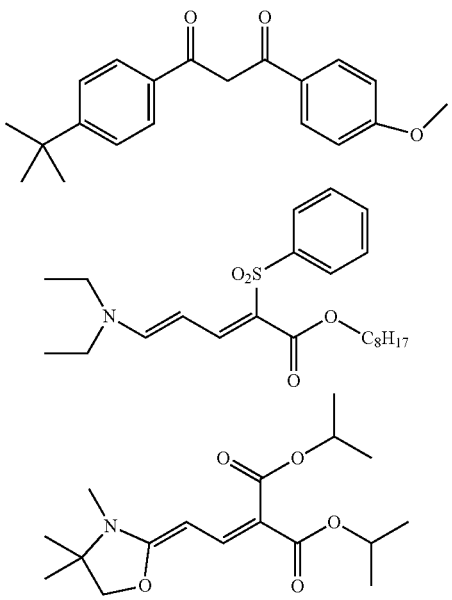

The content of the ultraviolet absorber in the composition for a near-infrared transmitting filter is preferably 0.01% to 10% by mass, and more preferably 0.01% to 5% by mass, with respect to the total solid content of the composition for a near-infrared transmitting filter. In the present invention, the ultraviolet absorber may be used singly or in combination of two or more kinds thereof. In a case where two or more kinds of the ultraviolet absorbers are used, the total amount thereof is preferably within the range.

<<Antioxidant>>

The composition for a near-infrared transmitting filter can contain an antioxidant. Examples of the antioxidant include a phenol compound, a phosphite compound, and a thioether compound. As the phenol compound, any of compounds which are known as a phenol antioxidant can be used. Preferred examples of the phenol compound include a hindered phenol compound. A compound having a substituent at a position (ortho-position) adjacent to a phenolic hydroxyl group is preferable. As the above-mentioned substituent, a substituted or unsubstituted alkyl group having 1 to 22 carbon atoms is preferable. Further, an antioxidant having a phenol group and a phosphite group in the same molecule is also preferable. In addition, as the antioxidant, a phosphorus-based antioxidant can also be suitably used. Examples of the phosphorous-based antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl) phosphite. Examples of a commercially available product of the antioxidant include ADK STAB AO-20, ADK STAB AO-30, ADK STAB AO-40, ADK STAB AO-50, ADK STAB AO-50F, ADK STAB AO-60, ADK STAB AO-60G, ADK STAB AO-80, and ADK STAB AO-330 (all of which are manufactured by ADEKA Corporation).

The content of the antioxidant in the composition for a near-infrared transmitting filter is preferably 0.01% to 20% by mass, and more preferably 0.3% to 15% by mass, with respect to the total solid content of the composition for a near-infrared transmitting filter. The antioxidant may be used singly or in combination of two or more kinds thereof. In a case where two or more kinds of the antioxidants are used, the total amount thereof is preferably within the range.

<<Other Components>>

The composition for a near-infrared transmitting filter may contain a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent), as desired. By appropriately incorporating the components into the composition, properties such as film physical properties can be adjusted. With regard to the details of the components, can be found in, for example, paragraph No. 0183 or later of JP2012-003225A (paragraph No. 0237 of the corresponding US2013/0034812A), paragraph Nos. 0101 to 0104, and 0107 to 0109 of JP2008-250074A, and the like, the contents of which are incorporated herein by reference.

In a case where a film is formed, for example, by coating, the viscosity (23° C.) of the composition for a near-infrared transmitting filter is preferably in a range of 1 to 100 mPa·s. The lower limit is preferably 2 mPa·s or more, and more preferably 3 mPa·s or more. The upper limit is preferably 50 mPa·s or less, more preferably 30 mPa·s or less, and particularly preferably 15 mPa·s or less.

<Composition for Forming Color Filter Layer>

Next, a composition which can be preferably used to form a color filter layer (composition for forming a color filter layer) will be described. It is preferable that the composition for forming a color filter layer includes a chromatic coloring agent. The chromatic coloring agent may be either a pigment or a dye. With regard to the details of the chromatic coloring agent, the above-mentioned ones may be mentioned. The content of the chromatic coloring agent is preferably 0.1% to 70% by mass with respect to the total solid content of the composition for forming a colored layer. The lower limit is preferably 0.5% by mass or more, and more preferably 1.0% by mass or more. The upper limit is preferably 60% by mass or less, and more preferably 50% by mass or less.

The composition for forming a color filter layer can further contain a curable compound, a photoinitiator, a resin, a solvent, a pigment derivative, a polymerization inhibitor, a surfactant, a silane coupling agent, an ultraviolet absorber, an antioxidant, or the like. With regard to the details thereof, the above-mentioned materials which are used for the above-mentioned composition for a near-infrared transmitting filter may be mentioned, and preferred ranges thereof are also the same. Further, preferred contents of these materials are also the same as the content for the composition for a near-infrared transmitting filter.

<Composition for Forming Near-Infrared Shielding Filter Layer>

Next, a composition which can be preferably used to form a near-infrared shielding filter layer (a composition for forming a near-infrared shielding filter layer) will be described. It is preferable that the composition for forming a near-infrared shielding filter layer includes a near-infrared absorbing dye. With regard to the details of the near-infrared absorbing dye, the above-mentioned near-infrared absorbing dyes may be mentioned. The content of the near-infrared absorbing dye is preferably 0.1% to 70% by mass with respect to the total solid content of the composition for forming a near-infrared shielding filter layer. The lower limit is preferably 0.5% by mass or more, and more preferably 1.0% by mass or more. The upper limit is preferably 60% by mass or less, and more preferably 50% by mass or less.

The composition for forming a near-infrared shielding filter layer can further contain a curable compound, a photoinitiator, a resin, a solvent, a polymerization inhibitor, a surfactant, a silane coupling agent, an antioxidant, or the like. With regard to the details thereof, the above-mentioned materials which are used for the above-mentioned composition for a near-infrared transmitting filter may be mentioned, and preferred ranges thereof are also the same. Further, preferred contents of these materials are also the same as the content for the composition for a near-infrared transmitting filter.

<Composition for Forming Transparent Layer>

Next, the composition for forming a transparent layer which can be preferably used to form a transparent layer (a composition for forming a transparent layer) will be described. It is preferable that the composition for forming a transparent layer contains a resin. Examples of the resin include the above-mentioned materials which are used for the above-mentioned composition for a near-infrared transmitting filter, and preferred ranges thereof are also the same. Further, a preferred content of the resin is also the same as the content for the composition for a near-infrared transmitting filter.

The composition for forming a transparent layer may contain a white or colorless pigment (hereinafter also referred to as a white pigment). Examples of the white pigment include particles of oxides including at least one element selected from Ti, Zr, Sn, Sb, Cu, Fe, Mn, Pb, Cd, As, Cr, Hg, Zn, Al, Mg, Si, P, or S. The shape of the white pigment is not particularly limited. Examples thereof include an isotropic shape (for example, a spherical shape and a polyhedral shape), an anisotropic shape (for example, a needle shape, a rod shape, and a plate shape), and an amorphous shape. The weight-average particle diameter of the primary particles of the white pigment is preferably 150 nm or less, more preferably 100 nm or less, and still more preferably 80 nm or less. The lower limit value is not particularly limited, but is preferably 1 nm or more. The specific surface area of the white pigment is preferably 10 to 400 $m^2/g$, more preferably 20 to 200 $m^2/g$, and still more preferably 30 to 150 $m^2/g$. The content of the white pigment is preferably 20% to 70% by mass with respect to the total solid content of the composition for forming a transparent layer. The lower limit is more preferably 25% by mass or more, and still more preferably 30% by mass or more. The upper limit is more preferably 65% by mass or less, and still more preferably 60% by mass or less.

The composition for forming a transparent layer can further contain a curable compound, a photoinitiator, a solvent, a polymerization inhibitor, a surfactant, a silane coupling agent, an ultraviolet absorber, an antioxidant, or the like. With regard to the details thereof, the above-mentioned materials which are used for the above-mentioned composition for a near-infrared transmitting filter may be mentioned, and preferred ranges thereof are also the same. Further, preferred contents of these materials are also the same as the content for the composition for a near-infrared transmitting filter. In addition, as the composition for forming a transparent layer, the radiation-sensitive composition described in JP2013-254047A, the contents of which are incorporated herein by reference, can also be used.

<Storage Container for Composition>

A storage container for each of the compositions is not particularly limited, and a known storage container can be used. Further, as the storage container, it is also preferable to use a multilayer bottle having an inner wall constituted with 6 kinds of resins in 6 layers or a bottle having a 7-layer structure with 6 kinds of resins for the purpose of suppressing incorporation of impurities into raw materials or compositions. Examples of such a container include the containers described in JP2015-123351A.

<Method for Producing Structure>

Next, a method for producing the structure of the embodiment of the present invention will be described. The structure of the embodiment of the present invention can be produced through a step of forming a partition wall on a support and a step of forming a near-infrared transmitting filter layer in a region partitioned by the partition wall on the support.

The partition wall can be formed using a method known in the related art. For example, the partition wall can be forming in the following manner.

First, a partition wall material layer is formed on a support. For example, in a case of forming a silica particle partition wall, a partition wall material layer can be formed by applying a curable composition including silica particles onto a support, and then performing curing or the like to form a film. With regard to the curable composition including silica particles, reference can be made to the description in JP2015-166449A and JP2014-063125A, the contents of which are incorporated herein by reference. Further, in a case of forming a partition wall using a siloxane resin or a fluorine resin, a partition wall material layer can be formed by applying a resin composition including a siloxane resin or a fluorine resin onto a support, and then performing curing or the like to form a film. In addition, for example, in a case of forming a partition wall formed of an inorganic material such as silicon dioxide, a partition wall material layer can be formed by depositing inorganic materials such as silicon dioxide onto a support by a deposition method such as chemical vapor deposition (CVD) and vacuum deposition, a sputtering method, or the like. Subsequently, a resist pattern is formed on the partition wall material layer using a mask having a pattern following the shape of the partition wall. Then, the partition wall material layer is subjected to etching by a dry etching method using this resist pattern as a mask. Subsequently, the resist pattern is peeled and removed from the partition wall material layer, whereby a partition wall can be formed. With regard to the dry etching method, reference can be made to the description in JP2016-014856A, the contents of which are incorporated herein by reference. Further, the partition wall can also be formed using the method described in JP2006-128433A.

After forming the partition wall, a protective layer may be formed on a surface of the partition wall. The protective layer can be formed using a method known in the related art. In a case of forming a protective layer formed of an organic material, the protective layer can be formed by, for example, applying a composition including an organic material onto a partition wall, followed by drying. In a case of forming the protective layer formed of an inorganic material, the protective layer can be formed by, for example, depositing an inorganic material constituting the protective layer onto a surface of the protective layer by a deposition method such as chemical vapor deposition (CVD) and vacuum deposition, a sputtering method, or the like to form a film.

Next, a near-infrared transmitting filter layer is formed in a region partitioned by the partition wall on the support. The near-infrared transmitting filter layer can be formed using the above-mentioned composition for forming a near-infrared transmitting filter layer (composition for a near-infrared transmitting filter) of the embodiment of the present invention. Specifically, the near-infrared transmitting filter layer can be formed through a step of applying the composition for forming a near-infrared transmitting filter layer in the region partitioned by a partition wall on a support, followed by drying.

As a method for applying the composition for forming a near-infrared transmitting filter layer, a known method can be used. Examples of the method include a dropwise addition method (drop cast); a slit coating method; a spraying method; a roll coating method; a rotation coating method (spin coating); a cast coating method; a slit-and-spin method; a pre-wetting method (for example, the method described in JP2009-145395A); various printing methods such as ink jet (for example, an on-demand mode, a piezo mode, and a thermal mode), a discharge system such as nozzle jet, flexographic printing, screen printing, gravure printing, reverse offset printing, and metal mask printing; a transfer method using a mold or the like; and a nanoimprint method. The application method using ink jet is not particularly limited and examples thereof include a method (in particular, pp. 115 to 133) described in "Extension of Use of Injector-Infinite Possibilities in Patent—" (Published in February, 2005, S. B. Research Co., Ltd.) and the methods described in JP2003-262716A, JP2003-185831A, JP2003-261827A, JP2012-126830A, JP2006-169325A, or the like.

The composition layer formed by applying the composition for forming a near-infrared transmitting filter layer may be dried (pre-baked). The pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 seconds to 3,000 seconds, more preferably 40 to 2,500 seconds, and still more preferably 80 to 220 seconds. Pre-baking can be performed using a hot plate, an oven, or the like.

While the near-infrared transmitting filter layer is formed, a step of forming a pattern can further be included. Examples of the pattern forming method include a pattern forming method using photolithography and a pattern forming method using a dry etching method. Hereinafter, the step of forming a pattern will be described in detail.

(Case of Forming Pattern by Photolithography)

The pattern forming method by photolithography preferably includes a step of patternwise exposing a composition layer (exposing step) and a step of removing the composition layer on the unexposed area by development to form a pattern (developing step). As desired, a step of baking the developed pattern (post-baking step) can be provided. Hereinafter, the respective steps will be described.

<<Exposing Step>>

The composition layer is patternwise exposed in the exposing step. For example, the composition layer can be subjected to patternwise exposure by performing exposure using an exposure device such as a stepper through a mask having a predetermined mask pattern. Thus, the exposed area can be cured. As the radiation (light) which can be used during the exposure, ultraviolet rays such as g-rays and i-rays are preferable, and the i-rays are more preferable. The irradiation dose (exposure dose) is, for example, preferably 0.03 to 2.5 J/cm$^2$, more preferably 0.05 to 1.0 J/cm$^2$, and most preferably 0.08 to 0.5 J/cm$^2$. The oxygen concentration during the exposure can be appropriately selected, and may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the illuminance of exposure energy may be combined, and for example, a combination of an oxygen concentration of 10% by volume and an illuminance of 10,000 W/m$^2$, a combination of an oxygen concentration of 35% by volume and an illuminance of 20,000 W/m$^2$, or the like is available.

<<Developing Step>>

Next, the composition layer of the unexposed area in the composition layer after exposure is removed by development to form a pattern. The removal of the composition layer of the unexposed area by development can be performed using a developer. Thus, the composition layer of the unexposed area in the exposing step is eluted with the developer, and as a result, only a photocured portion remains. As the developer, an organic alkali developer causing no damage on the underlying solid-state imaging device, circuit, or the like is preferable. The temperature of the developer is, for example, preferably 20° C. to 30° C., and the development time is preferably 20 to 180 seconds. Further, in order to improve residue removing properties, a step of removing the developer by shaking every 60 second and supplying a new developer again may be repeated multiple times.

Examples of the alkali agent used for the developer include organic alkaline compounds such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. As the alkali agent, a compound having a high molecular weight is preferable in consideration of the environments and the safety. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass. Moreover, a developer containing a surfactant may also be used. Examples of the surfactant include the above-mentioned surfactants, with the non-ionic surfactant being preferable. The developer may first be prepared as a concentrated liquid and then diluted to a desired concentration upon use from the viewpoint of convenience in transportation and storage, and the concentration rate is not particularly limited, but can be set to a range of 1.5- to 100-times. Incidentally, in a case where a developer including such an aqueous alkaline solution is used, it is preferable that cleaning (rinsing) with pure water is performed after development.

After the development, a heating treatment (post-baking) can also be performed after carrying out drying. The post-baking is a heating treatment after development so as to complete the curing of the film. In a case of performing the post-baking, the post-baking temperature is preferably, for example, 50° C. to 240° C. From the viewpoint of curing of the film, the post-baking temperature is more preferably 200° C. to 230° C. In addition, in a case of using an organic electroluminescence (organic EL) element as a light-emitting light source of an image display device or a case of constituting a photo-electric conversion film of an image sensor with organic materials, the post-baking temperature is preferably 150° C. or lower, more preferably 120° C. or lower, still more preferably 100° C. or lower, and particularly preferably 90° C. or lower. Post-baking can be performed continuously or batchwise using a heating unit such as a hot plate, a convection oven (hot-air circulating dryer), and a high-frequency heater so that the film after development satisfies the conditions.

(Case of Forming Pattern by Dry Etching Method)

Pattern formation by a dry etching method can be performed by a method including, for example, curing a composition layer on a support to form a cured product layer, then forming a patterned photoresist layer on the cured product layer, and subsequently subjecting the cured product layer to dry-etching using an etching gas through the patterned photoresist layer as a mask. In the formation of the photoresist layer, it is preferable to further carry out a pre-baking treatment. In particular, as a process for forming a photoresist, an aspect in which a post-exposure heating treatment or a post-development heating treatment (post-baking treatment) is performed is preferable. With regard to the pattern formation by a dry etching method, reference can be made to the descriptions in paragraph Nos. 0010 to 0067 of JP2013-064993A, the contents of which are incorporated herein by reference.

In a case where the structure of the embodiment of the present invention further has other layers such as a color filter layer and a near-infrared shielding filter layer, the structure can be formed by performing the same steps as described in the above-mentioned near-infrared transmitting filter layer forming step, using each of the compositions for forming filter layers.

EXAMPLES

Hereinbelow, the present invention will be described in more detail with reference to Examples. The materials, the amounts of materials used, the proportions, the treatment details, the treatment procedure, and the like shown in the Examples below may be modified if appropriate as long as the modifications do not depart from the spirit of the present invention. Therefore, the scope of the present invention is not limited to specific Examples shown below. In addition, "parts" and "%" are on a mass basis unless otherwise specified.

<Preparation of Composition for Forming Near-Infrared Transmitting Filter Layer (IR Transmitting Composition)>

(Preparation of Pigment Dispersion Liquids R-1, R-2, B-1, B-2, Y-1, Y-2, V-1, IR-1, and Bk-2)

The raw materials described in the following table were mixed, 230 parts by mass of zirconia beads with a diameter of 0.3 mm were further added thereto, the mixture was subjected to a dispersion treatment for 5 hours, and the beads were separated by filtration to produce each of pigment dispersion liquids.

TABLE 1

| | Color material | | Dispersion aid (Derivative, resin) | | Dispersant | | Solvent | |
|---|---|---|---|---|---|---|---|---|
| | Type | Parts by mass | Type | Parts by mass | Type | Parts by mass | Type | Parts by mass |
| Pigment dispersion liquid R-1 | PR254 | 12.59 | | | C1 | 4.4 | J1 | 83.01 |
| Pigment dispersion liquid R-2 | PR254 | 12.59 | | | C3 | 4.4 | J1 | 83.01 |
| Pigment dispersion liquid B-1 | PB15:6 | 12.59 | | | C2 | 4.4 | J1 | 83.01 |
| Pigment dispersion liquid B-2 | PB15:6 | 12.59 | | | C3 | 4.4 | J1 | 83.01 |
| Pigment dispersion liquid Y-1 | PY139 | 11.00 | B1 | 1.59 | C2 | 4.4 | J1 | 83.01 |
| Pigment dispersion liquid Y-2 | PY139 | 11.00 | B1 | 1.59 | C3 | 4.4 | J1 | 83.01 |
| Pigment dispersion liquid Y-1 | PY23 | 14.20 | P1 | 2 | C4 | 3.8 | J1 | 73.01 |
| | | | | | | | J2 | 10.00 |
| Pigment dispersion liquid IR-1 | A1 | 11.00 | B2 | 1.59 | C3 | 4.4 | J1 | 83.01 |
| Pigment dispersion liquid Bk-2 | Pigment Black 32 | 12.59 | | | C2 | 4.4 | J1 | 83.01 |

(Preparation of IR Transmitting Composition)

The raw materials described in the following table were mixed to prepare IR transmitting compositions 1 to 4.

TABLE 2

| | | IR transmitting composition 1 | IR transmitting composition 2 | IR transmitting composition 3 | IR transmitting composition 4 |
|---|---|---|---|---|---|
| Pigment dispersion liquid | R-1 | | 19.09 | | |
| | R-2 | | | | 25.48 |
| | B-1 | | 29.32 | 13.50 | |
| | B-2 | | | | 25.48 |
| | Y-1 | 23.79 | 11.59 | 13.50 | |
| | Y-2 | | | | 12.74 |
| | V-1 | 41.43 | 6.65 | | |
| | IR-1 | | | | 14.14 |
| | Bk-2 | | | 40.51 | |
| Curable compound | D1 | 0.91 | | | |
| | D2 | 2.12 | | 2.09 | |
| | D3 | | 2.09 | | |
| | D4 | | | | 2.48 |
| Photoinitiator | I1 | 0.74 | | 1.20 | |
| | I2 | | | | 1.01 |
| | I3 | | 1.20 | | |
| Resin | P1 | | 2.18 | 2.24 | |
| | P2 | 1.38 | | | |
| Ultraviolet absorber | UV1 | 0.41 | | | |
| Surfactant | F1 | 0.008 | 0.042 | 0.042 | 0.04 |
| Polymerization inhibitor | G1 | 0.00152 | 0.01 | 0.01 | 0.001 |
| Solvent | J1 | 29.21 | 27.83 | 26.92 | 15.90 |

<Preparation of Composition for Forming Near-Infrared Shielding Filter layer (IR Absorbing Composition)>

The raw materials described in the following table were mixed to prepare IR absorbing compositions 1 to 3. Further, as the dispersion liquid, a dispersion liquid produced by mixing a near-infrared absorber, a derivative, a dispersant, and a solvent, each in a type described in the section of Dispersion liquid in the following table, in the amount of parts by mass described in the section of Dispersion liquid in the following table, further adding 230 parts by mass of zirconia beads with a diameter of 0.3 mm thereto, subjecting the mixture to a dispersion treatment for 5 hours using a paint shaker, and separating the beads by filtration was used.

TABLE 3

| | Dispersion liquid | | | | | | | | | | |
|---|---|---|---|---|---|---|---|---|---|---|---|
| | Near-infrared absorbing dye | | Derivative | | Dispersant | | Solvent | | Resin | | Curable compound | |
| | Type | Parts by mass | Type | Parts by mass | Type | Parts by mass | Type | Parts by mass | Type | Parts by mass | Type | Parts by mass |
| IR absorbing composition 1 | A3 | 2.5 | B2 | 0.5 | C3 | 1.8 | J1 | 39 | P1 | 5.5 | D5D4 | 3.2 3.2 |
| IR absorbing composition 2 | A4 | 2.5 | B2 | 0.5 | C3 | 1.8 | J1 | 39 | P1 | 5.5 | D5D4 | 3.2 3.2 |
| IR absorbing composition 3 | A2 | 2.5 | B4 | 0.5 | C3 | 1.8 | J1 | 39 | P1 | 5.5 | D5D4 | 3.2 3.2 |

| | Photoinitiator | | Ultraviolet absorber | | Surfactant | | Polymerization inhibitor | | Antioxidant | | Solvent | |
|---|---|---|---|---|---|---|---|---|---|---|---|---|
| | Type | Parts by mass | Type | Parts by mass | Type | Parts by mass | Type | Parts by mass | Type | Parts by mass | Type | Parts by mass |
| IR absorbing composition 1 | I4 | 1 | UV3 | 1.6 | F1 | 0.025 | G1 | 0.003 | AO1 | 0.2 | J1 | 41.472 |
| IR absorbing composition 2 | I4 | 1 | UV3 | 1.6 | F1 | 0.025 | G1 | 0.003 | AO1 | 0.2 | J1 | 41.472 |
| IR absorbing composition 3 | I4 | 1 | UV3 | 1.6 | F1 | 0.025 | G1 | 0.003 | AO1 | 0.2 | J1 | 41.472 |

The raw materials described in the table are as follows.
(Color Material)
PR254: C. I. Pigment Red 254
PB15:6: C. I. Pigment Blue 15:6
PY139: C. I. Pigment Yellow 139
PV23: C. I. Pigment Violet 23
Pigment Black 32: C. I. Pigment Black 32

A1 to A4: Compounds having the following structures (near-infrared absorbing dyes). In the following formulae, Me represents a methyl group and Ph represents a phenyl group.

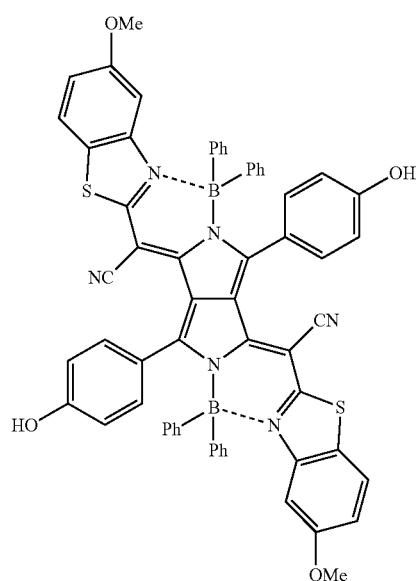

(A1)

-continued
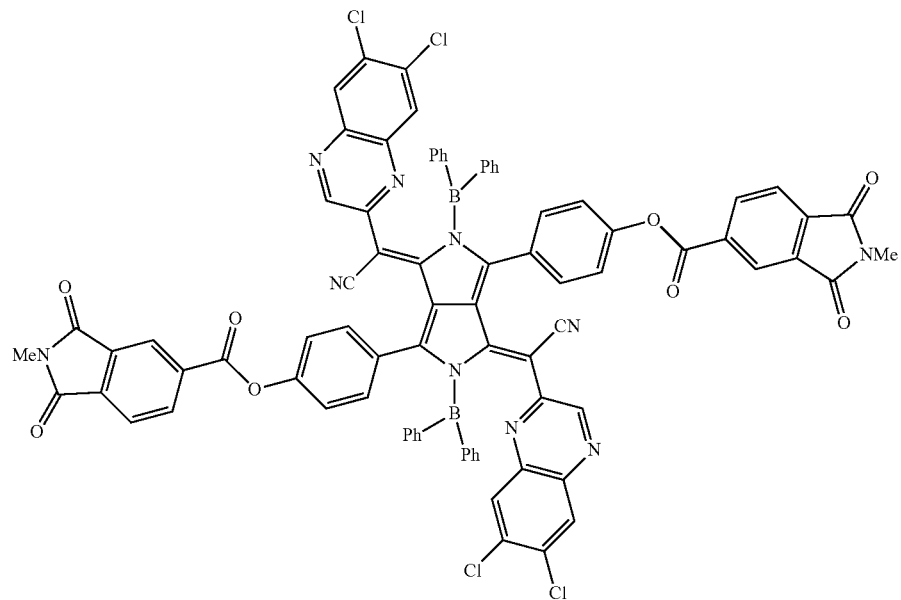
(A2)
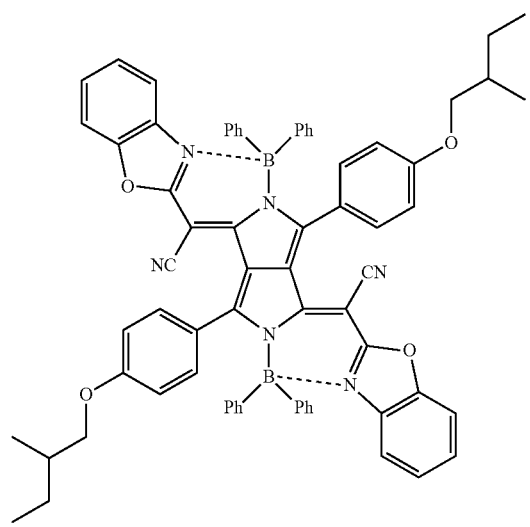
(A3)
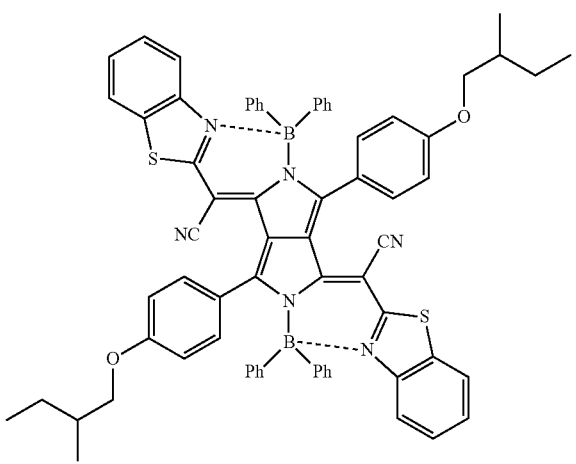
(A4)

(Derivative)
B1, B2, and B4: Compound having the following structures. In the following structural formulae, Ph represents a phenyl group.
(B1)
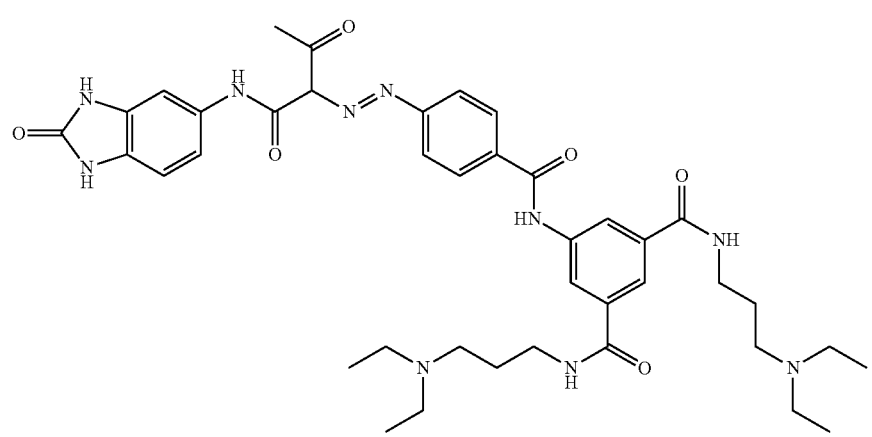
(B2)
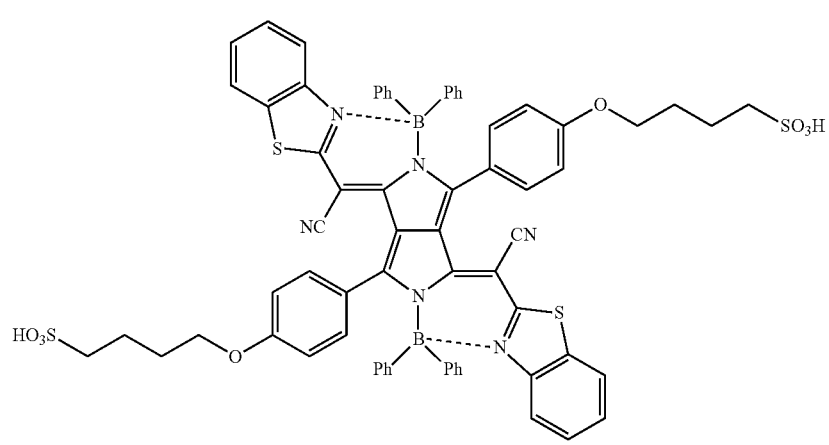
(B4)
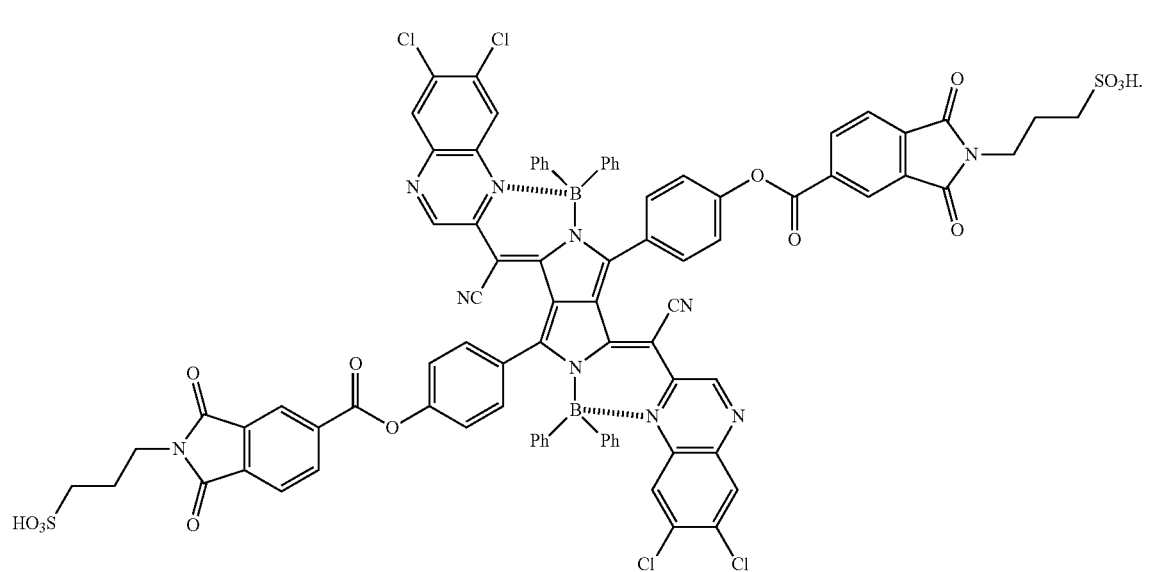

(Dispersant)

C1: Resin having the following structure. (The numerical value described together with the main chain is a molar ratio, and the numerical value described together with the side chain is the number of repeating units. Mw=21,000)

C2: Resin having the following structure. (The numerical value described together with the main chain is a molar ratio, and the numerical value described together with the side chain is the number of repeating units. Mw=26,000)

C3: Resin having the following structure. (The numerical value described together with the main chain is a molar ratio, and the numerical value described together with the side chain is the number of repeating units. Mw=21,000)

C4: Disperbyk-111 (manufactured by BYK Chemie)

(C1)
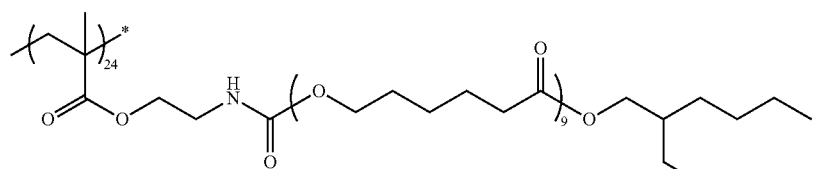

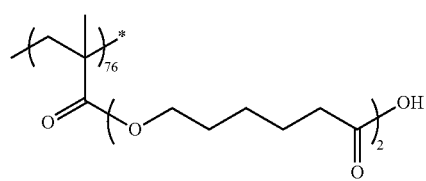

(C2)
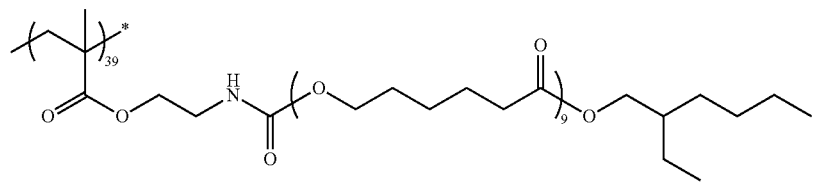

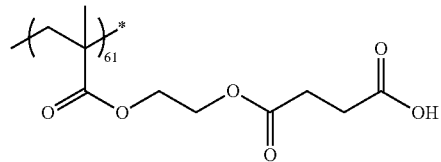

(C3)
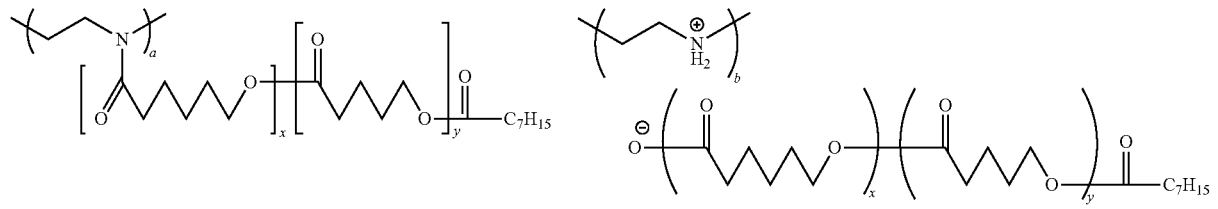

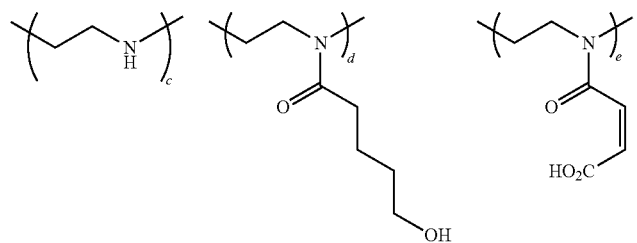

a/b/c/d/e = 36/4/35/1/24 (mol %) x = 48 y = 12

(Resin)

P1: Resin having the following structure. (The numerical value described together with the main chain is a molar ratio. Mw=10,000, acid value=70 mgKOH/g)

P2: Resin having the following structure. (The numerical value described together with the main chain is a molar ratio. Mw=10,000, acid value=70 mgKOH/g)

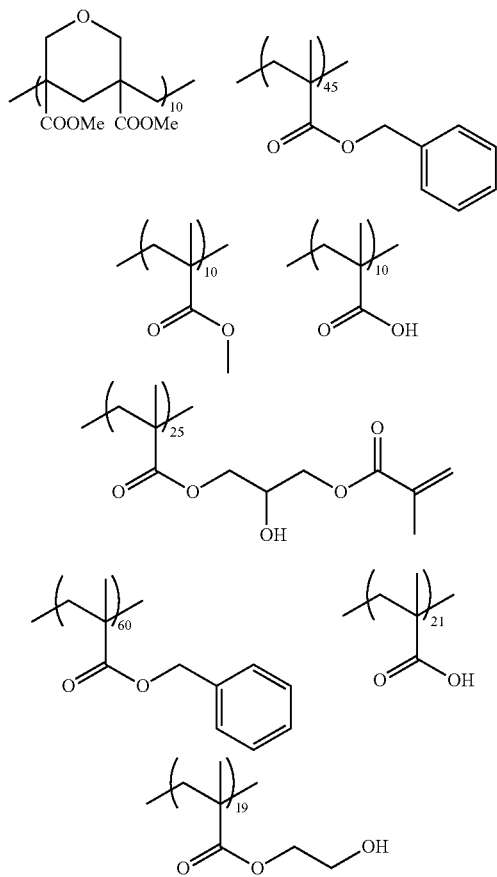

(Curable Compound)

D1: KAYARAD RP-1040 (manufactured by Nippon Kayaku Co., Ltd., radically polymerizable compound)

D2: ARONIX TO-2349 (manufactured by Toagosei Co., Ltd., radically polymerizable compound)

D3: ARONIX M-305 (manufactured by Toagosei Co., Ltd., radically polymerizable compound)

D4: NK ester A-TMMT (manufactured by Shin-Nakamura Chemical Co., Ltd., radically polymerizable compound)

D5: KAYARAD DPHA (manufactured by Nippon Kayaku Co., Ltd., radically polymerizable compound)

(Photoinitiator)

I1: IRGACURE OXE02 (manufactured by BASF, photoradical polymerization initiator)

I2: IRGACURE OXE03 (manufactured by BASF, photoradical polymerization initiator)

I3: IRGACURE OXE04 (manufactured by BASF, photoradical polymerization initiator)

I4: IRGACURE OXE01 (manufactured by BASF, photoradical polymerization initiator)

(Ultraviolet Absorber)

UV1: UV-503 (manufactured by Daito Chemical Co., Ltd.)

UV3: Compound having the following structure

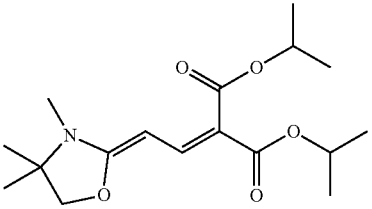

(Surfactant)

F1: The following mixture (Mw=14,000). In the following formula, % representing a ratio of the repeating units is in % by mass.

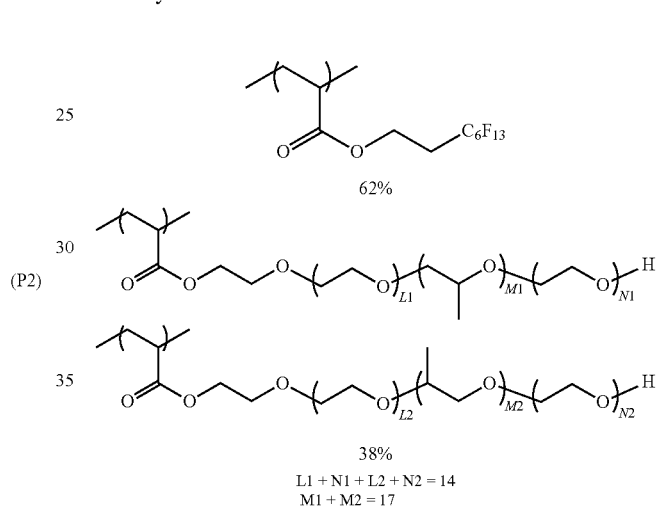

(Polymerization Inhibitor)

G1: p-Methoxyphenol (Antioxidant)

AO1: ADK STAB AO-80 (manufactured by ADEKA Corporation)

(Solvent)

J1: Propylene glycol monomethyl ether acetate (PGMEA)

<Preparation of Composition for Forming Protective Layer>

(Composition 1 for Forming Protective Layer)

The following raw materials were mixed to prepare a composition 1 for forming a protective layer.

A 54%-by-mass propylene glycol monomethyl ether (PGME) solution of the resin 1 . . . 0.7 parts by mass A 0.2%-by-mass propylene glycol monomethyl ether acetate (PGMEA) solution of the surfactant 1 . . . 0.8 parts by mass PGMEA 98.5 parts by mass Resin 1: Cyclomer P(ACA)230AA (manufactured by Daicel Chemical Industries, Ltd., acid value=30 mgKOH/g, Mw=15,000)

Surfactant 1: The surfactant F1

<Preparation of Composition for Forming Color Filter Layer>

(Red Composition 1)

The raw materials shown below were mixed, stirred, and then filtered through a nylon-made filter with a pore diameter of 0.45 μm (manufactured by Nihon Pall Ltd.) to prepare Red Composition 1.
  Red pigment dispersion liquid . . . 51.7 parts by mass
  A 40%-by-mass PGMEA solution of the resin 2 . . . 0.6 parts by mass
  Curable compound 1 . . . 0.6 parts by mass
  Photoinitiator 1 . . . 0.3 parts by mass
  A 0.2%-by-mass PGMEA solution of the surfactant 1 . . . 4.2 parts by mass
  PGMEA . . . 42.6 parts by mass
  (Green Composition 1)
The raw materials shown below were mixed, stirred, and then filtered through a nylon-made filter with a pore diameter of 0.45 μm (manufactured by Nihon Pall Ltd.) to prepare Green Composition 1.
  Green pigment dispersion liquid . . . 73.7 parts by mass
  A 40%-by-mass PGMEA solution of the resin 2 . . . 0.3 parts by mass
  Curable compound 2 . . . 1.2 parts by mass
  Photoinitiator 1 . . . 0.6 parts by mass
  A 0.2%-by-mass PGMEA solution of the surfactant 1 . . . 4.2 parts by mass
  Ultraviolet absorber 1 . . . 0.5 parts by mass
  PGMEA 19.5 parts by mass
  (Blue Composition 1)
The raw materials shown below were mixed, stirred, and then filtered through a nylon-made filter with a pore diameter of 0.45 μm (manufactured by Nihon Pall Ltd.) to prepare Blue Composition 1.
  Blue pigment dispersion liquid . . . 44.9 parts by mass
  A 40%-by-mass PGMEA solution of the resin 2 . . . 2.1 parts by mass
  Curable compound 1 . . . 1.5 parts by mass
  Curable compound 3 . . . 0.7 parts by mass
  Photoinitiator 2 . . . 0.8 parts by mass
  A 0.2%-by-mass PGMEA solution of the surfactant 1 . . . 4.2 parts by mass PGMEA 45.8 parts by mass
  The raw materials used for the composition for forming a color filter layer are as follows.
  Red pigment dispersion liquid
  A mixed liquid formed of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads with a diameter of 0.3 mm) for 3 hours to prepare a pigment dispersion liquid. Thereafter, the mixture was further subjected to a dispersion treatment at a flow rate of 500 g/min under a pressure of 2,000 kg/cm$^3$ using a high-pressure dispersing machine with pressure reducing mechanism, NANO-3000-10 (manufactured by Nippon BEE Chemical Co., Ltd.). This dispersion treatment was repeated ten times to obtain a red pigment dispersion liquid.
  Green Pigment Dispersion Liquid
  A mixed liquid formed of 6.4 parts by mass of C. I. Pigment Green 36, 5.3 parts by mass of C. I. Pigment Yellow 150, 5.2 parts by mass of a dispersant (Disperbyk-161, manufactured by BYK Chemie), and 83.1 parts by mass of PGMEA was mixed and dispersed using a beads mill (zirconia beads with a diameter of 0.3 mm) for 3 hours to prepare a pigment dispersion liquid. Thereafter, the mixture was further subjected to a dispersion treatment at a flow rate of 500 g/min under a pressure of 2,000 kg/cm$^3$ using a high-pressure dispersing machine with pressure reducing mechanism, NANO-3000-10 (manufactured by Nippon BEE Chemical Co., Ltd.). This dispersion treatment was repeated ten times to obtain a green pigment dispersion liquid.
  Blue Pigment Dispersion Liquid
  A mixed liquid formed of 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), and 82.4 parts by mass of PGMEA was mixed and dispersed using a beads mill (zirconia beads with a diameter of 0.3 mm) for 3 hours to prepare a pigment dispersion liquid. Thereafter, the mixture was further subjected to a dispersion treatment at a flow rate of 500 g/min under a pressure of 2,000 kg/cm$^3$ using a high-pressure dispersing machine with pressure reducing mechanism, NANO-3000-10 (manufactured by Nippon BEE Chemical Co., Ltd.). This dispersion treatment was repeated ten times to obtain a blue pigment dispersion liquid.
  Resin 2: The Resin P1
  Surfactant 1: The Surfactant F1
  Curable compound 1: Compound having the following structure

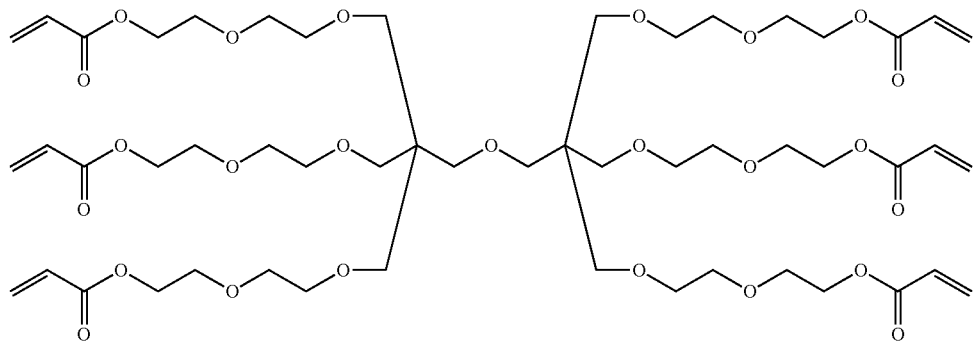 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Curable compound 2: A mixture of compounds having the following structures (a mixture of the left compound and the right compound at a molar ratio of 7:3)

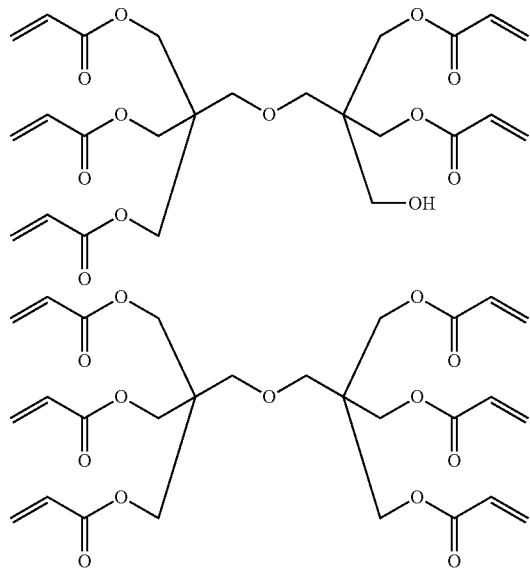

Curable compound 3: ARONIX M-305 (55% to 63% by mass of triacrylate included, manufactured by Toagosei Co., Ltd.)
Photoinitiator 1: The photoinitiator 14
Photoinitiator 2: The photoinitiator 12
Photoinitiator 3: The photoinitiator 13
Ultraviolet absorber 1: The ultraviolet absorber UV1
<Preparation of Composition for Forming Transparent Layer>
(White Composition)
The raw materials shown below were mixed, stirred, and then filtered through a nylon-made filter with a pore diameter of 0.45 µm (manufactured by Nihon Pall Ltd.) to prepare a white composition.
Resin (a polymer 1 produced by the method described in paragraph Nos. 0213 to 0216 of JP2013-254047A) . . . 20.5 parts by mass
Curable compound (ARONIX M-510, manufactured by Toagosei Co., Ltd.) . . . 12.2 parts by mass
Photoinitiator (IRGACURE-OXE02, manufactured by) BASF . . . 1.1 parts by mass Ultraviolet absorber (UV-503 (manufactured by Daito Chemical Co., Ltd.)) . . . 1.8 parts by mass
PGMEA 52.7 parts by mass
Cyclohexanone . . . 11.4 parts by mass
Silane coupling agent (Shin-Etsu silicone, KBM-602) . . . 0.1 parts by mass
Polymerization inhibitor (p-methoxyphenol) . . . 0.1 parts by mass
Surfactant (the following mixture (Mw=14,000, % representing the ratio of the repeating units is in % by mass) . . . 0.1 parts by mass

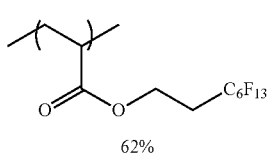

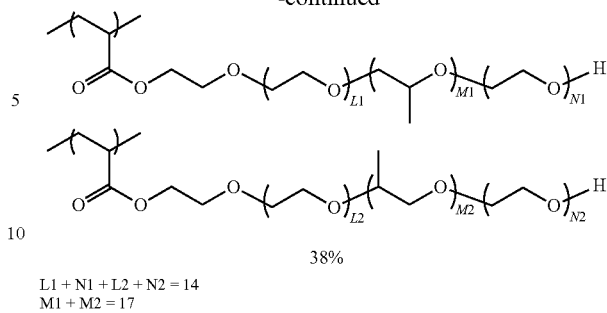

38%

L1 + N1 + L2 + N2 = 14
M1 + M2 = 17

<Production of Structure>

Test Example 1

Examples 1-1 to 1-15 and Comparative Examples 1-2 to 1-4

A partition wall material layer was formed on a silicon wafer using a partition wall material described in the following table, and the partition wall material layer was patterned by a dry etching method under the conditions described in paragraph Nos. 0128 to 0133 of JP2016-014856A to form partition walls (a width of 50 nm and a height of 1 µm) in a lattice form at an interval of 1 µm. The dimension (a region partitioned by the partition wall on the silicon wafer) of the partition wall on the silicon wafer was 1 µm vertical×1 µm horizontal. Next, patterning was performed on the silicon wafer having the partition walls formed thereon by photolithography using an IR transmitting composition described in the following table to form a near-infrared transmitting filter layer (a thickness of 1 µm) in a region partitioned by the partition wall on the silicon wafer. Subsequently, a lens was formed on the near-infrared transmitting filter layer to produce a structure shown in FIG. 1.

Comparative Examples 1-1, and 1-5 to 1-7

Patterning was performed by photolithography using an IR transmitting composition described in the following table on a silicon wafer to form a 1-µm² near-infrared transmitting filter layer (a thickness of 1 µm). Subsequently, a lens was formed on the near-infrared transmitting filter layer to produce a structure.
(Evaluation of Near-Infrared Recognition Ability)
Each of the structures was introduced into an optical sensor according to a known method and its near-infrared recognition ability was evaluated. Further, for the structure using the IR transmitting composition 1, an ability to recognize the light in a wavelength range of 720 nm was evaluated. In addition, for the structure using the IR transmitting composition 2 or 3, an ability to recognize the light at a wavelength of 850 nm was evaluated. Further, for the structure using the IR transmitting composition 4, an ability to recognize the light at a wavelength of 940 nm was evaluated.
(Evaluation Standard)
4: There was almost no noise and the near-infrared recognition ability was good.
3: Noise was slightly generated, but the near-infrared recognition ability was good.
2: Noise was more or less generated, but the near-infrared recognition ability was good.

1: The structure has a near-infrared recognition ability but there was much noise.

The partition wall materials described in the following table are as follows.

Partition wall material 1: Silicon dioxide (a minimum value of the refractive index with respect to light in a wavelength range of 700 to 1,000 nm=1.46). The partition wall material layer was formed by a chemical deposition method.

Partition wall material 2: Fluorine resin (CYTOP, manufactured by Asahi Glass Co., Ltd., the minimum value of the refractive index with respect to light in a wavelength range of 700 to 1,000 nm=1.34). The partition wall material layer was formed by applying a composition including a fluorine resin onto a support, followed by heating at 220° C. for 5 minutes.

Partition wall material 3: Siloxane resin (the resin of A03 in paragraph No. 0345 of JP2014-063125A, the minimum value of the refractive index with respect to light in a wavelength range of 700 to 1,000 nm=1.36). The partition wall material layer was formed by applying a composition including the siloxane resin onto a support, followed by heating at 220° C. for 5 minutes.

Partition wall material 4: The composition 107 described in paragraph No. 0160 of JP2015-166449A (a composition including silica particles. The silica particles included in the composition had the minimum value of the refractive index with respect to light in a wavelength range of 700 to 1,000 nm of 1.24). The partition wall material layer was formed by applying the composition 107 onto a support, followed by heating at 220° C. for 5 minutes.

Partition wall material 5: The composition A02 described in paragraph No. 0345 of JP2014-063125A (a composition including silica particles. The silica particles included in the composition A02 had the minimum value of the refractive index with respect to light in a wavelength range of 700 to 1,000 nm of 1.28). The partition wall material layer was formed by applying the composition onto a support, followed by heating at 220° C. for 5 minutes.

Partition wall material 6: Siloxane resin (the composition described in Example 2 of JP2011-084672A. The siloxane resin (cage-type siloxane resin) included in the composition has the minimum value of the refractive index with respect to light in a wavelength range of 700 to 1,000 nm of 1.32). The partition wall material layer was formed by applying the siloxane resin onto a support, followed by heating at 220° C. for 5 minutes.

Comparative partition wall material 1: SiN (the minimum value of the refractive index with respect to light in a wavelength range of 700 to 1,000 nm is 2.02). The partition wall material layer was formed by chemical deposition method.

Comparative partition wall material 2: TiO$_2$ (the minimum value of the refractive index with respect to light in a wavelength range of 700 to 1,000 nm is 2.83). The partition wall material layer was formed by chemical deposition method.

Comparative partition wall material 3: Tungsten (the minimum value of the refractive index with respect to light in a wavelength range of 700 to 1,000 nm is 3.84). The partition wall material layer was formed by chemical deposition method.

TABLE 4

| | Partition wall material | Near-infrared transmitting filter layer | Near-infrared recognition ability |
|---|---|---|---|
| Example 1-1 | Partition wall material 1 | IR transmitting composition 2 | 3 |
| Example 1-2 | Partition wall material 2 | IR transmitting composition 2 | 4 |
| Example 1-3 | Partition wall material 3 | IR transmitting composition 2 | 4 |
| Example 1-4 | Partition wall material 4 | IR transmitting composition 2 | 4 |
| Example 1-5 | Partition wall material 5 | IR transmitting composition 2 | 4 |
| Example 1-6 | Partition wall material 6 | IR transmitting composition 2 | 4 |
| Example 1-7 | Partition wall material 1 | IR transmitting composition 1 | 3 |
| Example 1-8 | Partition wall material 1 | IR transmitting composition 3 | 3 |
| Example 1-9 | Partition wall material 1 | IR transmitting composition 4 | 3 |
| Example 1-10 | Partition wall material 2 | IR transmitting composition 1 | 4 |
| Example 1-11 | Partition wall material 3 | IR transmitting composition 3 | 4 |
| Example 1-12 | Partition wall material 4 | IR transmitting composition 4 | 4 |
| Example 1-13 | Partition wall material 5 | IR transmitting composition 1 | 4 |
| Example 1-14 | Partition wall material 6 | IR transmitting composition 3 | 4 |
| Example 1-15 | Partition wall material 4 | IR transmitting composition 4 | 4 |
| Comparative Example 1-1 | Partition wall not existed | IR transmitting composition 2 | 2 |
| Comparative Example 1-2 | Comparative Partition wall material 1 | IR transmitting composition 2 | 2 |
| Comparative Example 1-3 | Comparative Partition wall material 2 | IR transmitting composition 2 | 2 |
| Comparative Example 1-4 | Comparative Partition wall material 3 | IR transmitting composition 2 | 2 |
| Comparative Example 1-5 | Partition wall not existed | IR transmitting composition 1 | 2 |
| Comparative Example 1-6 | Partition wall not existed | IR transmitting composition 3 | 2 |
| Comparative Example 1-7 | Partition wall not existed | IR transmitting composition 4 | 2 |

Furthermore, in Examples 1-1 to 1-15, the refractive index of the partition wall at at least a portion of the wavelengths of the near-infrared light transmitted by the near-infrared transmitting filter layer was smaller than the refractive index of the near-infrared transmitting filter layer. In addition, in Examples 1-6 and 1-14 in which the partition wall was formed using the partition wall material 6, the refractive index of the partition wall was smaller than the refractive index of the near-infrared transmitting filter layer by 0.2 or more.

On the other hand, in Comparative Examples 1-2, 1-3, and 1-4, in which partition walls were formed using the comparative partition wall materials 1 to 3, the refractive index of the partition wall with respect to the near-infrared light transmitted by the near-infrared transmitting filter layer was larger than the refractive index of the near-infrared transmitting filter layer.

As shown in the table, the structures of Examples had an excellent near-infrared recognition ability, and thus could detect the near-infrared light with good sensitivity. In a case where the partition walls were formed using the partition wall materials 2, 3, and 6, it was possible to form partition walls having less deviation in the width dimension or defects.

In each of Examples, even in a case where the width of the partition wall was changed to 20 nm, 100 nm, or 200 nm, the same good recognition ability as in each of Examples was obtained.

In addition, in each of Examples, even in a case where the height of the partition wall was changed to 0.5 μm or 1.5 μm, the same good recognition ability as in each of Examples was obtained.

In addition, even in a case where in each of Examples, the dimension of the opening of the partition wall on the silicon wafer was changed to 5 μm vertical×5 μm horizontal, 20 μm vertical×20 μm horizontal, or 100 μm vertical×100 μm horizontal, the same good recognition ability as in each of Examples was obtained.

In addition, in each of Examples, even in a case where an underlying material (CT-4000L, manufactured by FUJIFILM Electronic Materials Co., Ltd.) was applied onto a silicon wafer such that the film thickness became 100 nm, and heated at 220° C. for 5 minutes to form an underlayer, the same good recognition ability as in each of Examples was obtained.

In addition, in a case where the following protective layer 1 was formed on a surface of the partition wall formed using the partition wall material 6, it was possible to effectively suppress the components from the adjacent near-infrared transmitting filter layer from being incorporated into the partition wall. In addition, in a case where the following protective layer 2 was formed on a surface of the partition wall formed using the partition wall material 4, the adhesiveness between the near-infrared transmitting filter layer and the partition wall was particularly excellent. The protective layers 1 and 2 were formed by the following method.

Protective layer 1: Silicon dioxide was deposited onto a surface of the partition wall by a chemical deposition method to form a film, whereby a silicon dioxide film (protective layer 1) with a thickness of 20 nm was formed.

Protective layer 2: The above-mentioned composition for forming a protective layer 1 was applied onto a surface of the partition wall by a spin coating method, followed by heating at 100° C. for 2 minutes using a hot plate, and then heating at 230° C. for 2 minutes using a hot plate, whereby an organic product layer (protective layer 2) with a film thickness of 15 nm was formed.

Test Example 2

Examples 2-1 to 2-15 and Comparative Examples 2-2 to 2-4

A partition wall material layer was formed on a silicon wafer using a partition wall material described in the following table, and the partition wall material layer was patterned by a dry etching method to form partition walls (a width of 50 nm and a height of 1 μm) in a lattice form at an interval of 1 μm. The dimension of the partition wall on the silicon wafer was 1 μm vertical×1 μm horizontal. Next, patterning was performed on the silicon wafer having the partition walls formed thereon by photolithography using an IR transmitting composition described in the following table to form a near-infrared transmitting filter layer (a thickness of 1 μm) in a region partitioned by the partition wall on the silicon wafer. Next, patterning was performed by photolithography using an IR absorbing composition to form a near-infrared shielding layer (a thickness of 1 μm) in a region partitioned by the partition wall on the support. Subsequently, a lens was formed on the near-infrared transmitting filter layer and the near-infrared shielding filter layer to produce a structure shown in FIG. 2.

Comparative Examples 2-1, and 2-5 to 2-7

Patterning was performed on a silicon wafer by photolithography using an IR transmitting composition described in the following table to form a 1-μm² near-infrared transmitting filter layer (a thickness of 1 μm). Next, patterning was performed by photolithography using an IR absorbing composition to form a 1-μm² near-infrared shielding layer (a thickness of 1 μm) to form a structure having the near-infrared shielding layer provided on an area having no pattern formed thereon in the near-infrared transmitting filter layer. Subsequently, a lens was formed on the near-infrared transmitting filter layer and the near-infrared shielding filter layer to produce a structure.

(Evaluation of Ability to Recognize Near-Infrared Light and Visible Light)

Each of the structures was introduced into an optical sensor according to a known method and its ability to recognize near-infrared light and visible light was evaluated. Further, for the structure using the IR transmitting composition 1, an ability to recognize the light in a wavelength range of 720 nm was evaluated. In addition, for the structure using the IR transmitting composition 2 or 3, an ability to recognize the light at a wavelength of 850 nm was evaluated. Further, for the structure using the IR transmitting composition 4, an ability to recognize the light at a wavelength of 940 nm was evaluated. The evaluation standard for the near-infrared recognition ability is the same as in Test Example 1. The visible light recognition ability was evaluated as follows.

(Evaluation Standard for Visible Light Recognition Ability)

4: There was almost no noise and the visible light recognition ability was good.

3: Noise was slightly generated, but the visible light recognition ability was good.

2: Noise was more or less generated, but the visible light recognition ability was good.

1: The structure has a visible light recognition ability but there was much noise.

TABLE 5

|  | Partition wall material | Near-infrared shielding filter layer | Near-infrared transmitting filter layer | Near-infrared recognition ability | Visible light recognition ability |
|---|---|---|---|---|---|
| Example 2-1 | Partition wall material 1 | IR absorbing composition 2 | IR transmitting composition 2 | 3 | 3 |
| Example 2-2 | Partition wall material 2 | IR absorbing composition 2 | IR transmitting composition 2 | 4 | 4 |
| Example 2-3 | Partition wall material 3 | IR absorbing composition 2 | IR transmitting composition 2 | 4 | 4 |

TABLE 5-continued

|  | Partition wall material | Near-infrared shielding filter layer | Near-infrared transmitting filter layer | Near-infrared recognition ability | Visible light recognition ability |
|---|---|---|---|---|---|
| Example 2-4 | Partition wall material 4 | IR absorbing composition 2 | IR transmitting composition 2 | 4 | 4 |
| Example 2-5 | Partition wall material 5 | IR absorbing composition 2 | IR transmitting composition 2 | 4 | 4 |
| Example 2-6 | Partition wall material 6 | IR absorbing composition 2 | IR transmitting composition 2 | 4 | 4 |
| Example 2-7 | Partition wall material 1 | IR absorbing composition 1 | IR transmitting composition 1 | 3 | 4 |
| Example 2-8 | Partition wall material 1 | IR absorbing composition 2 | IR transmitting composition 3 | 3 | 4 |
| Example 2-9 | Partition wall material 1 | IR absorbing composition 3 | IR transmitting composition 4 | 3 | 4 |
| Example 2-10 | Partition wall material 2 | IR absorbing composition 1 | IR transmitting composition 1 | 4 | 4 |
| Example 2-11 | Partition wall material 3 | IR absorbing composition 2 | IR transmitting composition 3 | 4 | 4 |
| Example 2-12 | Partition wall material 4 | IR absorbing composition 3 | IR transmitting composition 4 | 4 | 4 |
| Example 2-13 | Partition wall material 5 | IR absorbing composition 1 | IR transmitting composition 1 | 4 | 4 |
| Example 2-14 | Partition wall material 6 | IR absorbing composition 2 | IR transmitting composition 3 | 4 | 4 |
| Example 2-15 | Partition wall material 4 | IR absorbing composition 3 | IR transmitting composition 4 | 4 | 4 |
| Comparative Example 2-1 | Partition wall not existed | IR absorbing composition 2 | IR transmitting composition 2 | 2 | 2 |
| Comparative Example 2-2 | Comparative Partition wall material 1 | IR absorbing composition 2 | IR transmitting composition 2 | 2 | 2 |
| Comparative Example 2-3 | Comparative Partition wall material 2 | IR absorbing composition 2 | IR transmitting composition 2 | 2 | 2 |
| Comparative Example 2-4 | Comparative Partition wall material 3 | IR absorbing composition 2 | IR transmitting composition 2 | 2 | 2 |
| Comparative Example 2-5 | Partition wall not existed | IR absorbing composition 1 | IR transmitting composition 1 | 2 | 2 |
| Comparative Example 2-6 | Partition wall not existed | IR absorbing composition 2 | IR transmitting composition 3 | 2 | 2 |
| Comparative Example 2-7 | Partition wall not existed | IR absorbing composition 3 | IR transmitting composition 4 | 2 | 2 |

Moreover, in Examples 2-1 to 2-15, the refractive index of the partition wall at at least a portion of the wavelengths of the near-infrared light transmitted by the near-infrared transmitting filter layer was smaller than the refractive index of the near-infrared transmitting filter layer. Further, in Examples 2-6 and 2-14 in which a partition wall was formed using the partition wall material 6, the refractive index of the partition wall was smaller than the refractive index of the near-infrared transmitting filter layer by 0.2 or more.

On the other hand, in Comparative Examples 2-2, 2-3, and 2-4 in which partition walls were formed using the comparative partition wall materials 1 to 3, the refractive index of the partition wall with respect to the near-infrared light transmitted by the near-infrared transmitting filter layer was larger than the refractive index of the near-infrared transmitting filter layer.

As shown in the table, the structures of Examples had excellent near-infrared recognition ability, and could detect the near-infrared light with good sensitivity. In addition, the visible light recognition ability was also excellent.

In each of Examples, even in a case where the width of the partition wall was changed to 20 nm, 100 nm, or 200 nm, the same good recognition ability as in Examples was obtained.

In addition, in each of Examples, even in a case where the height of the partition wall was changed to 0.5 μm or 1.5 μm, the same good recognition ability as in Examples was obtained.

In addition, in each of Examples, the dimension of the opening of the partition wall on the silicon wafer was changed to 5 μm vertical×5 μm horizontal, 20 μm vertical×20 μm horizontal, or 100 μm vertical×100 μm horizontal, the same good recognition ability as in each of Examples was obtained.

In addition, in each of Examples, even in a case where an underlying material (CT-4000L, manufactured by FUJIF-ILM Electronic Materials Co., Ltd.) was applied onto the silicon wafer such that the film thickness became 100 nm, and heated at 220° C. for 5 minutes to form an underlayer, the same good recognition ability as in each of Examples was obtained.

In addition, in a case where the protective layer 1 was formed on a surface of the partition wall formed using the partition wall material 6, it was possible to effectively suppress the components from the adjacent near-infrared transmitting filter layer or near-infrared shielding filter layer from being incorporated into the partition wall. In addition, in a case where the protective layer 2 was formed on a surface of the partition wall formed using the partition wall material 4, the adhesiveness between the near-infrared transmitting filter layer and the partition wall, and between the near-infrared shielding filter layer and the partition wall was particularly excellent.

Test Example 3

Examples 3-1 to 3-15 and Comparative Examples 3-2 to 3-4

A partition wall material layer was formed on a silicon wafer using a partition wall material described in the following table, and the partition wall material layer was patterned by a dry etching method to form partition walls (a width of 50 nm and a height of 1 µm) in a lattice form at an interval of 1 µm. The dimension of the partition wall on the silicon wafer was 1 µm vertical×1 µm horizontal. Next, patterning was performed on the silicon wafer having the partition walls formed thereon by photolithography using an IR transmitting composition described in the following table to form a near-infrared transmitting filter layer (a thickness of 1 µm) in a region partitioned by the partition wall on the silicon wafer. Next, patterning was performed by photolithography using an IR absorbing composition to form a near-infrared shielding layer (a thickness of 0.5 µm) in a region partitioned by the partition wall on the support. Next, was performed by photolithography using Red Composition 1, Green Composition 1, and Blue Composition 1 on the near-infrared shielding layer to form a color filter layer including a red colored layer, a green colored layer, and a blue colored layer. Subsequently, a lens was formed on the near-infrared transmitting filter layer and the color filter layer to produce a structure shown in FIG. 3.

Comparative Examples 3-1, and 3-5 to 3-7

Patterning was performed on a silicon wafer by photolithography using an IR transmitting composition described in the following table to form a 1-µm² near-infrared transmitting filter layer (a thickness of 1 µm). Next, patterning was performed by photolithography using an IR absorbing composition to form a near-infrared shielding layer (a thickness of 0.5 µm) in a region partitioned by the partition wall on the support. Next, was performed by photolithography using Red Composition 1, Green Composition 1, and Blue Composition 1 on the near-infrared shielding layer to form a color filter layer including a red colored layer, a green colored layer, and a blue colored layer. Subsequently, a lens was formed on the near-infrared transmitting filter layer and the color filter layer to produce a structure.

(Evaluation of Ability to Recognize Near-Infrared Light and Visible Light)

Each of the structures was introduced into an optical sensor according to a known method and its ability to recognize near-light and visible light was evaluated. Further, for the structure using the IR transmitting composition 1, an ability to recognize the light in a wavelength range of 720 nm was evaluated. In addition, for the structure using the IR transmitting composition 2 or 3, an ability to recognize the light at a wavelength of 850 nm was evaluated. Further, for the structure using the IR transmitting composition 4, an ability to recognize the light at a wavelength of 940 nm was evaluated. The evaluation standard for the near-infrared recognition ability is the same as in Test Example 1. The evaluation standard for the visible light recognition ability is the same as in Test Example 2.

TABLE 6

|  | Partition wall material | Color filter layer ||| Near-infrared shielding filter layer | Near-infrared transmitting filter layer | Near-infrared recognition ability | Visible light recognition ability |
|  |  | Red colored layer | Green colored layer | Blue colored layer |  |  |  |  |
| --- | --- | --- | --- | --- | --- | --- | --- | --- |
| Example 3-1 | Partition wall material 1 | Red composition 1 | Green composition 1 | Blue composition 1 | IR absorbing composition 2 | IR transmitting composition 2 | 3 | 3 |
| Example 3-2 | Partition wall material 2 | Red composition 1 | Green composition 1 | Blue composition 1 | IR absorbing composition 2 | IR transmitting composition 2 | 4 | 4 |
| Example 3-3 | Partition wall material 3 | Red composition 1 | Green composition 1 | Blue composition 1 | IR absorbing composition 2 | IR transmitting composition 2 | 4 | 4 |
| Example 3-4 | Partition wall material 4 | Red composition 1 | Green composition 1 | Blue composition 1 | IR absorbing composition 2 | IR transmitting composition 2 | 4 | 4 |
| Example 3-5 | Partition wall material 5 | Red composition 1 | Green composition 1 | Blue composition 1 | IR absorbing composition 2 | IR transmitting composition 2 | 4 | 4 |
| Example 3-6 | Partition wall material 6 | Red composition 1 | Green composition 1 | Blue composition 1 | IR absorbing composition 2 | IR transmitting composition 2 | 4 | 4 |
| Example 3-7 | Partition wall material 1 | Red composition 1 | Green composition 1 | Blue composition 1 | IR absorbing composition 1 | IR transmitting composition 1 | 3 | 4 |
| Example 3-8 | Partition wall material 1 | Red composition 1 | Green composition 1 | Blue composition 1 | IR absorbing composition 2 | IR transmitting composition 3 | 3 | 4 |
| Example 3-9 | Partition wall material 1 | Red composition 1 | Green composition 1 | Blue composition 1 | IR absorbing composition 3 | IR transmitting composition 4 | 3 | 4 |
| Example 3-10 | Partition wall material 2 | Red composition 1 | Green composition 1 | Blue composition 1 | IR absorbing composition 1 | IR transmitting composition 1 | 4 | 4 |
| Example 3-11 | Partition wall material 3 | Red composition 1 | Green composition 1 | Blue composition 1 | IR absorbing composition 2 | IR transmitting composition 3 | 4 | 4 |
| Example 3-12 | Partition wall material 4 | Red composition 1 | Green composition 1 | Blue composition 1 | IR absorbing composition 3 | IR transmitting composition 4 | 4 | 4 |
| Example 3-13 | Partition wall material 5 | Red composition 1 | Green composition 1 | Blue composition 1 | IR absorbing composition 1 | IR transmitting composition 1 | 4 | 4 |
| Example 3-14 | Partition wall material 6 | Red composition 1 | Green composition 1 | Blue composition 1 | IR absorbing composition 2 | IR transmitting composition 3 | 4 | 4 |
| Example 3-15 | Partition wall material 4 | Red composition 1 | Green composition 1 | Blue composition 1 | IR absorbing composition 3 | IR transmitting composition 4 | 4 | 4 |
| Comparative Example 3-1 | Partition wall not existed | Red composition 1 | Green composition 1 | Blue composition 1 | IR absorbing composition 2 | IR transmitting composition 2 | 2 | 2 |

TABLE 6-continued

| | Partition wall material | Red colored layer | Green colored layer | Blue colored layer | Near-infrared shielding filter layer | Near-infrared transmitting filter layer | Near-infrared recognition ability | Visible light recognition ability |
|---|---|---|---|---|---|---|---|---|
| Comparative Example 3-2 | Comparative Partition wall material 1 | Red composition 1 | Green composition 1 | Blue composition 1 | IR absorbing composition 2 | IR transmitting composition 2 | 2 | 2 |
| Comparative Example 3-3 | Comparative Partition wall material 2 | Red composition 1 | Green composition 1 | Blue composition 1 | IR absorbing composition 2 | IR transmitting composition 2 | 2 | 2 |
| Comparative Example 3-4 | Comparative Partition wall material 3 | Red composition 1 | Green composition 1 | Blue composition 1 | IR absorbing composition 2 | IR transmitting composition 2 | 2 | 2 |
| Comparative Example 3-5 | Partition wall not existed | Red composition 1 | Green composition 1 | Blue composition 1 | IR absorbing composition 1 | IR transmitting composition 1 | 2 | 2 |
| Comparative Example 3-6 | Partition wall not existed | Red composition 1 | Green composition 1 | Blue composition 1 | IR absorbing composition 2 | IR transmitting composition 3 | 2 | 2 |
| Comparative Example 3-7 | Partition wall not existed | Red composition 1 | Green composition 1 | Blue composition 1 | IR absorbing composition 3 | IR transmitting composition 4 | 2 | 2 |

Moreover, in Examples 3-1 to 3-15, the refractive index of the partition wall at at least a portion of the wavelengths of the near-infrared light transmitted by the near-infrared transmitting filter layer was smaller than the refractive index of the near-infrared transmitting filter layer. Further, in Examples 3-6 and 3-14 in which a partition wall was formed using the partition wall material 6, the refractive index of the partition wall was smaller than the refractive index of the near-infrared transmitting filter layer by 0.2 or more.

On the other hand, in Comparative Examples 3-2, 3-3, and 3-4 in which partition walls were formed using the comparative partition wall materials 1 to 3, the refractive index of the partition wall with respect to the near-infrared light transmitted by the near-infrared transmitting filter layer was larger than the refractive index of the near-infrared transmitting filter layer.

As shown in the table, the structures of Examples had excellent near-infrared recognition ability, and could detect the near-infrared light with good sensitivity. In addition, the visible light recognition ability was also excellent.

In each of Examples, even in a case where the width of the partition wall was changed to 20 nm, 100 nm, or 200 nm, the same good recognition ability as in Examples was obtained.

In addition, in each of Examples, even in a case where the height of the partition wall was changed to 0.5 μm or 1.5 μm, the same good recognition ability as in Examples was obtained.

In addition, in each of Examples, the dimension of the opening of the partition wall on the silicon wafer was changed to 5 μm vertical×5 μm horizontal, 20 μm vertical× 20 μm horizontal, or 100 μm vertical×100 μm horizontal, the same good recognition ability as in each of Examples was obtained.

In addition, in each of Examples, even in a case where an underlying material (CT-4000L, manufactured by FUJIF-ILM Electronic Materials Co., Ltd.) was applied onto the silicon wafer such that the film thickness became 100 nm, and heated at 220° C. for 5 minutes to form an underlayer, the same good recognition ability as in each of Examples was obtained.

Furthermore, in Example 3-7, in a case where a near-infrared transmitting filter layer including a laminate of a red colored layer (a thickness of 0.5 μm) formed using Red Composition 1 and a blue colored layer (a thickness of 0.5 μm) Ruined using Blue Composition 1 was used instead of a near-infrared transmitting filter layer formed using the IR transmitting composition 1, the same good recognition ability as in Example 3-7 was obtained.

In addition, in a case where the protective layer 1 was formed on a surface of the partition wall formed using the partition wall material 6, it was possible to effectively suppress the components from the near-infrared transmitting filter layer or each of the colored layers from being incorporated into the partition wall. In addition, in a case where the protective layer 2 was formed on a surface of the partition wall formed using the partition wall material 4, the adhesiveness between the near-infrared transmitting filter layer and the partition wall, and the adhesiveness between of the colored layers and the partition wall were particularly excellent.

In Test Examples 1 to 3, even with substitution of the near-infrared absorbing dye in the IR transmitting composition 4, and the IR absorbing compositions 1 to 3 with the near-infrared absorbing dye described in the present specification, the same effect was obtained.

Test Example 4

The structures described in FIGS. 5, 6, and 8 to 18 were produced by the same methods in Test Examples 1 to 3. The structure produced in such a manner was introduced into an optical sensor according to a known method and its ability to recognize near-infrared light and visible light was evaluated. These structures had an excellent near-infrared recognition ability and could detect the near-infrared light with good sensitivity. In addition, the visible light recognition ability was also excellent.

In the structures described in FIGS. 5, 6, and 8 to 18, the partition walls 2, 2a, and 2b were formed using the partition wall materials 1 to 6. The black matrix 5 was formed using tungsten. The colored layer 31 was formed by photolithography or a dry etching method using Red Composition 1. The colored layer 32 was formed by photolithography or a dry etching method using Green Composition 1. The colored layer 33 was formed by photolithography or a dry etching method using Blue Composition 1. The near-infrared shielding filter layers 22 and 23 were formed by photolithography or a dry etching method using the IR absorbing composition 2. The near-infrared transmitting filter layer 11 was formed by photolithography or a dry etching method using the IR transmitting composition 2. The transparent layers 41 and 42 were formed by photolithography or a dry etching method using the composition 1 for forming a transparent layer. In the structures, the pixel size of the near-infrared transmitting filter layer 11 was 1 µm². Further, the pixel size of the colored layers 31 to 33 was 1 µm². In addition, the pixel size of the transparent layer 42 was 1 µm².

Figure 5:
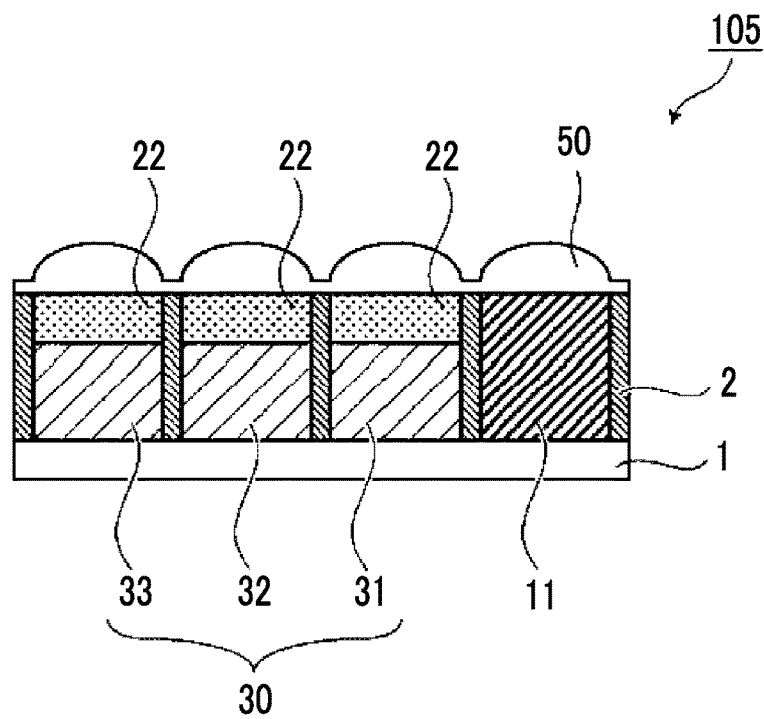
FIG. 5 is a schematic view showing an embodiment of the structure of the present invention.

In the structure shown in FIG. 5, the partition wall 2 had a width of 50 nm and a height of 1 µm. The near-infrared transmitting filter layer 11 had a thickness of 1 µm. The colored layers 31 to 33 each had a thickness of 0.5 µm. The near-infrared shielding layer 22 had a thickness of 0.5 µm.

Figure 6:
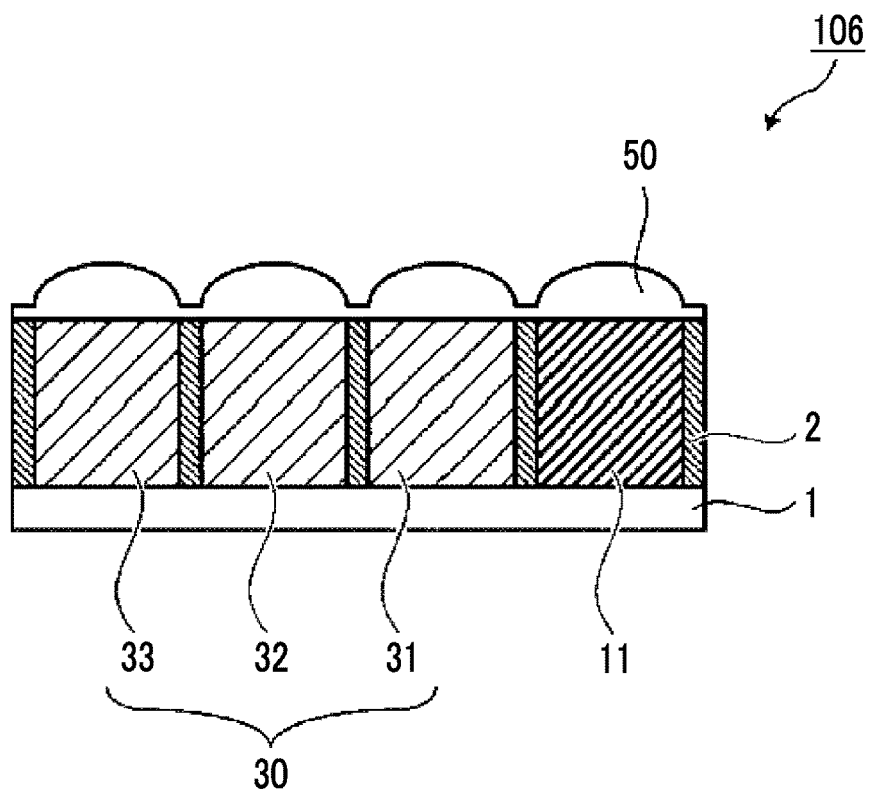
FIG. 6 is a schematic view showing an embodiment of the structure of the present invention.
Figure 7:
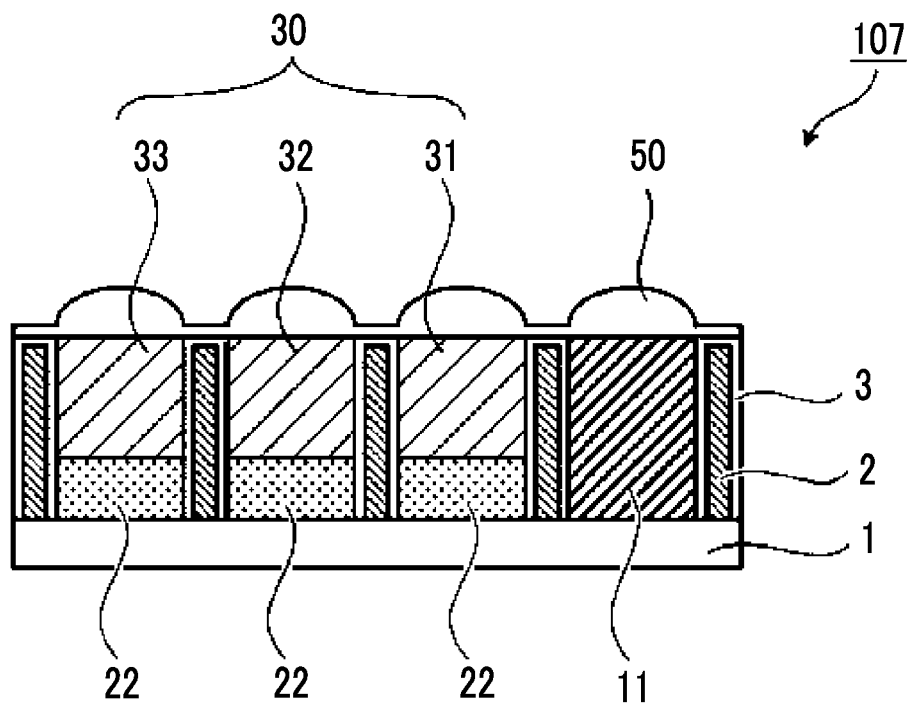
FIG. 7 is a schematic view showing an embodiment of the structure of the present invention.

In the structure shown in FIG. 6, the partition wall 2 had a width of 50 nm and a height of 1 µm. The near-infrared transmitting filter layer 11 had a thickness of 1 µm. The colored layers 31 to 33 each had a thickness of 1 µm.

Figure 8:
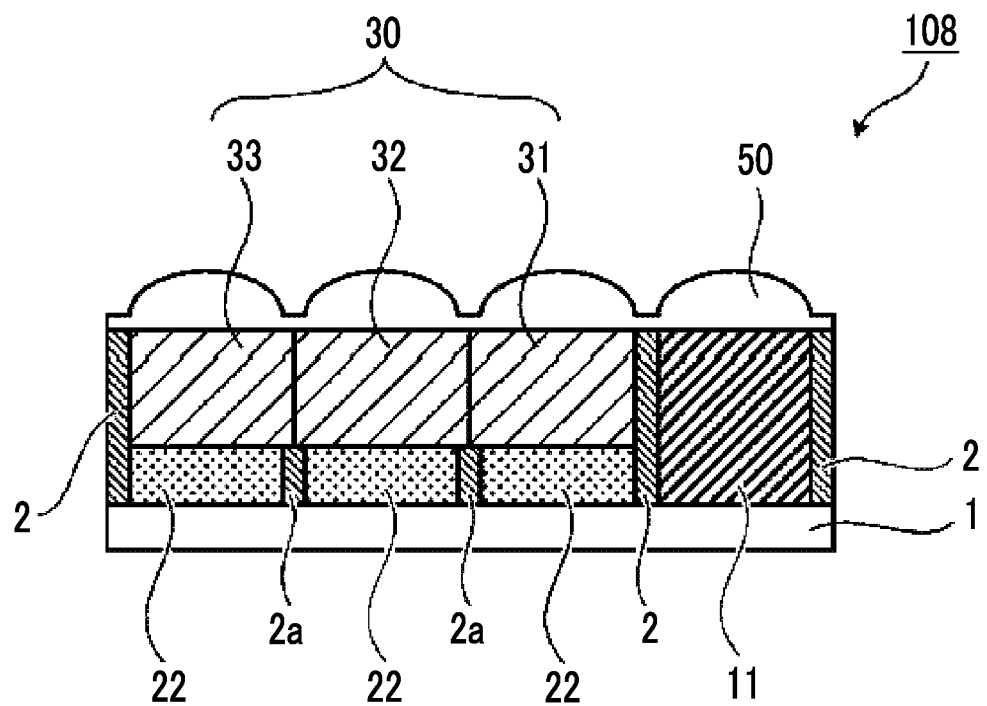
FIG. 8 is a schematic view showing an embodiment of the structure of the present invention.

In the structure shown in FIG. 8, the partition wall 2 had a width of 50 nm and a height of 1 µm, and the partition wall 2a had a width of 50 nm and a height of 0.5 µm. The near-infrared transmitting filter layer 11 had a thickness of 1 µm. The colored layers 31 to 33 each had a thickness of 0.5 µm. The near-infrared shielding layer 22 had a thickness of 0.5 µm.

Figure 9:
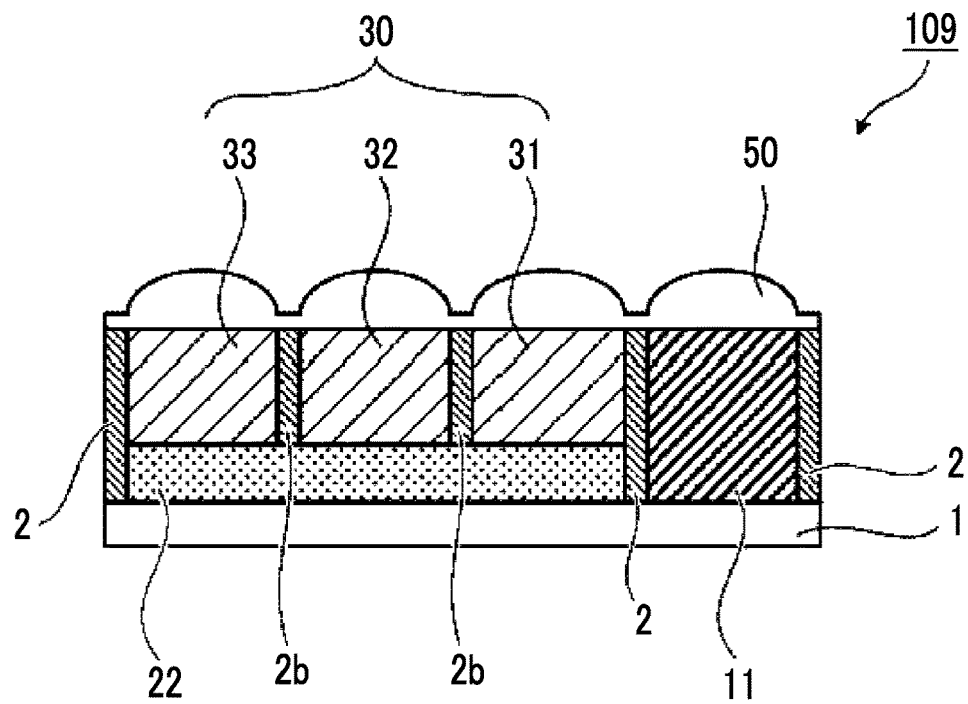
FIG. 9 is a schematic view showing an embodiment of the structure of the present invention.

In the structure shown in FIG. 9, the partition wall 2 had a width of 50 nm and a height of 1 µm, and the partition wall 2b had a width of 50 nm and a height of 0.5 µm. The near-infrared transmitting filter layer 11 had a thickness of 1 µm. The colored layers 31 to 33 each had a thickness of 0.5 µm. The near-infrared shielding layer 22 had a thickness of 0.5 µm.

Figure 10:
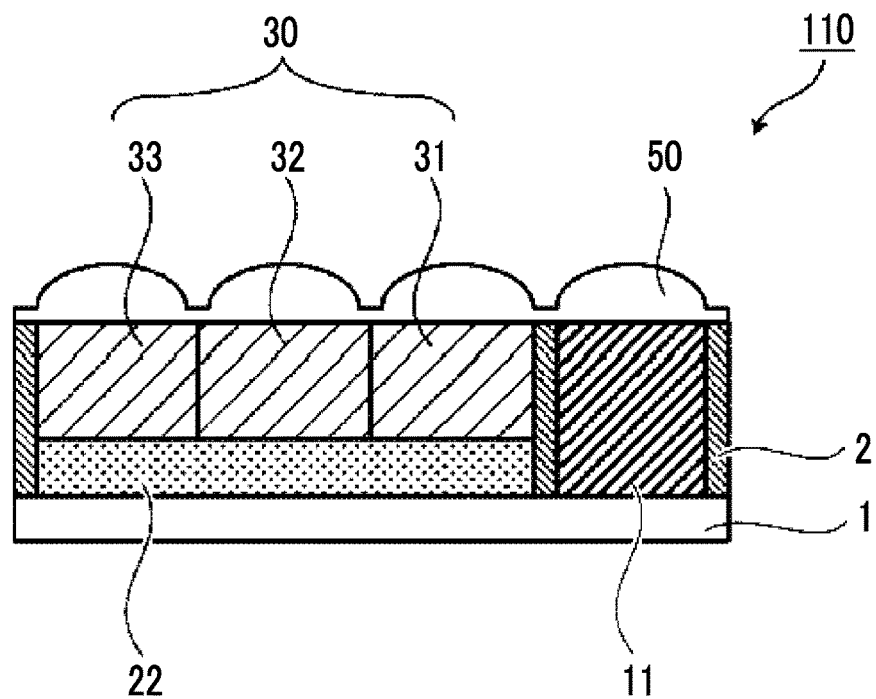
FIG. 10 is a schematic view showing an embodiment of the structure of the present invention.

In the structure shown in FIG. 10, the partition wall 2 had a width of 50 nm and a height of 1 µm. The near-infrared transmitting filter layer 11 had a thickness of 1 µm. The colored layers 31 to 33 each had a thickness of 0.5 µm. The near-infrared shielding layer 22 had a thickness of 0.5 µm.

Figure 11:
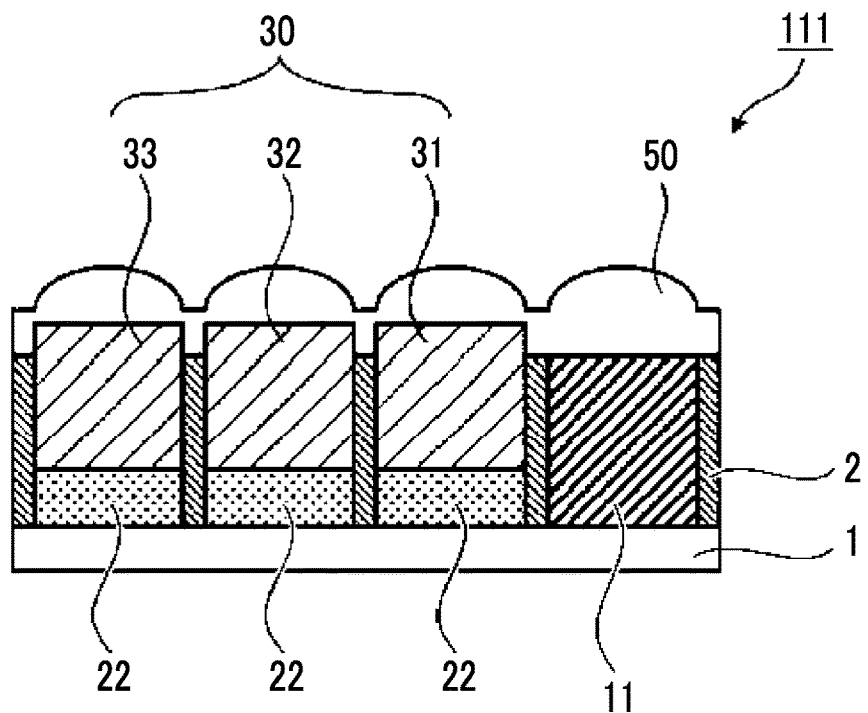
FIG. 11 is a schematic view showing an embodiment of the structure of the present invention.

In the structure shown in FIG. 11, the partition wall 2 had a width of 50 nm and a height of 1 µm. The near-infrared transmitting filter layer 11 had a thickness of 1 µm. The colored layers 31 to 33 each had a thickness of 1 µm. The near-infrared shielding layer 22 had a thickness of 0.5 µm.

Figure 12:
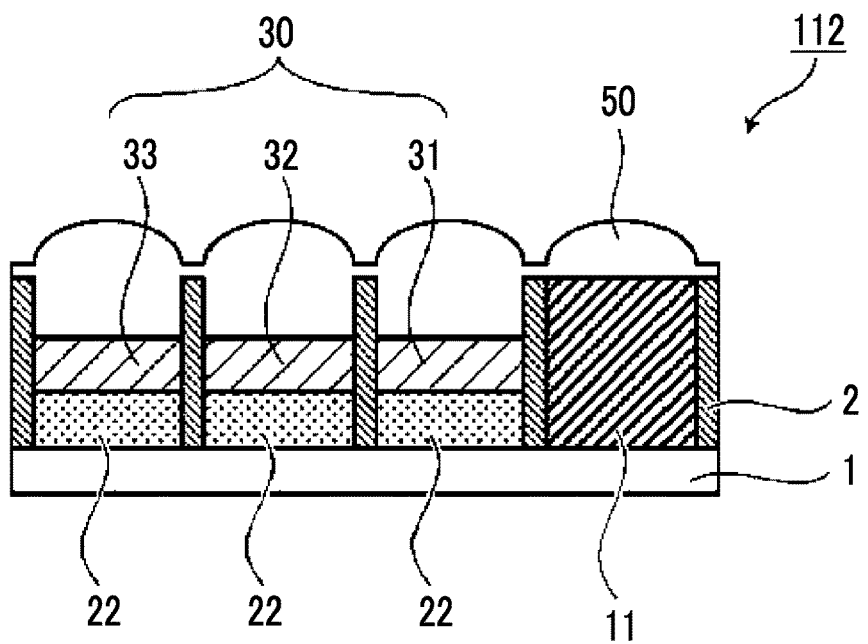
FIG. 12 is a schematic view showing an embodiment of the structure of the present invention.

In the structure shown in FIG. 12, the partition wall 2 had a width of 50 nm and a height of 1 µm. The near-infrared transmitting filter layer 11 had a thickness of 1 µm. The colored layers 31 to 33 each had a thickness of 0.5 µm. The near-infrared shielding layer 22 had a thickness of 0.2 µm.

Figure 13:
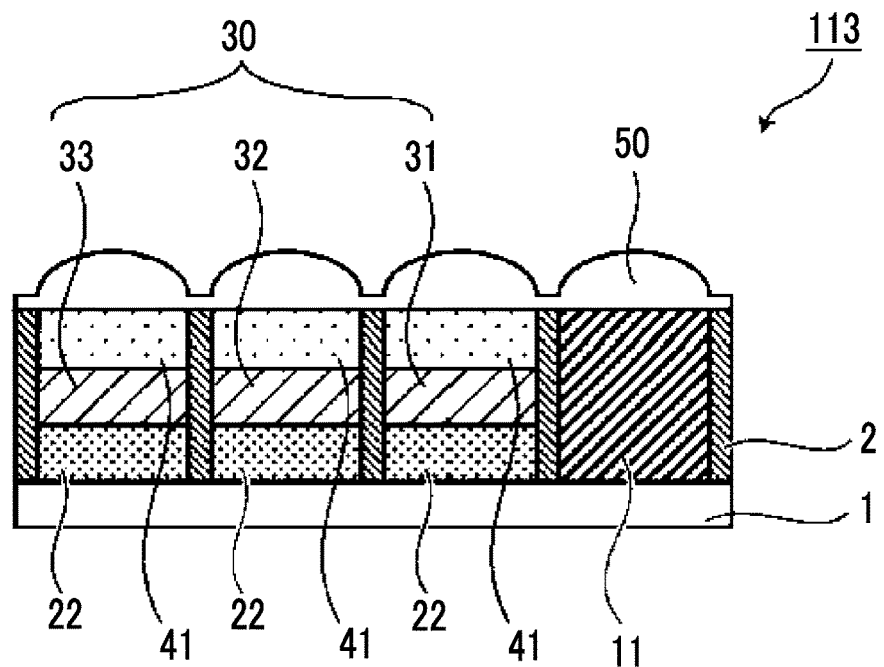
FIG. 13 is a schematic view showing an embodiment of the structure of the present invention.

In the structure shown in FIG. 13, the partition wall 2 had a width of 50 nm and a height of 1 µm. The near-infrared transmitting filter layer 11 had a thickness of 1 µm. The colored layers 31 to 33 each had a thickness of 0.5 µm. The near-infrared shielding layer 22 had a thickness of 0.2 µm. The transparent layer 41 had a thickness of 0.3 µm.

Figure 14:
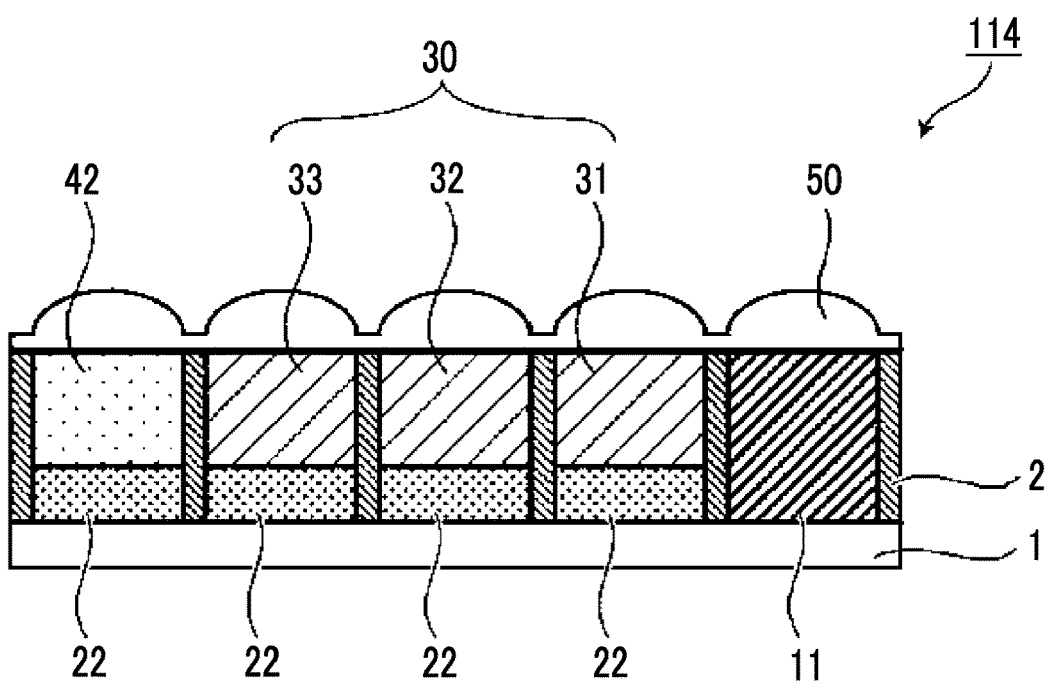
FIG. 14 is a schematic view showing an embodiment of the structure of the present invention.

In the structure shown in FIG. 14, the partition wall 2 had a width of 50 nm and a height of 1 µm. The near-infrared transmitting filter layer 11 had a thickness of 1 µm. The colored layers 31 to 33 each had a thickness of 0.5 µm. The near-infrared shielding layers 22 and 23 each had a thickness of 0.5 µm. The transparent layer 42 had a thickness of 0.5 µm.

Figure 15:
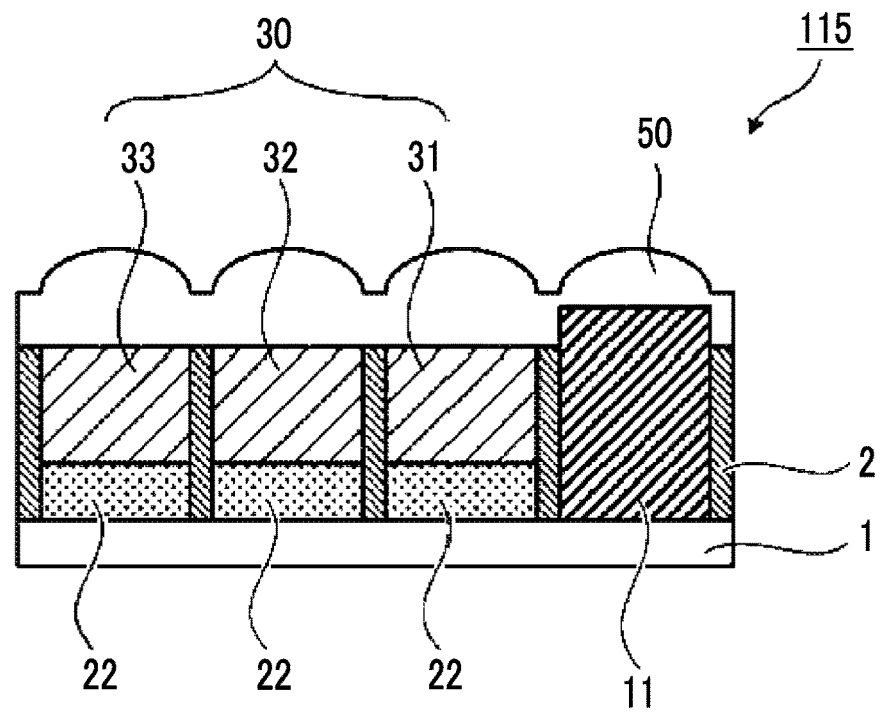
FIG. 15 is a schematic view showing an embodiment of the structure of the present invention.

In the structure shown in FIG. 15, the partition wall 2 had a width of 50 nm and a height of 1 µm. The near-infrared transmitting filter layer 11 had a thickness of 1.5 µm. The colored layers 31 to 33 each had a thickness of 0.5 µm. The near-infrared shielding layer 22 had a thickness of 0.5 µm.

Figure 16:
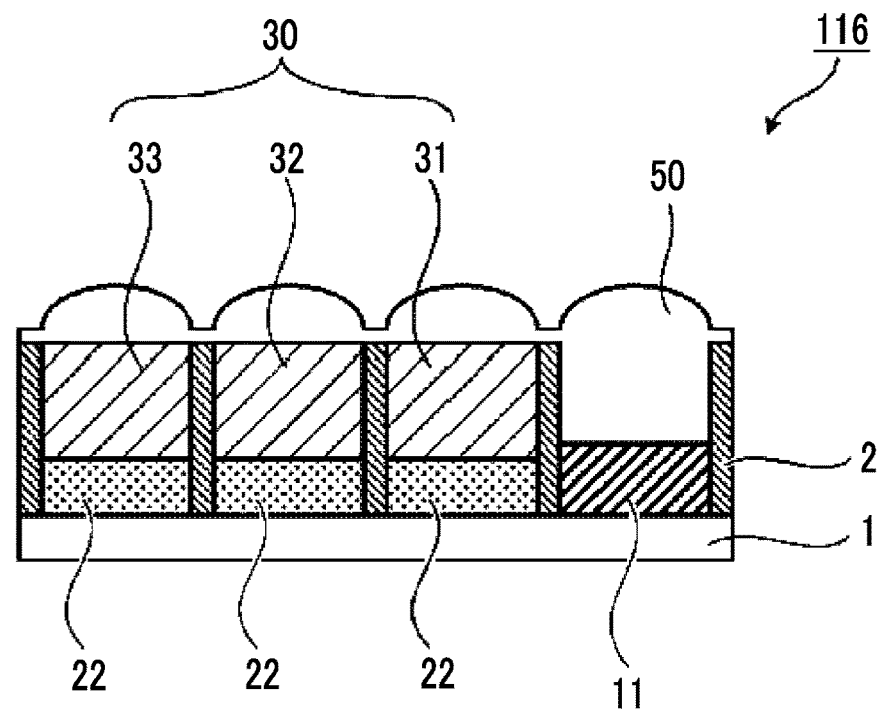
FIG. 16 is a schematic view showing an embodiment of the structure of the present invention.

In the structure shown in FIG. 16, the partition wall 2 had a width of 50 nm and a height of 1 µm. The near-infrared transmitting filter layer 11 had a thickness of 0.5 µm. The colored layers 31 to 33 each had a thickness of 0.5 µm. The near-infrared shielding layer 22 had a thickness of 0.5 µm.

Figure 17:
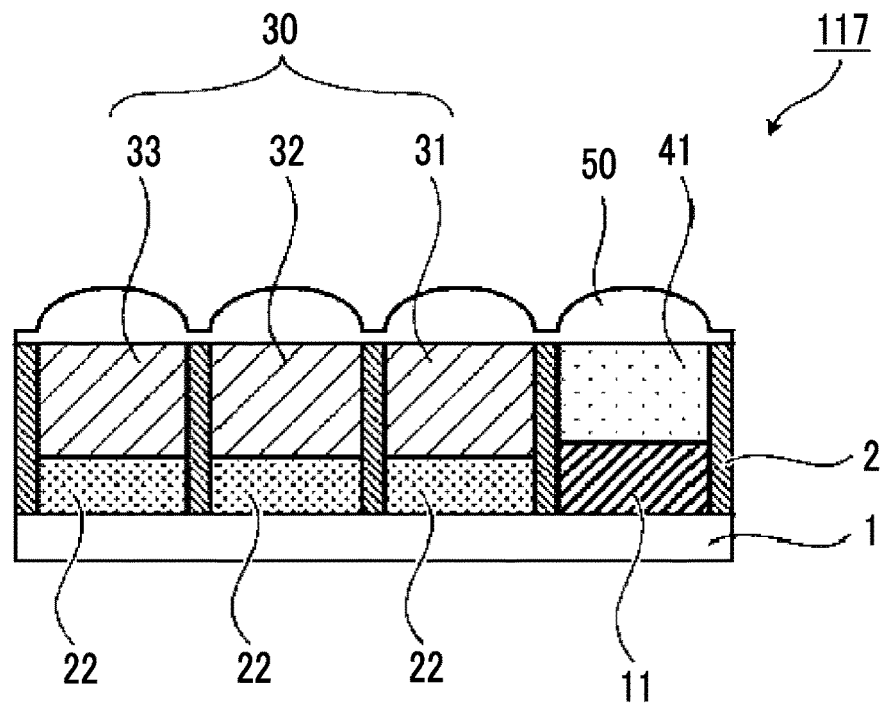
FIG. 17 is a schematic view showing an embodiment of the structure of the present invention.

In the structure shown in FIG. 17, the partition wall 2 had a width of 50 nm and a height of 1 µm. The near-infrared transmitting filter layer 11 had a thickness of 0.5 µm. The colored layers 31 to 33 each had a thickness of 0.5 µm. The near-infrared shielding layer 22 had a thickness of 0.5 µm. The transparent layer 41 had a thickness of 0.5 µm.

Figure 18:
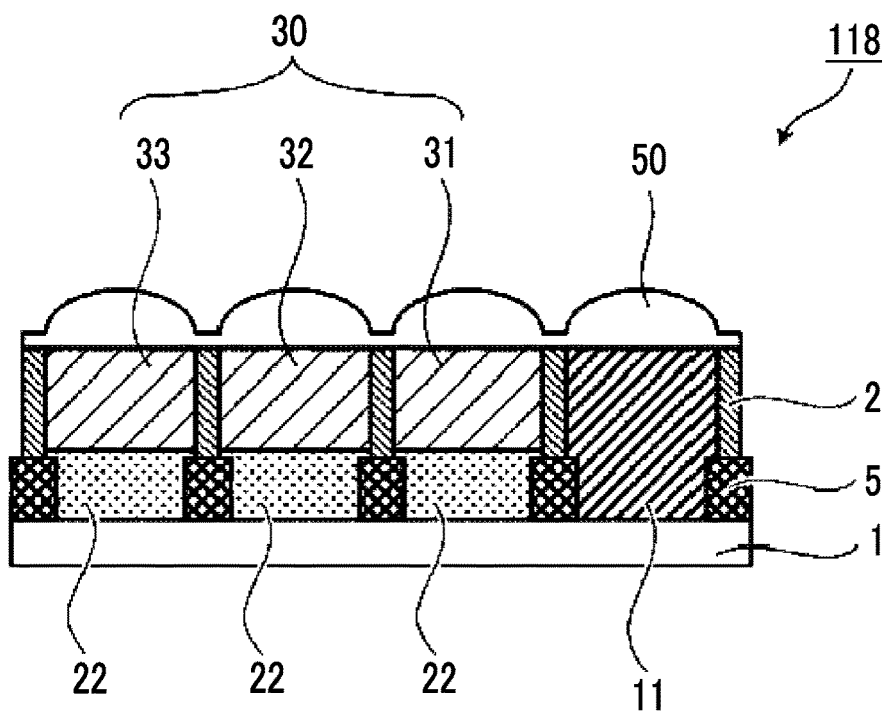
FIG. 18 is a schematic view showing an embodiment of the structure of the present invention.

In the structure shown in FIG. 18, the partition wall 2 had a width of 50 nm and a height of 1 µm. The near-infrared transmitting filter layer 11 had a thickness of 1 µm. The colored layers 31 to 33 each had a thickness of 0.5 µm. The near-infrared shielding layer 22 had a thickness of 0.5 µm.

EXPLANATION OF REFERENCES

1: support
2, 2a, 2b: partition walls
4: underlayer
3: protective layer
5: black matrix
11: near-infrared transmitting filter layer
21, 22, 23: near-infrared shielding filter layers
30: color filter layer
31, 32, 33: colored layers
41, 42: transparent layers
50: lens
101 to 118: structures

What is claimed is:

1. A structure comprising:
   a support;
   a partition wall provided on the support; and
   a near-infrared transmitting filter layer provided in a region partitioned by the partition wall, that shields visible light and transmits at least a portion of near-infrared light,
   wherein the refractive index of the partition wall is smaller than the refractive index of the near-infrared transmitting filter layer structure at at least a portion of the wavelengths of the near-infrared light transmitted by the near-infrared transmitting filter layer, and
   wherein the partition wall includes at least one selected from silica particles, a siloxane resin, a fluorine resin, or silicon dioxide.

2. The structure according to claim 1,
   wherein the refractive index of the partition wall is smaller than the refractive index of the near-infrared transmitting filter layer by 0.2 or more at at least a portion of the wavelengths of the near-infrared light transmitted by the near-infrared transmitting filter layer.

3. The structure according to claim 1,
   wherein the refractive index of the partition wall is smaller than the refractive index of the near-infrared transmitting filter layer at an entire wavelength in a wavelength range of 700 to 1,000 nm.

4. The structure according to claim 1,
   wherein a maximum value of the refractive index with respect to light in a wavelength range of 700 to 1,000 nm of the partition wall is 1.4 or less.

5. The structure according to claim 1,
   wherein a maximum value of the refractive index with respect to light in a wavelength range of 400 to 1,000 nm of the partition wall is 1.4 or less.

6. The structure according to claim 1, further comprising a protective layer on a surface of the partition wall.

7. The structure according to claim 1,
   wherein the structure has a plurality of regions partitioned by partition walls on the support, a near-infrared transmitting filter layer is provided in at least one region of the regions partitioned by the partition walls, and at least one layer selected from a color filter layer or a near-infrared shielding filter layer is provided in at least one region of the remaining regions partitioned by the partition walls.

8. The structure according to claim 1, wherein a content of the color material included in the near-infrared transmitting filter layer is 50% to 75% by mass.

9. A composition for forming a near-infrared transmitting filter layer, comprising:
a color material; and
a curable compound,
wherein the composition is used for the formation of the near-infrared transmitting filter layer in the structure according to claim 1.

10. An optical sensor comprising the structure according to claim 1.

11. A structure comprising:
a support;
a partition wall provided on the support;
a protective layer on a surface of the partition wall; and
a near-infrared transmitting filter layer provided in a region partitioned by the partition wall, that shields visible light and transmits at least a portion of near-infrared light,
wherein the refractive index of the partition wall is smaller than the refractive index of the near-infrared transmitting filter layer structure at at least a portion of the wavelengths of the near-infrared light transmitted by the near-infrared transmitting filter layer.

12. The structure according to claim 11, wherein the refractive index of the partition wall is smaller than the refractive index of the near-infrared transmitting filter layer by 0.2 or more at at least a portion of the wavelengths of the near-infrared light transmitted by the near-infrared transmitting filter layer.

13. The structure according to claim 11, wherein the refractive index of the partition wall is smaller than the refractive index of the near-infrared transmitting filter layer at an entire wavelength in a wavelength range of 700 to 1,000 nm.

14. The structure according to claim 11, wherein a maximum value of the refractive index with respect to light in a wavelength range of 700 to 1,000 nm of the partition wall is 1.4 or less.

15. The structure according to claim 11, wherein a maximum value of the refractive index with respect to light in a wavelength range of 400 to 1,000 nm of the partition wall is 1.4 or less.

16. The structure according to claim 11, wherein the structure has a plurality of regions partitioned by partition walls on the support, a near-infrared transmitting filter layer is provided in at least one region of the regions partitioned by the partition walls, and at least one layer selected from a color filter layer or a near-infrared shielding filter layer is provided in at least one region of the remaining regions partitioned by the partition walls.

17. The structure according to claim 11, wherein a content of the color material included in the near-infrared transmitting filter layer is 50% to 75% by mass.

18. A composition for forming a near-infrared transmitting filter layer, comprising:
a color material; and
a curable compound,
wherein the composition is used for the formation of the near-infrared transmitting filter layer in the structure according to claim 11.

19. An optical sensor comprising the structure according to claim 11.

20. The structure according to claim 11, wherein the protective layer is formed using a composition including a compound having a group having an ethylenically unsaturated bond or is constituted from inorganic materials.

21. The structure according to claim 11, wherein the protective layer is constituted from a silicon dioxide and the partition wall includes silica particles.

* * * * *